US011695407B2

(12) United States Patent
Dribinsky et al.

(10) Patent No.: US 11,695,407 B2
(45) Date of Patent: *Jul. 4, 2023

(54) CIRCUIT AND METHOD FOR CONTROLLING CHARGE INJECTION IN RADIO FREQUENCY SWITCHES

(71) Applicant: pSemi Corporation, San Diego, CA (US)

(72) Inventors: Alexander Dribinsky, Naperville, IL (US); Tae Youn Kim, Irvine, CA (US); Dylan J. Kelly, San Diego, CA (US); Christopher N. Brindle, Poway, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/543,720

(22) Filed: Dec. 6, 2021

(65) Prior Publication Data

US 2022/0173731 A1 Jun. 2, 2022

Related U.S. Application Data

(63) Continuation of application No. 16/921,790, filed on Jul. 6, 2020, now Pat. No. 11,196,414, which is a (Continued)

(51) Int. Cl.
*H03K 17/16* (2006.01)
*H03K 17/10* (2006.01)
(Continued)

(52) U.S. Cl.
CPC ......... *H03K 17/161* (2013.01); *H03K 17/102* (2013.01); *H03K 17/284* (2013.01);
(Continued)

(58) Field of Classification Search
CPC ............. H01L 27/0288; H01L 27/0285; H01L 29/41725; H03K 17/102; H03K 17/284;
(Continued)

(56) References Cited

U.S. PATENT DOCUMENTS 4,317,055 A * 2/1982 Yoshida ............... H03K 17/567
327/566
5,095,348 A 3/1992 Houston
(Continued)

FOREIGN PATENT DOCUMENTS

JP 2003347553 12/2003

OTHER PUBLICATIONS

US 10,700,199 B2, 06/2020, Brindle (withdrawn)
(Continued)

*Primary Examiner* — Ryan Jager
(74) *Attorney, Agent, or Firm* — Haynes and Boone, LLP

(57) ABSTRACT

A circuit and method for controlling charge injection in a circuit are disclosed. In one embodiment, the circuit and method are employed in a semiconductor-on-insulator (SOI) Radio Frequency (RF) switch. In one embodiment, an SOI RF switch comprises a plurality of switching transistors coupled in series, referred to as "stacked" transistors, and implemented as a monolithic integrated circuit on an SOI substrate. Charge injection control elements are coupled to receive injected charge from resistively-isolated nodes located between the switching transistors, and to convey the injected charge to at least one node that is not resistively-isolated. In one embodiment, the charge injection control elements comprise resistors. In another embodiment, the charge injection control elements comprise transistors. A method for controlling charge injection in a switch circuit is disclosed whereby injected charge is generated at resistively-isolated nodes between series coupled switching tran-
(Continued)

sistors, and the injected charge is conveyed to at least one node of the switch circuit that is not resistively-isolated.

20 Claims, 8 Drawing Sheets

Related U.S. Application Data continuation of application No. 15/826,453, filed on Nov. 29, 2017, now Pat. No. 10,804,892, which is a continuation of application No. 14/987,360, filed on Jan. 4, 2016, now Pat. No. 9,887,695, which is a continuation of application No. 14/257,808, filed on Apr. 21, 2014, now Pat. No. 9,397,656, which is a continuation of application No. 11/881,816, filed on Jul. 26, 2007, now abandoned, which is a continuation-in-part of application No. 11/520,912, filed on Sep. 14, 2006, now Pat. No. 7,890,891, which is a continuation-in-part of application No. 11/484,370, filed on Jul. 10, 2006, now Pat. No. 7,910,993, said application No. 11/881,816 is a continuation-in-part of application No. 11/484,370, filed on Jul. 10, 2006, now Pat. No. 7,910,993.

(60) Provisional application No. 60/833,562, filed on Jul. 26, 2006, provisional application No. 60/718,260, filed on Sep. 15, 2005, provisional application No. 60/698,523, filed on Jul. 11, 2005.

(51) Int. Cl.
| | |
|---|---|
| H03K 17/284 | (2006.01) |
| H03K 17/687 | (2006.01) |
| H03K 17/689 | (2006.01) |
| H03K 17/04 | (2006.01) |
| H03K 17/06 | (2006.01) |
| H03K 17/08 | (2006.01) |

(52) U.S. Cl.
CPC ........ *H03K 17/689* (2013.01); *H03K 17/6874* (2013.01); *H03K 17/04* (2013.01); *H03K 17/06* (2013.01); *H03K 17/08* (2013.01); *H03K 2217/0009* (2013.01)

(58) Field of Classification Search
CPC ........... H03K 17/04106; H03K 17/164; H03K 17/6874
USPC ........................................................ 327/281
See application file for complete search history.

(56) References Cited

U.S. PATENT DOCUMENTS

| | | | |
|---|---|---|---|
| 5,587,604 A | 12/1996 | Machesney et al. | |
| 5,784,311 A | 7/1998 | Assaderaghi | |
| 5,818,099 A | 10/1998 | Burghartz | |
| 5,821,769 A | 10/1998 | Douseki | |
| 5,878,331 A | 3/1999 | Yamamoto | |
| 5,892,400 A | 4/1999 | Van Saders | |
| 5,930,638 A * | 7/1999 | Reedy ............... | H01L 21/02694 |
| | | | 257/E27.101 |
| 6,081,443 A | 6/2000 | Morishita | |
| 6,084,255 A | 7/2000 | Ueda | |
| 6,094,088 A | 7/2000 | Yano | |
| 6,100,564 A | 8/2000 | Bryant | |
| 6,111,778 A | 8/2000 | Macdonald | |
| 6,201,761 B1 | 3/2001 | Wollesen | |
| 6,218,890 B1 * | 4/2001 | Yamaguchi ......... | H01L 27/0605 |
| | | | 327/431 |
| 6,281,737 B1 | 8/2001 | Kuang | |
| 6,341,087 B1 | 1/2002 | Kunikiyo | |
| 6,356,536 B1 | 3/2002 | Repke | |
| 6,486,511 B1 | 11/2002 | Nathanson | |
| 6,498,370 B1 | 12/2002 | Kim | |
| 6,519,191 B1 | 2/2003 | Morishita | |
| 6,521,959 B2 | 2/2003 | Kim | |
| 6,563,366 B1 | 5/2003 | Kohama | |
| 6,646,305 B2 | 11/2003 | Assaderaghi | |
| 6,730,953 B2 * | 5/2004 | Brindle ............... | H01L 27/0629 |
| | | | 257/296 |
| 6,803,680 B2 * | 10/2004 | Brindle ............... | H01L 27/0629 |
| | | | 307/115 |
| 6,804,502 B2 | 10/2004 | Burgener | |
| 6,836,172 B2 | 12/2004 | Okashita | |
| 6,987,414 B2 * | 1/2006 | Numata ................... | H01P 1/15 |
| | | | 327/365 |
| 6,992,543 B2 * | 1/2006 | Luetzelschwab ........ | H03H 7/38 |
| | | | 330/195 |
| 7,106,121 B2 * | 9/2006 | Hidaka ................. | H03K 17/687 |
| | | | 333/81 R |
| 7,345,521 B2 * | 3/2008 | Takahashi ................ | H04B 1/48 |
| | | | 333/81 R |
| 7,405,982 B1 | 7/2008 | Flaker | |
| 7,459,988 B1 * | 12/2008 | Iversen ..................... | H01P 1/15 |
| | | | 333/262 |
| 7,692,514 B2 * | 4/2010 | LeToux .............. | H03K 17/6871 |
| | | | 333/101 |
| 7,890,891 B2 * | 2/2011 | Stuber ............... | H01L 29/78657 |
| | | | 716/115 |
| 7,910,993 B2 * | 3/2011 | Brindle ................ | H03K 17/687 |
| | | | 257/347 |
| 8,008,988 B1 * | 8/2011 | Yang .................... | H03K 17/693 |
| | | | 333/101 |
| 8,129,787 B2 * | 3/2012 | Brindle ............. | H01L 29/78615 |
| | | | 257/347 |
| 8,159,282 B2 * | 4/2012 | Katoh .................. | H03K 17/693 |
| | | | 327/434 |
| 8,330,519 B2 * | 12/2012 | Lam ...................... | H03K 5/003 |
| | | | 327/365 |
| 8,405,147 B2 * | 3/2013 | Brindle .............. | H01L 29/0649 |
| | | | 257/341 |
| 8,461,903 B1 * | 6/2013 | Granger-Jones ........................... | |
| | | | H03K 17/04123 |
| | | | 327/427 |
| 8,742,502 B2 * | 6/2014 | Brindle ............. | H01L 29/78609 |
| | | | 257/347 |
| 8,824,974 B2 * | 9/2014 | Nakajima ............ | H03K 17/005 |
| | | | 455/127.1 |
| 9,087,899 B2 * | 7/2015 | Brindle ............. | H01L 29/78609 |
| 9,130,564 B2 * | 9/2015 | Brindle ................ | H03K 17/687 |
| 9,397,656 B2 * | 7/2016 | Dribinsky ............ | H03K 17/161 |
| 9,438,196 B2 * | 9/2016 | Smith ...................... | H03H 7/06 |
| 9,438,223 B2 * | 9/2016 | de Jongh ............. | H03K 17/162 |
| 9,467,124 B2 * | 10/2016 | Crandall ................ | H03K 3/353 |
| 9,608,619 B2 * | 3/2017 | Stuber .............. | H01L 29/78657 |
| 9,653,601 B2 * | 5/2017 | Brindle ............... | H01L 29/1095 |
| 9,780,775 B2 * | 10/2017 | Brindle ............. | H01L 29/78615 |
| 9,887,695 B2 * | 2/2018 | Dribinsky ............ | H03K 17/284 |
| 9,948,281 B2 * | 4/2018 | Ranta ...................... | H03J 3/16 |
| 10,074,746 B2 * | 9/2018 | Brindle ............. | H01L 29/4908 |
| 10,122,356 B2 * | 11/2018 | Kunishi ................ | H03K 17/693 |
| 10,320,379 B2 * | 6/2019 | Kerr ...................... | H04B 1/44 |
| 10,447,344 B2 * | 10/2019 | Scott .................... | H03K 17/693 |
| 10,608,623 B2 * | 3/2020 | Kerr ........................ | H04B 1/44 |
| 10,622,990 B2 | 4/2020 | Brindle | |
| 10,622,993 B2 | 4/2020 | Burgener | |
| 10,680,600 B2 * | 6/2020 | Brindle ................ | H01L 29/1095 |
| 10,784,855 B2 | 9/2020 | Brindle | |
| 10,790,390 B2 | 9/2020 | Brindle | |
| 10,790,814 B2 | 9/2020 | Brindle | |
| 10,790,815 B2 | 9/2020 | Brindle | |
| 10,790,820 B2 | 9/2020 | Brindle | |
| 10,797,172 B2 | 10/2020 | Brindle | |
| 10,797,690 B2 | 10/2020 | Brindle | |
| 10,797,691 B1 | 10/2020 | Brindle | |
| 10,797,694 B2 | 10/2020 | Brindle | |
| 10,804,892 B2 * | 10/2020 | Dribinsky .......... | H03K 17/6874 |
| 10,812,068 B2 | 10/2020 | Brindle | |

(56) References Cited

U.S. PATENT DOCUMENTS

| | | | |
|---|---|---|---|
| 10,818,796 B2 | 10/2020 | Stuber | |
| 11,011,633 B2 | 5/2021 | Brindle | |
| 11,196,414 B2* | 12/2021 | Dribinsky | H03K 17/284 |
| 2001/0015461 A1* | 8/2001 | Ebina | H01L 29/4908 |
| | | | 257/E29.151 |
| 2001/0045602 A1 | 11/2001 | Maeda | |
| 2002/0043691 A1 | 4/2002 | Higoshi | |
| 2002/0079971 A1 | 6/2002 | Vathulya | |
| 2003/0090313 A1* | 5/2003 | Burgener | H03K 17/6871 |
| | | | 327/408 |
| 2004/0004247 A1 | 1/2004 | Forbes | |
| 2004/0183588 A1* | 9/2004 | Chandrakasan | G05F 3/205 |
| | | | 327/545 |
| 2004/0207454 A1* | 10/2004 | Hidaka | H03K 17/687 |
| | | | 327/427 |
| 2004/0227565 A1 | 11/2004 | Chen | |
| 2005/0072988 A1 | 4/2005 | Augusto | |
| 2005/0179093 A1 | 8/2005 | Morris | |
| 2006/0022526 A1 | 2/2006 | Cartalade | |
| 2006/0194567 A1* | 8/2006 | Kelly | H03K 17/6871 |
| | | | 455/408 |
| 2007/0018247 A1* | 1/2007 | Brindle | H01L 29/1095 |
| | | | 257/E29.28 |
| 2007/0069291 A1* | 3/2007 | Stuber | H01L 29/78615 |
| | | | 257/E29.151 |
| 2007/0290744 A1* | 12/2007 | Adachi | H03K 17/102 |
| | | | 330/51 |
| 2008/0076371 A1* | 3/2008 | Dribinsky | H03K 17/284 |
| | | | 455/208 |
| 2008/0265997 A1* | 10/2008 | Berroth | H03F 3/211 |
| | | | 330/310 |
| 2011/0002080 A1* | 1/2011 | Ranta | H03H 11/28 |
| | | | 361/277 |
| 2011/0260780 A1* | 10/2011 | Granger-Jones | H03K 17/102 |
| | | | 327/537 |
| 2012/0267719 A1* | 10/2012 | Brindle | H01L 29/0688 |
| | | | 257/348 |
| 2013/0009725 A1* | 1/2013 | Heaney | H03K 17/687 |
| | | | 257/E21.317 |
| 2013/0278317 A1* | 10/2013 | Iversen | H03K 17/102 |
| | | | 327/308 |
| 2013/0288617 A1* | 10/2013 | Kim | H04B 1/44 |
| | | | 455/78 |
| 2013/0293283 A1* | 11/2013 | Jeon | H03K 17/68 |
| | | | 327/478 |
| 2014/0009248 A1* | 1/2014 | Granger-Jones | H01G 4/38 |
| | | | 361/328 |
| 2014/0118053 A1* | 5/2014 | Matsuno | H03K 17/693 |
| | | | 327/427 |
| 2014/0266415 A1* | 9/2014 | Kerr | H03K 17/693 |
| | | | 327/552 |
| 2015/0236691 A1* | 8/2015 | Cam | H03K 17/6874 |
| | | | 343/876 |
| 2015/0381171 A1* | 12/2015 | Cebi | H01L 27/1203 |
| | | | 327/427 |
| 2016/0020815 A1* | 1/2016 | Lee | H03K 17/693 |
| | | | 455/78 |
| 2016/0056774 A1* | 2/2016 | Ilkov | H03F 3/19 |
| | | | 330/251 |
| 2016/0322385 A1* | 11/2016 | Fuh | H01L 25/0655 |
| 2016/0329891 A1* | 11/2016 | Bakalski | H03K 17/693 |
| 2017/0012763 A1* | 1/2017 | Wu | H04B 1/0067 |
| 2017/0110451 A1* | 4/2017 | Fraser | H01L 21/82 |
| 2017/0162692 A1* | 6/2017 | Brindle | H01L 28/00 |
| 2017/0272066 A1* | 9/2017 | Scott | H03K 17/161 |
| 2018/0091136 A1* | 3/2018 | Wang | H03K 17/161 |
| 2018/0145678 A1 | 5/2018 | Maxim | |
| 2019/0237579 A1 | 8/2019 | Brindle | |
| 2019/0238126 A1 | 8/2019 | Brindle et al. | |
| 2020/0067504 A1 | 2/2020 | Brindle | |
| 2020/0076427 A1 | 3/2020 | Burgener | |
| 2020/0076428 A1 | 3/2020 | Burgener | |
| 2020/0112305 A1 | 4/2020 | Brindle | |
| 2020/0153430 A1 | 5/2020 | Burgener | |
| 2020/0295751 A1 | 9/2020 | Brindle | |
| 2020/0321467 A1 | 10/2020 | Brindle | |
| 2020/0335633 A1 | 10/2020 | Stuber | |
| 2021/0152170 A1* | 5/2021 | Dribinsky | H03K 17/102 |
| 2021/0167773 A1 | 6/2021 | Burgener | |

OTHER PUBLICATIONS

US 10,700,200 B2, 06/2020, Brindle (withdrawn)
Burgener—Response to Missing Parts and Preliminary Amendment filed Feb. 23, 2021 for U.S. Appl. No. 16/930,215, 15 pages, (PER-001-CON-12), Doc 9297.
USPTO—Notice of Allowance/Allowability dated May 11, 2021 for U.S. Appl. No. 16/930,215, 9 pages, (PER-001-CON-12), Doc 9303.
Stuber—Response to Office Action filed Feb. 3, 2021 for U.S. Appl. No. 16/739,081, 15 pages, (PER-015-CIP-DIV-CON-3), Doc 9298.
USPTO—Final Office Action dated Apr. 27, 2021 for U.S. Appl. No. 16/739,081, 108 pages, (PER-015-CIP-DIV-CON-3), Doc 9304.
Brindle—Response to Missing Parts and Preliminary Amendment filed Mar. 15, 2021 for U.S. Appl. No. 16/987,265, 19 pages (PER-016-DIV-CON-12), Doc 9299.
USPTO—Corrected Notice of Allowability dated Jan. 26, 2021 for U.S. Appl. No. 16/739,093, 129 pages (PER-016-CIP-CON-7), Doc 9305.
USPTO—Notice to File Corrected Application Papers dated Feb. 19, 2021 for U.S. Appl. No. 16/739,093, 3 pages (PER-016-CIP-CON-7), Doc 9306.
Brindle—Response to Notice to File Corrected Application Papers filed Mar. 15, 2021 for U.S. Appl. No. 16/739,093, 8 pages (PER-016-CIP-CON-7), Doc 9307.
Brindle—Issue Fee Payment and 312 Response filed Mar. 16, 2021 for U.S. Appl. No. 16/739,093, 6 pages (PER-016-CIP-CON-7), Doc 9308.
USPTO—Corrected Notice of Allowability dated Apr. 15, 2021 for U.S. Appl. No. 16/739,093, 4 pages (PER-016-CIP-CON-7), Doc 9309.
USPTO—Issue Notification dated Apr. 28, 2021 for U.S. Appl. No. 16/739,093, 1 page (PER-016-CIP-CON-7), Doc 9310.
Brindle—Patent Application filed Mar. 19, 2021 for U.S. Appl. No. 17/206,436, 125 paoes (PER-016-CIP-CON-8), Doc 9311.
USPTO—Filing Receipt and Notice of Improper Benefit Claim, and Notice to File Missing Parts dated Mar. 31, 2021 for U.S. Appl. No. 17/206,436, 9 pages (PER-016-CIP-CON-8), Doc 9312.
Brindle—Response to Notice of Improper Benefit Claim filed May 12, 2021 for U.S. Appl. No. 17/206,436, 17 pages (PER-016-CIP-CON-8), Doc 9313.
USPTO—Corrected Filing Receipt dated Jun. 3, 2021 for U.S. Appl. No. 17/206,436, 4 pages (PER-016-CIP-CON-8), Doc 9314.
Willert-Porada—"Advances in Microwave and Radio Frequency Processing", 8th International Conference on Microwave and High-Frequency Heating, Oct. 2009, 408 pages, Doc 0714 (A-F).
Brinkman—Respondents' Notice of Prior Art, Investigation No. 337-TA-848, dated Aug. 31, 2012, 59 pages, Doc 0825.
Burgener—U.S. Appl. No. 10/267,531, filed Oct. 8, 2002, 72 pages (PER-001-PAP), Doc 4339.
USPTO—Notice to File Corrected Application Papers dated Nov. 12, 2002 for U.S. Appl. No. 10/267,531, 1 page (PER-001-PAP), Doc 4340.
Burgener—Response to Notice to File Corrected Application Papers and Replacement Figures dated Jan. 13, 2003 for U.S. Appl. No. 10/267,531, 16 pages (PER-001-PAP), Doc 4341.
Burgener—Power of Attorney for Peregrine Semiconductor dated Feb. 4, 2003 for U.S. Appl. No. 10/267,531, 3 paQes (PER-001-PAP), Doc. 4342.
USPTO—Acceptance of Power of Attorney dated Jan. 2, 2004 for U.S. Appl. No. 10/267,531, 1 page (PER-001-PAP), Doc4343.
USPTO—Notice of Allowance dated May 12, 2004 for U.S. Appl. No. 10/267,531, 32 pages (PER-001-PAP), Doc 4344.
Burgener—Issue Fee Payment and Comments on Reasons for Allowance dated Aug. 12, 2004 for U.S. Appl. No. 10/267,531, pages (PER-001-PAP), Doc 4345.

(56) References Cited

OTHER PUBLICATIONS

Burgener—Request for Certificate of Correction dated Feb. 10, 2005 for U.S. Appl. No. 10/267,531, 2 pages (PER-001-PAP), Doc 4346.
USPTO—Certificate of Correction dated Apr. 26, 2005 for U.S. Appl. No. 10/267,531, 1 page (PER-001-PAP), Doc 4347.
Burgener—Request for Certificate of Correction dated Dec. 13, 2006 for U.S. Appl. No. 10/267,531, 1 page (PER-001-PAP), Doc 4348.
USPTO—Certificate of Correction dated May 1, 2007 for U.S. Appl. No. 10/267,531, pages (PER-001-PAP), Doc 4349.
Burgener—U.S. Appl. No. 10/922,135, filed Aug. 18, 2004, 63 pages (PER-001-CON), Doc 4350.
USPTO—Office Action dated Jun. 3, 2005 for U.S. Appl. No. 10/922,135, 11 pages (PER-001-CON), Doc 4351.
Burgener—Amendment dated Dec. 7, 2005 for U.S. Appl. No. 10/922,135, 10 pages (PER-001-CON), Doc 4352.
USPTO—Final Office Action dated Jan. 17, 2006 for U.S. Appl. No. 10/922,135, 9 pages (PER-001-CON), Doc 4353.
Burgener—Amendment dated May 19, 2006 for U.S. Appl. No. 10/922,135, 6 pages (PER-001-CON), Doc 4354.
USPTO—Notice of Allowance dated Jun. 2, 2006 for U.S. Appl. No. 10/922,135, 11 pages (PER-001-CON), Doc 4355.
Burgener—Issue Fee Payment dated Sep. 8, 2006 for U.S. Appl. No. 10/922,135, 1 page (PER-001-CON), Doc 4356.
Burgener—Request for Certificate of Correction dated Jul. 1, 2008 for U.S. Appl. No. 10/922,135, 3 pages (PER-001-CON), Doc4358.
USPTO—Certificate of Correction dated Aug. 12, 2008 for U.S. Appl. No. 10/922,135, 1 page (PER-001-CON), Doc 4359.
Burgener—Amendment after final dated Apr. 25, 2009 for U.S. Appl. No. 10/922,135, 7 pages (PER-001-CON), Doc 4357.
USPTO—Report on the Determination of an Action Regarding a Patent or Trademark 3:12-cv-1160-CAB-BGS dated Jun. 11, 2012 for U.S. Appl. No. 10/922,135, 1 page (PER-001-CON), Doc 4360.
USPTO—Report on the Determination of an Action Regarding a Patent or Trademark 1:12CV377 dated Jul. 11, 2012 for U.S. Appl. No. 10/922,135, 13 pages (PER-001-CON), Doc 4361.
USPTO—Report on the Determination of an Action Regarding a Patent or Trademark 3:12-CV-1160-CAB-BGS) dated Apr. 15, 2013 for U.S. Appl. No. 10/922,135, 1 page (PER-001-CON), Doc 4363.
USPTO—Report on the Determination of an Action Regarding a Patent or Trademark SACV12-248 JST(RNBx) dated Dec. 21, 2013 for U.S. Appl. No. 10/922,135, 1 page (PER-001-CON), Doc 4362.
Burgener—Change of Address and Notification of Loss of Small Entity Status dated Mar. 5, 2014 for U.S. Appl. No. 10/922,135, 5 pages (PER-001-CON), Doc 4364.
USPTO—Report on the Determination of an Action Regarding a Patent or Trademark 3:12-CV-0911-AJB-WMC) dated Oct. 14, 2014 for U.S. Appl. No. 10/922,135, 1 page (PER-001-CON), Doc 4365.
Burgener—Notification of Loss of Small Entity Status dated Jun. 5, 2017 for U.S. Appl. No. 10/922,135, 1 page (PER-001-CON), Doc4366.
Burgener—U.S. Appl. No. 11/582,206, filed Oct. 16, 2006, 65 pages (PER-001-CON-2), Doc 4385.
USPTO—Filing Receipt dated Nov. 3, 2006 for U.S. Appl. No. 11/582,206, 3 pages (PER-001-CON-2), Doc 4386.
USPTO—Notice of Publication dated May 31, 2007 for U.S. Appl. No. 11/582,206, 1 page (PER-001-CON-2), Doc 4387.
USPTO—Office Action dated Nov. 15, 2007 for U.S. Appl. No. 11/582,206, 12 pages (PER-001-CON-2), Doc 4388.
Burgener—Amendment and Terminal Disclaimers dated May 19, 2008 for U.S. Appl. No. 11/582,206, 15 paQes (PER-001-CON-2), Doc 4389.
Tieu—Notice of Allowance dated Jul. 15, 2008 for U.S. Appl. No. 11/582,206, 12 pages (PER-001-CON-2), Doc 0668.
USPTO—Notice of Allowance dated Jul. 15, 2008 for U.S. Appl. No. 11/582,206, 12 pages (PER-001-CON-2), Doc 4390.
Burgener—Issue Fee Payment dated Oct. 20, 2008 for U.S. Appl. No. 11/582,206, 2 pages (PER-001-CON-22, Doc 4391.

USPTO—Supplemental Non-Final Rejection dated Oct. 30, 2008 for U.S. Appl. No. 11/582,206, 4 pages (PER-001-CON-2), Doc 4392.
USPTO—Issue Notification dated Nov. 12, 2008 for U.S. Appl. No. 11/582,206, 1 page (PER-001-CON-2), Doc 4393.
USPTO—Report on the Filing or Determination of an Action Regarding a Patent 3:12-cv-001160-CAB-BGS dated Jun. 11, 2012 for U.S. Appl. No. 11/582,206, 1 page (PER-001-CON-2), Doc 4394.
USPTO—Report on the Filing or Determination of an Action Regarding a Patent 8:12-cv-00248-JST-RNB dated Feb. 21, 2013 for U.S. Appl. No. 11/582,206, 1 page (PER-001-CON-2), Doc 4396.
USPTO—Report on the Filing or Determination of an Action Regarding a Patent 8:12-cv-1160-CAB-BGS dated Apr. 15, 2013 for U.S. Appl. No. 11/582,206, 1 page (PER-001-CON-2), Doc 4397.
USPTO—Report on the Filing or Determination of an Action Regarding a Patent 8:12-cv-00911-AJB-WMC dated Oct. 14, 2014 for U.S. Appl. No. 11/582,206, 1 page (PER-001-CON-2), Doc 4398.
Burgener—Notification of Loss of Small Entity Status dated Sep. 9, 2015 for U.S. Appl. No. 11/582,206, 1 page (PER-001-CON-2), Doc 4399.
Burgener—U.S. Appl. No. 12/315,395, filed 12/1/2008, 65 pages (PER-001-CON-3), Doc 4400.
USPTO—Notice of Publication dated May 7, 2009 for U.S. Appl. No. 12/315,395, 1 page (PER-001-CON-3), Doc 4402.
USPTO—Notice of Allowance dated Aug. 11, 2010 for U.S. Appl. No. 12/315,395, 33 pages (PER-001-CON-3), Doc 4403.
USPTO—Supplemental Notice of Allowability dated Oct. 29, 201O for U.S. Appl. No. 12/315,395, 10 pages (PER-001-CON-3}, Doc 4404.
Burgener—Issue Fee Payment dated Nov. 16, 2010 for U.S. Appl. No. 12/315,395, 1 page (PER-001-CON-3), Doc 4405.
USPTO —Issue Notification dated Dec. 8, 2010 for U.S. Appl. No. 12/315,395, 1 page (PER-001-CON-3), Doc 4406.
USPTO—Report on the Filing or Determination of an Action Regarding a Patent 3:12-cv-001160-CAB-BGS dated Jun. 11, 2012 for U.S. Appl. No. 12/315,395, 1 page (PER-001-CON-3), Doc 4407.
USPTO—Report on the Filing or Determination of an Action Regarding a Patent 1:12cv377 dated Jul. 11, 2012 for U.S. Appl. 12/315,395, 13 pages (PER-001-CON-3), Doc4408.
USPTO—Report on the Filing or Determination of an Action Regarding a Patent 8:12-cv-1160-CAB-BGS dated Apr. 15, 2013 for U.S. Appl. No. 12/315,395, 1 page (PER-001-CON-3), Doc 4409.
Burgener—Change of Address and Notification of Loss of Small Entity Status dated Mar. 7, 2014 for U.S. Appl. No. 12/315,395, 5 pages (PER-001-CON-3}, Doc 4410.
USPTO—Report on the Filing or Determination of an Action Regarding a Patent dated Oct. 14, 2014 for U.S. Appl. No. 12/315,395, 1 page (PER-001-CON-3), Doc 4411.
Burgener—Request for Certificate of Correction dated Mar. 7, 2016 for U.S. Appl. No. 12/315,395, 5 pages (PER-001-CON-3), Doc 4412.
USPTO—Certificate of Correction dated May 10, 2016 for U.S. Appl. No. 12/315,395, 1 page (PER-001-CON-3), Doc 4413.
Burgener—Notification of Loss of Small Entity Status dated Jun. 5, 2017 for U.S. Appl. No. 12/315,395, 1 page (PER-001-CON-3), Doc 4414.
USPTO—Filing Receipt dated Jan. 27, 2019 for U.S. Appl. No. 12/315,395, 3 pages (PER-001-CON-3), Doc 4401.
Burgener—U.S. Appl. No. 12/980,161, filed Dec. 28, 2010, 68 pages (PER-001-CON-4), Doc 4415.
USPTO—Filing Receipt dated Jan. 13, 2011 for U.S. Appl. No. 12/980,161, 4 pages (PER-001-CON-4), Doc 4416.
USPTO—Notice of Publication dated Apr. 21, 2011 for U.S. Appl. No. 12/980,161, 1 page (PER-001-CON-4), Doc 4417.
Burgener—Preliminary Amendment dated Apr. 27, 2012 for U.S. Appl. No. 12/980,161, 28 pages (PER-001-CON-4), Doc 4418.
USPTO—Notice of Non-Compliant Amendment dated May 1, 2012 for U.S. Appl. No. 12/980,161, 2 pages (PER-001-CON-4), Doc 4419.

(56) References Cited

OTHER PUBLICATIONS

Burgener—Response to Notice of Non-Compliant Amendment—Preliminary Amendment dated May 17, 2012 for U.S. Appl. No. 12/980,161, 6 pages (PER-001-CON-4), Doc 4420.
USPTO—Office Action dated Feb. 19, 2013 for U.S. Appl. No. 12/980,161, 106 pages (PER-001-CON-4), Doc 4421.
Burgener—Amendment and Terminal Disclaimers dated Aug. 19, 2013 for U.S. Appl. No. 12/980,161, 32 pages (PER-001-CON-4), Doc4422.
USPTO—Terminal Disclaimer Decision dated Aug. 21, 2013 for U.S. Appl. No. 12/980,161, 1 page (PER-001-CON-4), Doc 4423.
USPTO—Notice of Allowance dated Sep. 30, 2013 for U.S. Appl. No. 12/980,161, 186 pages (PER-001-CON-4), Doc 4424.
Burgener—Issue Fee Payment dated Oct. 8, 2013 for U.S. Appl. No. 12/980,161, 6 pages (PER-001-CON-4), Doc 4425.
USPTO—Issue Notification dated Oct. 23, 2013 for U.S. Appl. No. 12/980,161, 1 page (PER-001-CON-4), Doc 4426.
Burgener—Change of Address dated Nov. 8, 2013 for U.S. Appl. No. 12/980,161, 4 pages (PER-001-CON-4), Doc 4427.
Burgener—Request for Certificate of Correction dated Aug. 29, 2014 for U.S. Appl. No. 12/980,161, 7 pages (PER-004-CON-4), Doc 4428.
USPTO—Certificate of Correction dated Oct. 21, 2014 for U.S. Appl. No. 12/980,161, 1 page (PER-001-CON-4), Doc 4429.
Burgener—Notice of Loss of Small Entity Status dated Aug. 18, 2016 for U.S. Appl. No. 12/980,161, 1 page (PER-001-CON-4), Doc4430.
Burgener—U.S. Appl. No. 14/062,791, filed Oct. 24, 2013, 66 pages (PER-001-CON-5), Doc 4431.
USPTO—Filing Receipt and Notice to File Missing Parts dated Nov. 12, 2013 for U.S. Appl. No. 14/062,791, 6 pages (PER-001-CON-5), Doc 4432.
Burgener—Response to Pre-Exam Formalities Notice dated Jan. 13, 2014 for U.S. Appl. No. 14/062,791 (PER-001-CON-5), 15 pages, Doc4470.
USPTO—Updated Filing Receipt and Acceptance of Power of Attorney dated Mar. 20, 2014 for U.S. Appl. No. 14/062,791 (PER-001-CON-5), 5 pages, Doc 4471.
USPTO—Office Action dated Jun. 24, 2014 for U.S. Appl. No. 14/062,791 (PER-001-CON-5), 1O pages, Doc 4472.
USPTO—Notice of Publication dated Jun. 30, 2014 for U.S. Appl. No. 14/062,791 (PER-001-CON-5), 1 page, Doc 4473.
Burgener—Amendment and Terminal Disclaimer filed Nov. 24, 2014 for U.S. Appl. No. 14/062,791 (PER-001-CON-5), 18 pages, Doc 4474.
USPTO—Terminal Disclaimer Decision dated Dec. 9, 2014 for U.S. Appl. No. 14/062,791 (PER-001-CON-5), 1 page, Doc 4475.
USPTO—Notice of Allowance dated Jan. 23, 2015 for U.S. Appl. No. 14/062,791 (PER-001-CON-5), 15 pages, Doc 4476.
USPTO—Notice of Allowance dated May 14, 2015 for U.S. Appl. No. 14/062,791 (PER-001-CON-5), 11 pages, Doc 4477.
Burgener—Request for Continued Examination filed Aug. 14, 2015 in U.S. Appl. No. 14/062,791 (PER-001-CON-5), 3 gages, Doc 4478.
USPTO—Notice of Allowance dated Sep. 4, 2015 for U.S. Appl. No. 14/062,791 (PER-001-CON-5), 17 pages, Doc 4479.
Burgener—Issue Fee Payment dated Oct. 7, 2015 for U.S. Appl. No. 14/062,791 (PER-001-CON-5), 5 pages, Doc 4480.
USPTO—Notice of Allowance dated Oct. 16, 2015 for U.S. Appl. No. 14/062,791 (PER-001-CON-5), 8 pages, Doc 4481.
USPTO—Issue Notification dated Dec. 9, 2015 for U.S. Appl. No. 14/062,791 (PER-001-CON-5), 1 page, Doc 4482.
Burgener—Application dated Oct. 14, 2015, U.S. Appl. No. 14/883,499, 66 pages (PER-001-CON-6), Doc 6025.
USPTO—Filing Receipt dated Nov. 2, 2015, U.S. Appl. No. 14/883,499, 4 pages (PER-001-CON-6), Doc 6026.
USPTO—Notice of Missing Parts dated Nov. 2, 2015, U.S. Appl. No. 14/883,499, 2 pages (PER-001-CON-6), Doc6027.
Bergener—Response to Missing Parts dated Jan. 4, 2016, U.S. Appl. No. 14/883,499, 15 pages (PER-001-CON-6), Doc 6028.
USPTO—Updated Filing Receipt dated Mar. 24, 2016, U.S. Appl. No. 14/883,499, 6 pages (PER-001-CON-6), Doc 6029.
USPTO—Notice of Publication dated Jun. 30, 2016, U.S. Appl. No. 14/883,499, 1 page (PER-001-CON-6), Doc 6030.
USPTO—Office Action dated Oct. 4, 2016, U.S. Appl. No. 14/883,499, 26 pages (PER-001-CON-6), Doc 6031.
Burgener—Response to Office Action dated Feb. 3, 2017, U.S. Appl. No. 14/883,499, 16 pages (PER-001-CON-6), Doc 6032.
USPTO—Final Office Action dated May 18, 2017, U.S. Appl. No. 14/883,499, 24 pages (PER-001-CON-6), Doc 6033.
Burgener—Response to Final Office Action & Terminal Disclaimers dated May 26, 2017, U.S. Appl. No. 14/883,499, 19 pages (PER-001-CON-6), Doc 6034.
USPTO—Terminal Disclaimer Decision dated May 30, 2017, U.S. Appl. No. 14/883,499, 1 page (PER-001-CON-6), Doc 6035.
USPTO—Notice of Allowance dated Jun. 8, 2017, U.S. Appl. No. 14/883,499, 21 pages (PER-001-CON-6), Doc 6036.
Burgener—Issue Fee Payment dated Jul. 10, 2017, U.S. Appl. No. 14/883,499, 8 pages (PER-001-CON-6), Doc 6037.
Burgener—RCE dated Jul. 13, 2017, U.S. Appl. No. 14/883,499, 3 pages (PER-001-CON-6), Doc 6038.
Burgener—Petition to Accept Delayed Priority Claim dated Jul. 17, 2017, U.S. Appl. No. 14/883,499, 13 paQes (PER-001-CON-6), Doc 6041.
USPTO—Notice of Allowance dated Aug. 3, 2017, U.S. Appl. No. 14/883,499, 42 pages (PER-001-CON-6), Doc 6042.
USPTO—Corrected Filing Receipt dated Aug. 17, 2017, U.S. Appl. No. 14/883,499, 4 pages (PER-001-CON-6), Doc 604.
USPTO—Decision on Petition to Accept Delayed Priority Claim dated Aug. 21, 2017, U.S. Appl. No. 14/883,499, 9 pages (PER-001-CON-6), Doc 6044.
Burgener—Issue Fee Payment dated Aug. 22, 2017, U.S. Appl. No. 14/883,499, 7 pages (PER-001-CON-6), Doc 6045.
USPTO—Acceptance of Publication Request dated Aug. 23, 2017, U.S. Appl. No. 14/883,499, 1 page (PER-001-CON-6), Doc 6046.
USPTO—Supplemental Notice of Allowability dated Aug. 30, 2017, U.S. Appl. No. 14/883,499, 6 pages (PER-001-CON-6), Doc 6047.
USPTO—Issue Notification dated Sep. 13, 2017, U.S. Appl. No. 14/883,499, 1 page (PER-001-CON-6), Doc 6048.
Burgener—U.S. Appl. No. 15/656,953, filed Jul. 21, 2017, 71 pages (PER-001-CON-7), Doc6005.
USPTO—Filing Receipt dated Aug. 4, 2017, U.S. Appl. No. 15/656,953, 4 pages (PER-001-CON-7), Doc 6006.
USPTO—Missing Parts dated Aug. 4, 2017, U.S. Appl. No. 15/656,953, 2 pages (PER-001-CON-7}, Doc 6007.
Burgener—Response to Notice to File Missing Parts for U.S. Appl. No. 15/656,953, dated Oct. 4, 2017, 13 pages (PER-001-CON-7), Doc 6008.
Burgener—Preliminary Amendment dated Nov. 17, 2017, U.S. Appl. No. 15/656,953, 11 pages (PER-001-CON-7), Doc 6009.
USPTO—Updated Filing Receipt dated Nov. 22, 2017, U.S. Appl. No. 15/656,953, 4 pages (PER-001-CON-7}, Doc 601o.
USPTO—Notice of PubIication dated Mar. 1, 2018, U.S. Appl. No. 15/656,953, 1 page (PER-001-CON-7), Doc 6011.
USPTO—Office Action dated Mar. 7, 2018, U.S. Appl. No. 15/656,953, 21 pages (PER-001-CON-7), Doc 6012.
Burgener—Request to Update Applicant Name dated Apr. 8, 2018, U.S. Appl. No. 15/656,953 8 pages (PER-001-CON-7), Doc 6013.
USPTO—Corrected Filing Receipt dated Apr. 10, 2018 for U.S. Appl. No. 15/656,953, 4 pages (PER-001-CON-7), Doc 6014.
Burgener—Response to Office Action dated Apr. 19, 2018, U.S. Appl. No. 15/656,953, 4 pages (PER-001-CON-7), Doc 6015.
USPTO —Terminal Disclaimer dated Apr. 19, 2018 for U.S. Appl. No. 15/656,953, 3 pages (PER-001-CON-7), Doc 6016.
USPTO—Final Office Action dated May 16, 2018, U.S. Appl. No. 15/656,953, 17 pages (PER-001-CON-7), Doc 6017.
Burgener—Response to Final Office Action dated Jul. 12, 2018, U.S. Appl. No. 15/656,953, 3pages (PER-001-CON-7), Doc6018.
USPTO—Notice of Allowance dated Aug. 1, 2018, U.S. Appl. No. 15/656,953, 20 pages (PER-001-CON-7), Doc 6019.
Burgener—Rule 312 Amendment dated Sep. 19, 2018, U.S. Appl. No. 15/656,953 (PER-001-CON-7), Doc 6020.

(56) References Cited

OTHER PUBLICATIONS

USPTO—Response to Rule 312 Amendment dated Sep. 27, 2018, U.S. Appl. No. 15/656,953, 3 pages (PER-001-CON-7), Doc 6021.
USPTO—Supplemental Notice of Allowability dated Oct. 12, 2018, U.S. Appl. No. 15/656,953, 14 pages (PER-001-CON-7), Doc 6022.
Burgener—Issue Fee Payment dated Oct. 19, 2018, U.S. Appl. No. 15/656,953, 5 pages (PER-001-CON-7), Doc 6023.
USPTO—Issue Notification dated Nov. 20, 2018, U.S. Appl. No. 15/656,953, 1 page (PER-001-CON-7), Doc 6024.
Burgener—U.S. Appl. No. 16/167,389, filed Oct. 22, 2018, 76 pages (PER-001-CON-8), Doc6000.
USPTO—Filing Receipt dated Nov. 16, 2018, U.S. Appl. No. 16/167,389, 4 pages (PER-001-CON-8), Doc 6001.
USPTO—Notice of Publication dated Feb. 21, 2019 for U.S. Appl. No. 16/167,389, 1 page (PER-001-CON-8), Doc 6002.
USPTO—Office Action dated Mar. 22, 2019 for U.S. Appl. No. 16/167,389, 20 pages (PER-001-CON-8), Doc 6003.
USPTO—Terminal Disclaimer dated Mar. 28, 2019 for U.S. Appl. No. 16/167,389, 7 pages (PER-001-CON-8), Doc 6004.
Burgener—Response to Office Action filed Aug. 22, 2019 for U.S. Appl. No. 16/167,389, 24 pages, (PER-001-CON-8), Doc 9027.
USPTO—Notice of Allowance and Notice of Allowability for U.S. Appl. No. 16/167,389 dated Oct. 10, 2019, 89 pages (PER-001-CON-8)—Doc 9003.
Burgener—Issue Fee Payment and 312 Amendment filed Jan. 10, 2020 for U.S. Appl. No. 16/167,389, 11 pages (PER-001-CON-8), Doc 9070.
USPTO—Response to 312 Amendment dated Jan. 30, 2020 for U.S. Appl. No. 16/167,389, 11 pages (PER-001-CON-8), Doc 9082.
USPTO—Issue Notification dated Feb. 12, 2020 for U.S. Appl. No. 16/167,389, 1 page (PER-001-CON-8), Doc 9093.
USPTO—Supplemental Notice of Allowability dated Mar. 9, 2020 for U.S. Appl. No. 16/167,389, 8 pages (PER-001-CON-8), Doc 9100.
USPTO—Issue Notification dated Mar. 25, 2020 for U.S. Appl. No. 16/167,389, 1 page (PER-001-CON-8), Doc 9118.
Burgener—U.S. Appl. No. 16/676,350, filed Nov. 6, 2019, 92 pages (PER-001-CON-9), Doc 9004.
USPTO—Filing Receipt dated Nov. 25, 2019 for U.S. Appl. No. 16/676,350, 4 pages (PER-001-CON-9), Doc 9120.
USPTO—Non-final Office Action dated Dec. 26, 2019 for U.S. Appl. No. 16/676,350, 17 pages (PER-001-CON-9), Doc 9029.
USPTO—Notice of Publication dated Mar. 5, 2020 for U.S. Appl. No. 16/676,350, 1 page (PER-001-CON-9), Doc 9121.
Burgener—e-Terminal Disclaimer filed Apr. 21, 2020 for U.S. Appl. No. 16/676,350, 6 pages (PER-001-CON-9), Doc 9117.
Burgener—Response to Office Action filed Apr. 22, 2020 for U.S. Appl. No. 16/676,350, 9 pages (PER-001-CON-9), Doc 9119/.
USPTO—Notice of Allowance and Allowability dated Jul. 2, 2020 for U.S. Appl. No. 16/676,350, 143 pages (PER-001-CON-9), Doc 9204.
Burgener—312 Amendment After Allowance filed Jul. 9, 2020 for U.S. Appl. No. 16/676,350, 11 pages (PER-001-CON-9), Doc 9205.
Burgener—Issue Fee Payment filed Jul. 14, 2020 for U.S. Appl. No. 16/676,350, 3 pages (PER-001-CON-9), Doc 9222.
USPTO—Response to Rule 312 Communication dated Jul. 29, 2020 for U.S. Appl. No. 16/676,350, 3 pages (PER-001-CON-9), Doc 9252.
USPTO—Notice of Allowance and Allowability dated Aug. 6, 2020 for U.S. Appl. No. 16/676,350, 15 pages (PER-001-CON-9), Doc 9242.
Burgener—Response to Notice of Allowance filed Aug. 6, 2020 for U.S. Appl. No. 16/676,350, 6 pages (PER-001-CON-9), Doc 9239.
USPTO—Corrected Notice of Allowability dated Aug. 19, 2020 for U.S. Appl. No. 16/676,350, 11 pages (PER-001-CON-9), Doc 9263.
USPTO—Issue Notification dated Sep. 30, 2020 for U.S. Appl. No. 16/676,350, 1 page (PER-001-CON-9), Doc 9264.
Burgener—U.S. Appl. No. 16/679,760, filed Nov. 11, 2019, 92 pages (PER-001-CON-10), Doc 9005.
USPTO—Filing Receipt dated Nov. 27, 2019 for U.S. Appl. No. 16/679,760, 4 pages (PER-001-CON-10), Doc 9025.
USPTO—Non-final Office Action dated Dec. 26, 2019 for U.S. Appl. No. 16/679,760, 19 pages (PER-001-CON-10), Doc 9026.
USPTO—Notice of Publication dated Mar. 5, 2020 for U.S. Appl. No. 16/679,760, 1 page (PER-001-CON-10}, Doc 9099.
Burgener—e-Terminal Disclaimer filed Apr. 21, 2020 for U.S. Appl. No. 16/679,760, 6 pages (PER-001-CON-10}, Doc 9122.
Burgener—Response to Office Action filed Apr. 22, 2020 for U.S. Appl. No. 16/679,760, 9 pages (PER-001-CON-10}, Doc 9123.
USPTO—Notice of Allowance and Allowability dated Jul. 1, 2020 for U.S. Appl. No. 16/679,760, 125 pages (PER-001-CON-10), Doc 9206.
Burgener—312 Amendment After Allowance filed Jul. 9, 2020 for U.S. Appl. No. 16/679,760, 10 pages (PER-001-CON-10), Doc 9207.
Burgener—Issue Fee Payment filed Jul. 14, 2020 for U.S. Appl. No. 16/679,760, 3 pages (PER-001-CON-10), Doc 9223.
USPTO—Corrected Notice of Allowability dated Jul. 31, 2020 for U.S. Appl. No. 16/679,760, 7 pages (PER-001-CON-10}, Doc 9248.
Burgener—Response to Notice of Allowance filed Aug. 7, 2020 for U.S. Appl. No. 16/679,760, 6 pages (PER-001-CON-10}, Doc 9257.
USPTO—Corrected Notice of Allowability dated Aug. 19, 2020 for U.S. Appl. No. 16/679,760, 11 pages (PER-001-CON-10), Doc 9265.
USPTO—Issue Notification dated Sep. 9, 2020 for U.S. Appl. No. 16/679,760, 1 page (PER-001-CON-10), Doc 9266.
Burgener—U.S. Appl. No. 16/738,343, filed Jan. 9, 2020, 92 pages, (PER-001-CON-11), Doc 9068.
USPTO—Filing Receipt dated Jan. 31, 2020 for U.S. Appl. No. 16/679,760, 4 pages, (PER-001-CON-11), Doc 9085.
USPTO—Acceptance of Track I Request dated Feb. 4, 2020 for U.S. Appl. No. 16/679,760, 2 pages, (PER-001-CON-11), Doc 9095.
USPTO—Non-final Office Action dated Feb. 25, 2020 for U.S. Appl. No. 16/738,343, 24 pages, (PER-001-CON-11), Doc 9096.
Burgener—e-Terminal disclaimer filed Apr. 22, 2020 for U.S. Appl. No. 16/738,343, 6 pages, (PER-001-CON-11), Doc 9124.
Burgener—Response to Office Action filed Apr. 22, 2020 for U.S. Appl. No. 16/738,343, 9 pages, (PER-001-CON-11), Doc 9125.
USPTO—Notice of Publication dated May 14, 2020 for U.S. Appl. No. 16/738,343, 1 page, (PER-001-CON-11), Doc 9164.
USPTO—Notice of Allowance and Allowability dated Jun. 29, 2020 for U.S. Appl. No. 16/735,343, 79 pages, (PER-001-CON-11), Doc 9208.
Burgener—312 Amendment After Allowance filed Jul. 9, 2020 for U.S. Appl. No. 16/735,343, 10 pages, (PER-001-CON-11), Doc 9209.
Burgener—Issue Fee Payment filed Jul. 9, 2020 for U.S. Appl. No. 16/735,343, 3 pages, (PER-001-CON-11), Doc 9224.
USPTO—Office Communication dated Jul. 23, 2020 for U.S. Appl. No. 16/735,343, 77 pages, (PER-001-CON-11), Doc 9232.
Burgener—312 Response Under 37 CFR § 1.312 filed Jul. 23, 2020 for U.S. Appl. No. 16/735,343, 9 pages, (PER-001-CON-11) Doc 9231.
USPTO—Response to 312 Communication dated Jul. 30, 2020 for U.S. Appl. No. 16/735,343, 3 pages, (PER-001-CON-11), Doc 9251.
USPTO—Notice of Allowance and Allowability dated Aug. 10, 2020 for U.S. Appl. No. 16/735,343, 14 pages, (PER-001-CON-11), Doc 9256.
Brindle—Response to Notice of Allowance filed Aug. 10, 2020 for U.S. Appl. No. 16/735,343, 6 pages, (PER-001-CON-11}, Doc 9253.
USPTO—Corrected Notice of Allowability dated Aug. 20, 2020 for U.S. Appl. No. 16/735,343, 11 pages, (PER-001-CON-11), Doc 9267.
USPTO—Issue Notification dated Sep. 16, 2020 for U.S. Appl. No. 16/735,343, 1 page, (PER-001-CON-11), Doc 9268.
Burgener—US Patent Application filed Jul. 15, 2020 for U.S. Appl. No. 16/930,215, 84 pages, (PER-001-CON-12), Doc 9225.

(56) References Cited

OTHER PUBLICATIONS

USPTO—Filing Receipt dated Jul. 24, 2020 for U.S. Appl. No. 16/930,215, 5 pages, (PER-001-CON-12), Doc 9236.
USPTO—Notice of Missing Parts dated Jul. 24, 2020 for U.S. Appl. No. 16/930,215, 2 pages, (PER-001-CON-12), Doc 9237.
Kelly—U.S. Appl. No. 11/347,014, filed Feb. 3, 2006, 80 pages (PER-001-CIP-1), Doc 4367.
USPTO—Notice of File Missing Parts dated Mar. 7, 2006 for U.S. Appl. No. 11/347,014, 2 pages (PER-001-CIP-1), Doc 4368.
Kelly—Response to Pre-Exam Formalities Notice dated May 10, 2006 for U.S. Appl. No. 11/347,014, 11 pages (PER-001-CIP-1), Doc 4369.
Tieu—Office Action dated Sep. 16, 2009 for U.S. Appl. No. 11/347,014, 26 pages (PER-001-CIP-1), Doc 0713.
Kelly—Amendment and Terminal Disclaimers dated Mar. 22, 2010 for U.S. Appl. No. 11/347,014, 10 pages (PER-001-CIP-1), Doc 4371.
USPTO—Terminal Disclaimer Review Decision dated Apr. 9, 2010 for U.S. Appl. No. 11/347,014, 1 page (PER-001-CIP-1), Doc 4372.
USPTO—Notice of Allowance dated Apr. 29, 2010 for U.S. Appl. No. 11/347,014, 15 pages (PER-001-CIP-1), Doc 4373.
USPTO—Supplemental Notice of Allowability dated Jul. 22, 2010 for U.S. Appl. No. 11/347,014, 4 pages (PER-O01-CIP-1), Doc 4374.
Kelly—Issue Fee Payment and Comments on Reasons for Allowance dated Aug. 2, 2010 for U.S. Appl. No. 11/347,014, 3 pages (PER-001-CIP-1), Doc 4375.
USPTO—Issue Notification dated Aug. 25, 2010 for U.S. Appl. No. 11/347,014, 1 page (PER-001-CIP-1), Doc 4376.
USPTO—Report on the Filing or Determination of an Action Regarding a Patent 3:12-cv-001160-CAB-BGS dated Jun. 11, 2012 for U.S. Appl. No. 11/347,014, 1 page (PER-001-CIP-1), Doc 4377.
USPTO—Report on the Filing or Determination of an Action Regarding a Patent 1:12cv377 dated Jul. 11, 2012 for U.S. Appl. No. 11/347,014, 13 pages (PER-001-CIP-1), Doc 4378.
USPTO—Report on the Filing or Determination of an Action Regarding a Patent 1:12cv377 dated Jul. 11, 2012 for U.S. Appl. No. 11/347,014, 13 pages (PER-001-CIP), Doc 4395.
USPTO—Report on the Filing or Determination of an Action Regarding a Patent 3:12-cv-001160-CAB-BGS dated Apr. 15, 2013 for U.S. Appl. No. 11/347,014, 1 page (PER-001-CIP-1), Doc 4379.
Kelly—Change of Address and Notice of Loss of Small Entity Status dated Mar. 5, 2014 for U.S. Appl. No. 11/347,014, 5 pages (PER-001-CIP-1), Doc 4380.
USPTO—Report on the Filing or Determination of an Action Regarding a Patent 3:12-cv-00911-AJB-WMC dated Oct. 15, 2014 for U.S. Appl. No. 11/347,014, 1 page (PER-001-CIP-1), Doc 4381.
Kelly—Request for Certificate of Correction dated Mar. 7, 2016 for U.S. Appl. No. 11/347,014, 5 pages (PER-001-CIP-1), Doc 4382.
USPTO—Certificate of Correction dated May 10, 2016 for U.S. Appl. No. 11/247,014, 1 page (PER-001-CIP-1), Doc 4383.
Kelly—Notification of Loss of Small Entity Status dated Jun. 5, 2017 for U.S. Appl. No. 11/347,014, 1 page (PER-001-CIP-1), Doc 4384.
Wells—Office Action dated Feb. 22, 2018 for U.S. Appl. No. 14/883,525, 19 pages (PER-005-DIV-CON-2), Doc. 1044.
Wells—Final Office Action dated Jul. 5, 2018 for U.S. Appl. No. 14/883,525, 22 pages (PER-005-DIV-CON-2), Doc 1058.
Wells—Notice of Allowance dated Aug. 30, 2018 for U.S. Appl. No. 14/883,525, 13 pages (PER-005-DlV-CON-2), Doc 1061.
Nguyen—Office Action dated Oct. 25, 2005 for U.S. Appl. No. 10/875,405, 9 pages, Doc 0632.
Burgener—Amendment dated Jan. 25, 2006 for U.S. Appl. No. 10/875,405, 13 pages, Doc 0637.
Nguyen—Office Action dated Apr. 20, 2006 for U.S. Appl. No. 10/875,405, 12 pages, Doc 0641.
Burgener—Amendment dated Aug. 21, 2006 for U.S. Appl. No. 10/875,405, 13 pages, Doc 0648.
Nguyen—Notice of Allowance dated Sep. 27, 2006 for U.S. Appl. No. 10/875,405, 1o pages, Doc 0649.
Burgener—Comments on Reasons for Allowance dated Dec. 26, 2006 for U.S. Appl. No. 10/875,405, 3 pages, Doc 0653.
Le—Notice of Allowance dated Sep. 26, 2005 for U.S. Appl. No. 11/158,597, 14 pages, (PER-006-CIP), Doc 0631.
Le—Notice of Allowance dated Feb. 27, 2006 for U.S. Appl. No. 11/158,597, 11 pages, (PER-006-CIP), Doc 0640.
Tran—Office Action dated Mar. 19, 2009 for U.S. Appl. No. 11/501,125, 19 pages, (PER-006-CIP-CON), Doc 0688.
Burgener—Amendment dated Jun. 19, 2009 for U.S. Appl. No. 11/501,125, 7 pages, (PER-006-CIP-CON), Doc 0696.
Tran—Office Action dated Oct. 29, 2009 for U.S. Appl. No. 11/501,125, 21 pages, (PER-006-CIP-CON), Doc 0716.
Burgener—Amendment filed May 5, 2010 for U.S. Appl. No. 11/501,125, 16 pages, (PER-006-CIP-CON), Doc 0734.
Tran—Notice of Allowance dated Jun. 10, 2010 for U.S. Appl. No. 11/501,125, 13 pages, (PER-006-CIP-CON), Doc 0740.
Tran—Notice of Allowance dated May 19, 2011 for U.S. Appl. No. 11/501,125, 16 pages, (PER-006-CIP-CON), Doc 0780.
Tran—Notice of Allowance dated Oct. 6, 2011 for U.S. Appl. No. 11/501,125, 32 pages (PER-006-CIP-CON), Doc 0788.
Tran—Office Action dated Dec. 18, 2012 for U.S. Appl. No. 13/412,463, 8 pages (PER-006-CIP-CON-2), Doc 0830.
Burgener—Amendment dated May 20, 2013 for U.S. Appl. No. 13/412,463, 15 pages (PER-006-CIP-CON-2), Doc 0851.
Tran—Notice of Allowance dated Jun. 6, 2013 for U.S. Appl. No. 13/412,463, 18 pages (PER-006-CIP-CON-2), Doc 0854.
Tran—Office Action dated May 8, 2014 for U.S. Appl. No. 14/052,680, 14 pages (PER-006-CIP-CON-3), Doc 0907.
Burgener—Amendment dated Nov. 10, 2014 for U.S. Appl. No. 14/052,680, 17 pages (PER-006-CIP-CON-3), Doc 0937.
Tran—Notice of Allowance dated Feb. 3, 2017 for U.S. Appl. No. 14/052,680, 13 pages (PER-006-CIP-CON-3), Doc 1016.
Tran—Office Action dated Aug. 18, 2017 for U.S. Appl. No. 15/586,007, 14 pages (PER-006-CIP-CON-4), Doc 1034.
Burgener—Response dated Sep. 5, 2017 for U.S. Appl. No. 15/586,007, 13 pages (PER-006-CIP-CON-4), Doc 1035.
Tran—Office Action dated Sep. 27, 2017 for U.S. Appl. No. 15/586,007, 15 pages (PER-006-CIP-CON-4), Doc 1036.
Burgener—Response dated Oct. 11, 2017 for U.S. Appl. No. 15/586,007, 3 pages (PER-006-CIP-CON-4), Doc 1037.
Tran—Notice of Allowance dated Mar. 5, 2019 for U.S. Appl. No. 15/917,218, 18 pages (PER-006-CIP-CON-4-DIV-1), Doc 1071.
Trans—Office Action dated Feb. 3, 2012 for U.S. Appl. No. 12/903,848, 11 pages (PER-006-CIP-DIV-1), Doc 0799.
Tran—Notice of Allowance dated Oct. 26, 2012 for U.S. Appl. No. 12/903,848, 27 pages (PER-006-CIP-DIV-1), Doc 0828.
Tran—Notice of Allowance dated Feb. 15, 2013 for U.S. Appl. No. 12/903,848, 30 pages (PER-006-CIP-DIV), Doc 0844.
Tran—Notice of Allowance dated May 16, 2013 for U.S. Appl. No. 12/903,848, 12 pages (PER-006-CIP-DIV), Doc 0850.
Tran—Office Action dated Aug. 7, 2014 for U.S. Appl. No. 14/177,062, 9 pages (PER-006-CIP-DIV-CON-1), Doc 0919.
Burgener—Response dated Nov. 6, 2014 for U.S. Appl. No. 14/177,062, 22 pages (PER-006-CIP-DIV-CON-1), Doc 0936.
Tran—Office Action dated Feb. 24, 2015 for U.S. Appl. No. 14/177,062, 7 pages (PER-006-CIP-DIV-CON-1), Doc 0950.
Burgener—Response dated Dec. 3, 2015 for U.S. Appl. No. 14/177,062, 13 pages (PER-006-CIP-DIV-CON-1), Doc 0977.
Tran—Notice of Allowance dated Mar. 25, 2016 for U.S. Appl. No. 14/177,062, 159 pages (PER-006-CIP-DIV-CON-1), Doc 0989.
Tieu—Notice of Allowance dated Dec. 19, 2008 for U.S. Appl. No. 11/127,520, 11 pages, (PER-007-CIP), Doc 0677.
Luu—Office Action dated Oct. 30, 2008 for U.S. Appl. No. 11/351,342, 15 pages, Doc 0676.
Kelly—Response to Office Action dated Jan. 30, 2009 for U.S. Appl. No. 11/351,342, 15 pages, (PER-010-PAP), Doc 0683.
Luu—Final Office Action dated Apr. 8, 2009 for U.S. Appl. No.. 11/351,342, 15 pages, (PER-010-PAP), Doc 0689.
Kelly—Proposed Amendment After Final dated Jun. 8, 2009 for U.S. Appl. No. 11/351,342, 14 pages, (PER-010-PAP), Doc 0694.
Luu—Notice of Allowance dated Jul. 2, 2009 for U.S. Appl. No. 11/351,342, 10 pages, (PER-010-PAP), Doc 0697.

(56) References Cited

OTHER PUBLICATIONS

Chow—Office Action dated Aug. 19, 2008 for U.S. Appl. No. 11/347,671, 18 pages (PER-013-PAP), Doc 0669.
Kelly—Amendment dated Dec. 19, 2008 for U.S. Appl. No. 11/348,671, 16 pages (PER-013-PAP), Doc 0678.
Chow—Office Action dated Apr. 16, 2009 for U.S. Appl. No. 11/347,671, 18 pages (PER-013-PAP), Doc 0690.
Kelly—Response dated Jun. 16, 2009 for U.S. Appl. No. 11/347,671, 14 pages (PER-013-PAP), Doc 0695.
Chow—Office Action dated Jul. 20, 2009 for U.S. Appl. No. 11/347,671, 19 pages (PER-013-PAP), Doc 0700.
Chow—Office Action dated Apr. 28, 2010 for U.S. Appl. No. 11/347,671, 22 pages (PER-013-PAP), Doc 0737.
Kelly—Amendment dated Jul. 28, 2010 for U.S. Appl. No. 11/347,671, 9 pages (PER-013-PAP), Doc 0748.
Chow—Office Action dated Aug. 20, 2010 for U.S. Appl. No. 11/347,671, 20 pages, Doc 0750.
Kelly—Amendment dated Dec. 20, 2010 for U.S. Appl. No. 11/347,671, 13 pages (PER-013-PAP), Doc 0728.
Kelly—Amendment dated Dec. 20, 2010 for U.S. Appl. No. 11/347,671, 15 pages (PER-013-PAP), Doc 0766.
Chow—Office Action dated Mar. 2, 2011 for U.S. Appl. No. 11/347,671, 17 pages (PER-013-PAP), Doc 0768.
Kelly—Amendment dated May 2, 2011 for U.S. Appl. No. 11/347,671, 1O pages (PER-013-PAP), Doc 0773.
Chow—Advisory Action dated May 2, 2011 for U.S. Appl. No. 11/347,671, 3 pages (PER-013-PAP), Doc 0774.
Kelly—Notice of Appeal dated Jun. 2, 2011 for U.S. Appl. No. 11/347,671, 6 pages (PER-013-PAP), Doc 0781.
Chow—Notice of Panel Decision from Pre-Appeal Brief Review dated Jul. 11, 2011 for U.S. Appl. No. 11/347,671, 2 pages (PER-013-PAP), Doc 0783.
Kelly—Supplemental Amendment dated Aug. 9, 2011 for U.S. Appl. No. 11/347,671, 5 pages (PER-013-PAP), Doc 0785.
Chow—Notice of Allowance dated Aug. 16, 2011 for U.S. Appl. No. 11/347,671, 17 pages (PER-013-PAP), Doc 0786.
Kelly—Comments on Examiner's Statement of Reasons for Allowance dated Nov. 16, 2011 for U.S. Appl. No. 11/347,671, 1O pages (PER-013-PAP), Doc 0794.
Stuber—U.S. Appl. No. 11/520,912, filed Sep. 14, 2006, 128 pages (PER-015-CIP), Doc 4217.
USPTO—Notice to File Missing Parts dated Oct. 5, 2006 for U.S. Appl. No. 11/520,912, 2 pages (PER-015-CIP), Doc 4218.
Stuber—Response to Pre-Exam Formalities Notice dated Dec. 8, 2006 for U.S. Appl. No. 11/520,912, 20 pages (PER-015-CIP), Doc 4219.
USPTO—Notice of Publication dated Mar. 29, 2007 for U.S. Appl. No. 11/520,912, 1 page (PER-015-CIP), Doc 4221.
USPTO—Office Action dated Sep. 15, 2008 for U.S. Appl. No. 11/520,912, 25 pages (PER-015-CIP), Doc 4222.
Stuber—Amendment dated Mar. 16, 2009 for U.S. Appl. No. 11/520,912, 26 pages (PER-015-CIP), Doc 4223.
USPTO—Restriction Requirement dated Jul. 8, 2009 for U.S. Appl. No. 11/520,912, 9 pages (PER-015-CIP), Doc 4224.
Stuber—Response to Restriction Requirement and Amendment dated Sep. 8, 2009 for U.S. Appl. No. 11/520,912, 8 pages, (PER-015-CIP), Doc 4225.
USPTO—Final Office Action dated Dec. 10, 2009 for U.S. Appl. No. 11/520,912, 26 pages (PER-015-CIP), Doc 4226.
Stuber—Response to Final Office Action and Amendment dated Jun. 14, 201O for U.S. Appl. No. 11/520,912, 29 paQes (PER-015-CIP), Doc. 4227.
USPTO—Notice of Allowance dated Sep. 16, 2010 for U.S. Appl. No. 11/520,912, 23 pages (PER-015-CIP), Doc 4228.
Stuber—Issue Fee Payment and Comments dated Dec. 20, 2010 for U.S. Appl. No. 11/520,912, 7 pages (PER-015-CIP), Doc 4229.
USPTO—Issue Notification and Miscellaneous Letter to Applicant dated Jan. 16, 2011 for U.S. Appl. No. 11/520,912, 3 paQes (PER-015-CIP), Doc 4230.

Peregrine—Notice of Loss of Small Entity Status dated Jun. 26, 2017 for U.S. Appl. No. 11/520,912, 1 page (PER-015-CIP), Doc4231.
PSemi—3.73 Statement dated Aug. 31, 2018 for U.S. Appl. No. 11/520,912, 5 pages (PER-015-CIP), Doc 4232.
USPTO—Updated Filing Receipt dated Dec. 15, 2019 for U.S. Appl. No. 11/520,912, 3 pages (PER-015-CIP), Doc 4220.
USPTO—Notice of Withdraw from Issue dated Dec. 17, 2013 for U.S. Appl. No. 13/028,144, 1 page (PER-015-CIP-DIV-1), Doc 4249.
Stuber—U.S. Appl. No. 13/028,144, filed Feb. 15, 2011, 121 pages (PER-015-CIP-DIV-1), Doc 4233.
USPTO—Filing Receipt and Notice to File Missing Parts dated Mar. 1, 2011 for U.S. Appl. No. 13/028,144, 5 pages (PER-015-CIP-DIV-1), Doc 4234.
Stuber—Response to Pre-Exam Formalities Notice dated Jun. 1, 2011 for U.S. Appl. No. 13/028,144, 17 pages (PER-015-CIP-DIV-1), Doc 4235.
USPTO—Updated Filing Receipt dated Jun. 10, 2011 for U.S. Appl. No. 13/028,144, 4 pages (PER-015-CIP-DIV-1), Doc 4236.
USPTO—Restriction Requirement dated Jan. 18, 2012 for U.S. Appl. No. 13/028,144, 35 paQes (PER-015-CIP-DIV-1), Doc4237.
Stuber—Response to Restriction Requirement dated Feb. 1, 2012 for U.S. Appl. No. 13/028,144, 6 pages (PER-015-CIP-DIV-1), Doc4238.
USPTO—Office Action dated Apr. 12, 2012 for U.S. Appl. No. 13/028,144, 25 pages (PER-015-CIP-DIV-1), Doc 4239.
Stuber —Amendment and Terminal Disclaimer dated Aug. 13, 2012 for U.S. Appl. No. 3/028,144, 14 pages (PER-015-CIP-DIV-1), Doc4240.
USPTO—Terminal Disclaimer Decision dated Aug. 20, 2012 for U.S. Appl. No. 13/028,144, 1 page (PER-015-CIP-DIV-1), Doc 4241.
Stuber—Supplemental Amendment dated Nov. 8, 2012 for U.S. Appl. No. 13/028,144, 24 pages (PER-015-CIP-DIV), Doc 4242.
USPTO—Restriction Requirement dated Jan. 14, 2013 for U.S. Appl. No. 13/028,144, 22 pages (PER-015-CIP-DIV-1), Doc 4243.
Stuber—Amendment dated Jul. 15, 2013 for U.S. Appl. No. 13/028,144, 30 pages (PER-015-CIP-DIV-1), Doc 4244.
USPTO—Notice of Allowance dated Sep. 26, 2013 for U.S. Appl. No. 13/028,144, 42 pages (PER-015-CIP-DIV-1), Doc 4245.
Stuber—Issue Fee Payment and Comments dated Sep. 27, 2013 for U.S. Appl. No. 13/028,144, 10 pages (PER-015-CIP-DIV-1), Doc4246.
USPTO—Issue Notification dated Dec. 11, 2013 for U.S. Appl. No. 13/028,144, 1 page (PER-015-CIP-DIV1), Doc 4247.
Stuber—Request for Continued Examination and Petition to Withdraw Application from Issue dated Dec. 16, 2013 for U.S. Appl. No. 13/028,144, 11 pages (PER-015-CIP-DIV-1), Doc4248.
Stuber—Amendment dated Dec. 20, 2013 for U.S. Appl. No. 13/028,144, 32 pages (PER-015-CIP-DIV-1), Doc 4250.
USPTO—Notice of Allowance dated Jan. 23, 2014 for U.S. Appl. No. 13/028,144, 25 pages (PER-015-CIP-DIV-1), Doc 4251.
Stuber—Petition for and Auto-Grant for Removal from Issue dated Mar. 7, 2014 for U.S. Appl. No. 13/028,144, 9 pages (PER-015-CIP-DIV-1), Doc 4253.
Stuber—Request for Continued Examination dated Mar. 7, 2014 for U.S. Appl. No. 13/028,144, 3 pages (PER-015-CIP-DIV-1), Doc 4254.
USPTO—Notice of Allowance dated Apr. 25, 2014 for U.S. Appl. No. 13/028,144, 43 pages (PER-015-CIP-DIV-1), Doc 4255.
Stuber—Request for Continued Examination dated May 27, 2014 for U.S. Appl. No. 13/028,144, 3 pages (PER-015-CIP-DIV-1), Doc4256.
USPTO—Notice of Allowance dated Jul. 18, 2014 for U.S. Appl. No. 13/028,144, 53 pages (PER-015-CIP-DIV-1), Doc 4257.
USPTO—Supplemental Notice of Allowability dated Aug. 27, 2014 for U.S. Appl. No. 13/028,144, 29 pages (PER-015-CIP-DIV-1), Doc 4258.
Stuber—Request for Continued Examination dated Aug. 28, 2014 for U.S. Appl. No. 13/028,144, 3 pages (PER-015-CIP-DIV-1), Doc 4259.
Stuber—Issue Fee Payment and Comments on Reasons for Allowance dated Oct. 1, 2014 for U.S. Appl. No. 13/028,144, 8 pages (PER-015-CIP-DIV-1), Doc 4260.

(56) References Cited

OTHER PUBLICATIONS

USPTO—Notice of Allowance dated Oct. 1, 2014 for U.S. Appl. No. 13/028,144, 35 pages (PER-015-CIP-DIV-1), Doc 4261.
USPTO—Issue Notification dated Oct. 23, 2014 for U.S. Appl. No. 13/028,144, 1 page (PER-015-CIP-DIV-1), Doc 4262.
Stuber—Petition for and Auto-Grant of Removal from Issue dated Oct. 30, 2014 for U.S. Appl. No. 13/028,144, 7 pages (PER-015-CIP-DIV-1), Doc 4263.
Stuber—Request for Continued Examination dated Oct. 30, 2014 for U.S. Appl. No. 13/028,144, 3 pages (PER-015-CIP-DIV-1), Doc 4264.
USPTO—Notice of Allowance dated Dec. 5, 2014 for U.S. Appl. No. 13/028,144, 32 pages (PER-015-CIP-DIV-1), Doc 4265.
Stuber—Issue Fee Payment and Comments on Reasons for Allowance dated Dec. 8, 2014 for U.S. Appl. No. 13/028,144, 8 pages (PER-015-CIP-DIV-1), Doc 4266.
Stuber—Terminal Disclaimers dated Dec. 12, 2014 for U.S. Appl. No. 13/028,144, 10 pages (PER-015-CIP-DIV-1), Doc 4252.
USPTO—Issue Notification dated Jan. 21, 2015 for U.S. Appl. No. 13/028,144, 1 page (PER-015-CIP-DIV-1), Doc 4267.
Peregrine—Notice of Loss of Small Entity Status dated Jun. 26, 2017 for U.S. Appl. No. 13/028,144, 1 page (PER-015-CIP-DIV-1), Doc 4268.
PSemi—3.73 Statement dated Aug. 31, 2018 for U.S. Appl. No. 13/028,144, 5 pages (PER-015-CIP-DIV-1), Doc 4269.
Stuber—U.S. Appl. No. 13/948,094, filed Jul. 22, 2013, 144 pages (PER-015-CIP-DIV-CON-1), Doc 4270.
USPTO—Filing Receipt and Notice to Respond to Missing Parts dated Aug. 13, 2013 for U.S. Appl. No. 13/948,094, 10 pages (PER-015-CIP-DIV-CON-1), Doc 4271.
Stuber—Response to Pre-Exam Formalities Notice, Power of Attorney and 3.73 Statement dated Nov. 13, 2013 for U.S. Appl. No. 13/948,094, 21 pages (PER-015-CIP-DIV-CON-1), Doc 4272.
USPTO—Updated Filing Receipt and Acceptance of Power of Attorney dated Mar. 11, 2014 for U.S. Appl. No. 13/948,094, 7 pages (PER-015-CIP-DIV-CON-1), Doc 4273.
USPTO—Restriction Requirement dated May 23, 2014 for U.S. Appl. No. 13/948,094, 13 pages (PER-015-CIP-DIV-CON-1), Doc 4274.
USPTO—Notice of Publication dated Jun. 19, 2014 for U.S. Appl. No. 13/948,094, 1 page (PER-015-CIP-DIV-CON-1), Doc 4275.
Stuber—Amendment dated Oct. 23, 2014 for U.S. Appl. No. 13/948,094, 35 pages (PER-015-CIP-DIV-CON-1), Doc 4276.
USPTO—Restriction Requirement dated Jan. 2, 3015 for U.S. Appl. No. 13/948,094, 18 pages (PER-015-CIP-DIV-CON-1), Doc 4277.
Stuber—Substitute Statement on Lieu of Oath or Declaration dated Feb. 26, 2015 for U.S. Appl. No. 13/948,094, 6 pages (PER-015-CIP-DIV-CON-1), Doc 4278.
Stuber—Response to Restriction Requirement and Amendment dated Mar. 2, 2015 for U.S. Appl. No. 13/948,094, 15 pages (PER-015-CIP-DIV-CON-1), Doc 4279.
USPTO—Office Action dated Mar. 27, 2015 for U.S. Appl. No. 13/948,094, 39 pages (PER-015-CIP-DIV-CON-1), Doc 4280.
Stuber—Amendment and Terminal Disclaimers dated Jul. 27, 2015 for U.S. Appl. No. 13/948,094, 35 pages (PER-015-CIP-DIV-CON-1), Doc 4281.
USPTO—Office Action dated Nov. 19, 2015 for U.S. Appl. No. 13/948,094, 45 pages (PER-015-CIP-DIV-CON-1), Doc 4282.
USPTO—Terminal Disclaimer Decisions dated Dec. 21, 2015 for U.S. Appl. No. 13/948,094, 1 page (PER-015-CIP-DIV-CON-1), Doc 4283.
Stuber—Issue Fee Payment dated Jan. 17, 2017 for U.S. Appl. No. 13/948,094, 5 pages (PER-015-CIP-DIV-CON-1), Doc 4287.
Stuber—Notice of Appeal dated May 18, 2016 for U.S. Appl. No. 13/948,094, 7 pages (PER-015-CIP-DIV-CON-1), Doc 4284.
Stuber—Request for Continued Examination and Amendment dated Jul. 18, 2016 for U.S. Appl. No. 13/948,094, 22 pages (PER-015-CIP-DIV-CON-1), Doc 4285.
USPTO—Notice of Allowance dated Oct. 17, 2016 for U.S. Appl. No. 13/948,094, 45 pages (PER-015-CIP-DIV-CON-1), Doc 4286.
USPTO—Issue Notification dated Mar. 8, 2017 for U.S. Appl. No. 13/948,094, 1 page (PER-015-CIP-DIV-CON-1), Doc 4288.
PSemi—3.73 Statement dated Aug. 31, 2018 for U.S. Appl. No. 13/948,094, 5 pages (PER-015-CIP-DIV-CON-1), Doc 4289.
Stuber—U.S. Appl. No. 15/419,898, filed Jan. 30, 2017, 136 pages (PER-015-CIP-DIV-CON-2), Doc 4290.
USPTO—Filing Receipt and Notice to File Missing Parts dated Feb. 8, 2017 for U.S. Appl. No. 15/419,898, 8 pages (PER-015-CIP-DIV-CON-2), Doc 4291.
Stuber—Response to Notice to File Missing Parts dated Apr. 10, 2017 for U.S. Appl. No. 15/419,898, 13 pages (PER-015-CIP-DIV-CON-2), Doc 4292.
USPTO—Updated Filing Receipt, Informational Notice and Acceptance of Power of Attorney dated May 11, 2017 for U.S. Appl. No. 15/419,898, 8 pages (PER-015-CIP-DIV-CON-2), Doc 4293.
Stuber—Preliminary Amendment dated Jul. 21, 2017 for U.S. Appl. No. 15/419,898, 16 pages (PER-015-CIP-DIV-CON-2), Doc 4294.
USPTO—Notice of Publication dated Aug. 17, 2017 for U.S. Appl. No. 15/419,898, 1 page (PER-015-CIP-DIV-CON-2), Doc 4295.
Stuber—Request to Change Applicant Name dated Mar. 4, 2018 for U.S. Appl. No. 15/419,898, 6 pages (PER-015-CIP-DIV-CON-2), Doc 4296.
USPTO—Updated Filing Receipt dated Mar. 6, 2018 for U.S. Appl. No. 15/419,898, 10 pages (PER-015-CIP-DIV-CON-2), Doc 4297.
USPTO—Office Action dated Jun. 4, 2018 for U.S. Appl. No. 15/419,898, 47 pages (PER-015-CIP-DIV-CON-2), Doc 4298.
Stuber—Amendment, Terminal Disclaimers and Change of Applicant dated Aug. 31, 2018 for U.S. Appl. No. 15/419,898, 55 pages (PER-015-CIP-DIV-CON-2), Doc 4299.
USPTO—Terminal Disclaimer Decision dated Sep. 3, 2018 for U.S. Appl. No. 15/419,898, 1 page (PER-015-CIP-DIV-CON-2), Doc 4300.
USPTO—Final Office Action dated Dec. 3, 2018 for U.S. Appl. No. 15/419,898, 30 pages (PER-015-CIP-DIV-CON-2), Doc 4301.
Stuber—Authorization to Act on Representative Capacity dated Feb. 11, 2019 for U.S. Appl. No. 15/419,898, 4 pages (PER-015-CIP-DIV-CON-2), Doc 4302.
USPTO—Applicant-Initialed Interview Summary dated Apr. 18, 2019 for U.S. Appl. No. 15/419,898, 1 page (PER-CIP-DIV-CON-2), Doc4303.
Stuber—Request for Continued Examination and Amendment dated May 2, 2019 for U.S. Appl. No. 15/419,898, 75 pages (PER-015-CIP-DIV-CON-2), Doc 4304.
USPTO—Acceptance of Power of Attorney dated May 20, 2019 for U.S. Appl. No. 15/419,898, 7 pages (PER-015-CIP-DIV-CON-2), Doc 4305.
USPTO—Notice of Allowance and Examiner-Initialed Interview Summary dated May 20, 2019 for U.S. Appl. No. 15/419,898, 35 pages (PER-015-CIP-DIV-CON-2), Doc 4326.
USPTO—Notice of Allowance and Notice of Allowability for U.S. Appl. No. 15/419,898 dated Sep. 30, 2019, 98 pages (PER-015-CIP-DIV-CON-2)—Doc 9006.
USPTO—Corrected Notice of Allowability dated Dec. 16, 2019 for U.S. Appl. No. 15/419,898, 4 pages (PER-015-CIP-DIV-CON-2), Doc 9030.
Stuber—Issue Fee Payment and 312 Amendment filed Dec. 27, 2019 for U.S. Appl. No. 15/419,898, 14 pages, (PER-015-CIP-DIV-CON-2), Doc 9031.
USPTO—Corrected Notice of Allowability dated Jan. 21, 2020 for U.S. Appl. No. 15/419,898, 9 pages, (PER-015-CIP-DIV-CON-2}, Doc 9074.
USPTO—Corrected Notice of Allowability dated Mar. 5, 2020 for U.S. Appl. No. 15/419,898, 8 pages, (PER-015-CIP-DIV-CON-2), Doc 9098.
USPTO—Corrected Notice of Allowance dated Mar. 13, 2020 for U.S. Appl. No. 15/419,898, 5 pages, (PER-015-CIP-DIV-CON-2}, Doc 9128.
USPTO—Issue Fee Payment, Corrected Application Data Sheet and 312 Amendment filed Apr. 21, 2020 for U.S. Appl. No. 15/419,898, 32 pages, (PER-015-CIP-DIV-CON-2), Doc 9129.
USPTO—Supplemental Notice of Allowability dated May 13, 2020 for U.S. Appl. No. 15/419,898, 9 pages, (PER-015-CIP-DIV-CON-2), Doc 9165.

(56) References Cited

OTHER PUBLICATIONS

USPTO—Corrected Notice of Allowability dated Jul. 9, 2020 for U.S. Appl. No. 15/419,898, 8 pages, (PER-015-CIP-DIV-CON-2), Doc 9210.
USPTO—Notice of Allowance and Allowability dated Aug. 27, 2020 for U.S. Appl. No. 15/419,898, 17 pages, (PER-015-CIP-DIV-CON-2), Doc 9269.
Stuber—Response to Notice of Allowance filed Aug. 27, 2020 for U.S. Appl. No. 15/419,898, 6 pages, (PER-015-CIP-DIV-CON-2), Doc 9270.
USPTO—Issue Notification dated Oct. 7, 2020 for U.S. Appl. No. 15/419,898, 1 page, (PER-015-CIP-DIV-CON-2), Doc 9271.
Stuber—U.S. Appl. No. 16/739,081, filed Jan. 9, 2020, 142 pages, (PER-015-CIP-DIV-CON-3), Doc 9065.
USPTO—Filing Receipt dated Jan. 31, 2020 for U.S. Appl. No. 16/739,081, 4 pages (PER-015-CIP-DIV-CON-3), Doc 9086.
USPTO—Notice of Missing Parts dated Jan. 31, 2020 for U.S. Appl. No. 16/739,081, 2 pages, (PER-015-CIP-DIV-CON-3), Doc 9087.
Stuber—Response to Notice of Missing Parts and Preliminary Amendment filed Jul. 9, 2020 for U.S. Appl. No. 16/739,081, 21 pages, (PER-015-CIP-DIV-CON-3), Doc 9211.
USPTO—Office Action dated Nov. 10, 2020 for U.S. Appl. No. 16/739,081, 16 pages, (PER-015-CIP-DIV-CON-3), Doc 9272.
Stuber—Reissue U.S. Appl. No. 16/710,998, filed Dec. 11, 2019, 103 pages (PER-015-CIP-DIV-RE), Doc 9023.
USPTO—Filing Receipt dated Dec. 17, 2019 for U.S. Appl. No. 16/710,998, 4 pages, (PER-015-CIP-DIV-RE), Doc 9032.
USPTO—Notice to File Missing Parts dated Dec. 19, 2019 for U.S. Appl. No. 16/710,998, 2 pages (PER-015-CIP-DIV-RE), Doc 9033.
USPTO—Updated Filing Receipt dated Dec. 19, 2019 for U.S. Appl. No. 16/710,998, 4 pages (PER-015-CIP-DIV-RE), Doc 9072.
USPTO—Response to Notice to File Missing Parts filed Jan. 7, 2020 for U.S. Appl. No. 16/710,998, 6 pages (PER-015-CIP-DIV-RE), Doc 9079.
USPTO—Updated Filing Receipt dated Jan. 14, 2020 for U.S. Appl. No. 16/710,998, 4 pages (PER-015-CIP-DIV-RE), Doc 9080.
Brindle—U.S. Appl. No. 11/484,370, filed Jul. 10, 2006, 140 pages (PER-016-PAP), Doc 4000.
USPTO—Notice to File Missing Parts for U.S. Appl. No. 11/484,370 dated Aug. 2, 2006, 2 pages (PER-016-PAP), Doc 4001.
USPTO—Filing Receipt for U.S. Appl. No. 11/484,370 dated Aug. 2, 2006, 3 pages (PER-016-PAP), Doc 4002.
Brindle—Response to Notice to File Missing Parts for U.S. Appl. No. 11/484,370 dated Oct. 6, 2006 (PER-016-PAP), Doc 4003.
USPTO—Notice of Publication for U.S. Appl. No. 11/484,370 dated Jan. 25, 2007, 1 page (PER-016-PAP), Doc 4004.
USPTO—Restriction Requirement dated Sep. 19, 2008 for U.S. Appl. No. 11/484,370, 11 pages (PER-016-PAP), Doc 4005.
Brindle—Response to Restriction Requirement dated Jan. 26, 2009 for U.S. Appl. No. 11/484,370, 7 pages (PER-016-PAP), Doc 4006.
USPTO—Restriction Requirement dated Apr. 23, 2009 for U.S. Appl. No. 11/484,370, 15 pages (PER-016-PAP), Doc 4007.
Brindle—Response to Restriction Requirement dated Aug. 28, 2009 for U.S. Appl. No. 11/484,370, 7 pages (PER-016-PAP), Doc 4008.
USPTO—Office Action dated Jan. 6, 2010 for U.S. Appl. No. 11/484,370, 56 pages (PER-016-PAP), Doc 4009.
Brindle—Amendment filed Jul. 12, 2010 for U.S. Appl. No. 11/484,370, 24 pages (PER-016-PAP), Doc 4010.
USPTO—Notice of Allowance dated Nov. 12, 2010 for U.S. Appl. No. 11/484,370, 32 pages (PER-016-PAP), Doc 4011.
USPTO—Issue Notification dated Mar. 2, 2011 for U.S. Appl. No. 11/484,370, 1 page (PER-016-PAP), Doc 4012.
USPTO—Report on the Filing or Determination of an Action Regarding a Patent or Trademark dated Jun. 11, 2012 for U.S. Appl. No. 11/484,370, 1 page (PER-016-PAP), Doc 4013.
USPTO—Report on the Filing or Determination of an Action Regarding a Patent or Trademark dated Jul. 11, 2012 for U.S. Appl. No. 11/484,370, 13 pages (PER-016-PAP), Doc 4014.
USPTO—Report on the Filing or Determination of an Action Regarding a Patent or Trademark dated Feb. 21, 2013 for U.S. Appl. No. 11/484,370, 1 page (PER-016-PAP), Doc 4015.
USPTO—Report on the Filing or Determination of an Action Regarding a Patent or Trademark dated Apr. 15, 2013 for U.S. Appl. No. 11/484,370, 1 page (PER-016-PAP), Doc 4016.
USPTO—Report on the Filing or Determination of an Action Regarding a Patent or Trademark advising of Dismissal dated Oct. 14, 2014 for U.S. Appl. No. 11/484,370, 1 page (PER-016-PAP), Doc 4017.
Brindle—U.S. Appl. No. 13/053,211, filed Mar. 22, 2011, 135 pages (PER-016-DIV), Doc 4018.
USPTO—Filing Receipt for U.S. Appl. No. 13/053,211 dated Apr. 8, 2011, 4 pages (PER-016-DIV), Doc 4019.
USPTO—Notice of Publication for U.S. Appl. No. 13/053,211 dated Jul. 14, 2011, 1 page (PER-016-DIV), Doc 4020.
USPTO—Corrected Filing Receipt dated Nov. 14, 2011 for U.S. Appl. No. 13/053,211, 3 pages (PER-016-DIV), Doc 4021.
USPTO—Notice of Allowance dated Nov. 17, 2011 for U.S. Appl. No. 13/053,211, 54 pages (PER-016-DIV), Doc 4022.
USPTO—Issue Notification dated Feb. 15, 2012 for U.S. Appl. No. 13/053,211, 5 pages (PER-016-DIV), Doc 4023.
Brindle—U.S. Appl. No. 13/412,529, filed Mar. 5, 2012, 123 pages (PER-016-DIV-CON), Doc 4024.
USPTO—Filing Receipt for U.S. Appl. No. 13/412,529 dated Mar. 23, 2012, 4 pages (PER-016-DIV-CON), Doc 4025.
USPTO—Office Action dated Apr. 11, 2012 for U.S. Appl. No. 13/412,529, 15 pages (PER-016-DIV-CON), Doc 4026.
USPTO—Notice of Publication dated Jul. 5, 2012 for U.S. Appl. No. 13/412,529, 1 page (PER-016-DIV-CON), Doc 4027.
Brindle—Response to Office Action dated Oct. 11, 2012 for U.S. Appl. No. 13/412,529, 22 pages (PER-016-DIV-CON), Doc 4028.
Brindle—Response to Office Action and Terminal Disclaimers dated Dec. 19, 2012 for U.S. Appl. No. 13/412,529, 25 pages (PER-016-DIV-CON), Doc 4029.
USPTO—Terminal Disclaimer Review Decision dated Dec. 27, 2012 for U.S. Appl. No. 13/412,529, 1 page (PER-016-DIV-CON), Doc 4030.
USPTO—Notice of Allowance dated Jan. 17, 2013 for U.S. Appl. No. 13/412,529, 243 pages (PER-016-DIV-CON), Doc 4031.
Brindle—Issue Fee Payment dated Feb. 8, 2013 for U.S. Appl. No. 13/412,529, 9 pages (PER-016-DIV-CON), Doc 4032.
USPTO—Notice of Allowance dated Feb. 8, 2013 for U.S. Appl. No. 13/412,529, 21 pages (PER-016-DIV-CON), Doc 4033.
USPTO—Issue Notification for U.S. Appl. No. 13/412,529 dated Mar. 6, 2013, 1 page (PER-016-DIV-CON), Doc 4034.
US District Court—Report on the Filing of an Action Regarding U.S. Pat. No. 8,405,147 dated Mar. 26, 2013 for U.S. Appl. No. 13/412,529, 1 page (PER-016-DIV-CON), Doc 4035.
US District Court—Order Termination of Proceeding dated Jul. 29, 2014 for U.S. Appl. No. 13/412,529, 3 pages (PER-016-DIV-CON), Doc4036.
US District Court—Report on Determination of an Action dated Sep. 5, 2014 for U.S. Appl. No. 13/412,529, 1 page (PER-016-DIV-CON), Doc 4037.
Brindle—U.S. Appl. No. 13/850,251, filed Mar. 25, 2013, 124 pages (PER-016-DIV-CON-2), Doc 4038.
USPTO—Filing Receipt, Fee Sheet and Notice of Missing Parts dated May 15, 2013 for U.S. Appl. No. 13/850,251, 6 pages (PER-016-DIV-CON-2), Doc 4039.
Brindle—Response to Pre-Exam Formalities Notice dated Jul. 11, 2013 for U.S. Appl. No. 13/850,251, 18 pages (PER-016-DIV-CON-2), Doc 4040.
Brindle—Preliminary Amendment dated Jul. 19, 2013 for U.S. Appl. No. 13/850,251, 28 pages (PER-016-DIV-CON-2), Doc 4041.
USPTO—Updated Filing Receipt dated Aug. 1, 2013 for U.S. Appl. No. 13/850,251, 6 pages (PER-016-DIV-CON-2), Doc 4042.
USPTO—Office Action dated Oct. 2, 2013 for U.S. Appl. No. 13/850,251, 38 pages (PER-016-DIV-CON-2), Doc 4043.
USPTO—Notice of Publication for U.S. Appl. No. 13/850,251 dated Nov. 7, 2013, 1 page (PER-016-DIV-CON-2), Doc 4044.

(56) References Cited

OTHER PUBLICATIONS

Brindle—Amendment and Terminal Disclaimers for U.S. Appl. No. 13/850,251 dated Dec. 26, 2013, 32 pages (PER-016-DIV-CON-2), Doc 4045.
USPTO—Terminal Disclaimer Decisions dated Jan. 25, 2014 for U.S. Appl. No. 13/850,251, 1 page (PER-016-DIV-CON-2), Doc 4046.
Brindle—Notification of Loss of Small Entity Status dated Mar. 11, 2014 for U.S. Appl. No. 13/850,251, 1 page (PER-016-DIV-CON-2), Doc 4047.
USPTO—Office Action dated Apr. 2, 2014 for U.S. Appl. No. 13/850,251, 24 pages (PER-016-DIV-CON-2), Doc 4048.
Brindle—Amendment dated Oct. 2, 2014 for U.S. Appl. No. 13/850,251, 20 pages (PER-016-DIV-CON-2), Doc 4049.
Brindle—Amendment dated Oct. 2, 2014 for U.S. Appl. No. 13/850,251, 19 pages—2nd filed Oct. 2, 2014 (PER-016-DIV-CON-2), Doc 4050.
USPTO—Final Office Action dated Jan. 22, 2015 for U.S. Appl. No. 13/850,251, 305 pages (PER-016-DIV-CON-2), Doc 4051.
Brindle—Response to Final Office Action and Terminal Disclaimers dated Mar. 23, 2015 for U.S. Appl. No. 13/850,251, 24 pages (PER-016-DIV-CON-2), Doc 4052.
USPTO—Terminal Disclaimer Decision dated Mar. 30, 2015 for U.S. Appl. No. 13/850,251, 1 page (PER-016-DIV-CON-2), Doc 4053.
USPTO—Notice of Allowance dated Apr. 22, 2015 for U.S. Appl. No. 13/850,251, 37 pages (PER-016-DIV-CON-2), Doc 4054.
USPTO—Corrected Notice of Allowability dated Jun. 18, 2015 for U.S. Appl. No. 13/850,251, 9 pages (PER-016-DIV-CON-2), Doc 4055.
USPTO—Office Communication dated Jul. 9, 2015 for U.S. Appl. No. 13/850,251, 32 pages (PER-016-DIV-CON-2), Doc 4056.
USPTO—Office Communication dated Jul. 16, 2015 for U.S. Appl. No. 13/850,251, 6 pages (PER-016-DIV-CON-2), Doc 4057.
Brindle—Issue Fee Payment dated Jul. 22, 2015 for U.S. Appl. No. 13/850,251, 8 pages (PER-016-DIV-CON-2), Doc 4058.
USPTO—Issue Notification dated Aug. 19, 2015 for U.S. Appl. No. 13/850,251, 10 pages (PER-016-DIV-CON-2), Doc 4059.
Peregrine—Notice of Loss of Small Entity Status dated Jul. 31, 2017 for U.S. Appl. No. 13/850,251, 1 page (PER-016-DIV-CON-1), Doc 4060.
Brindle—Patent application for U.S. Appl. No. 14/845,154, filed Sep. 3, 2015, 124 pages (PER-016-DIV-CON-3), Doc 4061.
USPTO—Filing Receipt and Notice to File Missing Parts dated Sep. 22, 2015 for U.S. Appl. No. 14/845,154, 6 pages (PER-016-DIV-CON-3), Doc 4062.
Brindle—Response to Pre-Exam Formalities Notice dated Nov. 23, 2015 for U.S. Appl. No. 14/845,154, 17 pages (PER-016-DIV-CON-3), Doc 4063.
USPTO—Updated Filing Receipt, Informational Notice, and Acceptance of Power of Attorney dated Mar. 23, 2016 for U.S. Appl. No. 14/845,154, 7 pages (PER-016-DIV-CON-3), Doc 4064.
USPTO—Office Action dated Jun. 1, 2016 for U.S. Appl. No. 14/845,154, 13 pages (PER-016-DIV-CON-3), Doc 4065.
USPTO—Notice of Publication dated Jun. 30, 2016 for U.S. Appl. No. 14/845,154, 1 page (PER-016-DIV-CON-3), Doc 4066.
Brindle—Amendment dated Oct. 28, 2016 for U.S. Appl. No. 14/845,154, 20 pages (PER-016-DIV-CON-3), Doc 4067.
USPTO—Final Office Action dated Mar. 8, 2017 for U.S. Appl. No. 14/845,154, 33 pages (PER-016-DIV-CON-3), Doc 4068.
Brindle—Amendment and Terminal Disclaimer dated Mar. 24, 2017 for U.S. Appl. No. 14/845,154, 11 pages (PER-016-DIV-CON-3), Doc 4069.
USPTO—Terminal Disclaimer Decision dated Mar. 30, 2017 for U.S. Appl. No. 14/845,154, 1 page (PER-016-DIV-CON-3), Doc 4070.
USPTO—Notice of Allowance dated Apr. 10, 2017 for U.S. Appl. No. 14/845,154, 21 pages (PER-016-DIV-CON-3), Doc 4071.

Brindle—Correction of Inventorship and Oath/Declarations filed Jun. 15, 2017 for U.S. Appl. No. 14/845,154, 21 pages (PER-016-DIV-CON-3), Doc 4072.
USPTO—Notice of Acceptance of Inventorship Correction and Updated Filing Receipt dated Jun. 22, 2017 for U.S. Appl. No. 14/845,154, 5 pages (PER-016-DIV-CON-3), Doc 4073.
USPTO—Notice of Allowance dated Jun. 28, 2017 for U.S. Appl. No. 14/845,154, 10 pages (PER-016-DIV-CON-3), Doc 4074.
Brindle—Request for Continued Examination dated Jul. 7, 2017 for U.S. Appl. No. 14/845,154, 3 pages (PER-016-DIV-CON-3), Doc 4075.
USPTO—Notice of Allowance dated Aug. 9, 2017 for U.S. Appl. No. 14/845,154, 20 pages (PER-016-DIV-CON-3), Doc 4076.
Brindle—Issue Fee Payment dated Aug. 24, 2017 for U.S. Appl. No. 14/845,154, 1 page (PER-016-DIV-CON-3), Doc 4077.
USPTO—Corrected Notice of Allowability dated Sep. 6, 2017 for U.S. Appl. No. 14/845,154, 10 pages (PER-016-DIV-CON-3), Doc 4078.
USPTO—Issue Notification dated Sep.13, 2017 for U.S. Appl. No. 14/845,154, 1 page (PER-016-DIV-CON-3), Doc 4079.
Brindle—U.S. Appl. No. 15/707,970, filed Sep. 18, 2017, 149 pages (PER-016-DIV-CON-4), Doc 4080.
USPTO—Filing Receipt and Notice to File Missing Parts dated Oct. 16, 2017 for U.S. Appl. No. 15/707,970, 7 pages (PER-016-DIV-CON-4), Doc 4081.
Brindle—Response to Request to File Missing Parts dated Dec. 4, 2017 for U.S. Appl. No. 15/707,970, 13 pages (PER-016-DIV-CON-4), Doc 4082.
Brindle—Preliminary Amendment dated Dec. 7, 2017 for U.S. Appl. No. 15/707,970, 14 pages (PER-016-DIV-CON-4), Doc 4083.
USPTO—Updated Filing Receipt and Informational Notice dated Dec. 17, 2017 for U.S. Appl. No. 15/707,970, 7 pages (PER-016-DIV-CON-4), Doc 4084.
USPTO—Office Action dated Jan. 12, 2018 for U.S. Appl. No. 15/707,970, 29 pages (PER-016-DIV-CON-4), Doc 4085.
Peregrine—Request to Change Applicant and Power of Attorney dated Jan. 26, 2018 for U.S. Appl. No. 15/707,970, 19 pages (PER-016-DIV-CON-4), Doc 4086.
Peregrine—Amendment dated Feb. 1, 2018 for U.S. Appl. No. 15/707,970, 15 pages (PER-016-DIV-CON-4), Doc 4087.
Peregrine—Terminal Disclaimer dated Feb. 1, 2018 for U.S. Appl. No. 15/707,970, 2 pages (PER-016-DIV-CON), Doc 4088.
USPTO—Corrected Filing Receipt and Acceptance of Power Attorney dated Feb. 1, 2018 for U.S. Appl. No. 15/707,970, 5 pages (PER-016-DIV-CON-4), Doc 4089.
PSemi—Request for Change of Applicant dated Feb. 26, 2018 for U.S. Appl. No. 15/707,970, 8 pages (PER-016-DIV-CON-4), Doc 4090.
USPTO—Corrected Filing Receipt dated Feb. 28, 2018 for U.S. Appl. No. 15/707,970, 4 pages (PER-016-DIV-CON), Doc 4091.
PSemi—Request for Correction of Name Applicant dated Mar. 1, 2018 for U.S. Appl. No. 15/707,970, 8 pages (PER-016-DIV-CON-4), Doc 4092.
PSemi—Terminal Disclaimer filed Mar. 6, 2018 for U.S. Appl. No. 15/707,970, 4 pages (PER-016-DIV-CON-4), Doc 4093.
USPTO—Corrected Filing Receipt dated Mar. 7, 2018 for U.S. Appl. No. 15/707,970, 4 pages (PER-016-DIV-CON-4), Doc 4094.
USPTO—Terminal Disclaimer Decision filed Mar. 8, 2018 for U.S. Appl. No. 15/707,970, 1 page (PER-016-DIV-CON-4), Doc 4095.
USPTO—Notice of Publication dated Mar. 22, 2018 for U.S. Appl. No. 15/707,970, 1 page (PER-016-DIV-CON-4), Doc 4096.
USPTO—Notice of Allowance dated Apr. 2, 2018 for U.S. Appl. No. 15/707,970, 48 pages (PER-016-DIV-CON-4), Doc 4097.
PSemi—Request for Continued Examination dated May 5, 2018 for U.S. Appl. No. 15/707,970, 3 pages (PER-016-DIV-CON-4), Doc 4098.
USPTO—Notice of Allowance dated Jul. 2, 2018 for U.S. Appl. No. 15/707,970, 34 pages (PER-016-DIV-CON-4), Doc 4099.
PSemi—Request to Correct Inventorship dated Jul. 25, 2018 for U.S. Appl. No. 15/707,970, 19 pages (PER-016-DIV-CON-4), Doc 4100.
PSemi—Issue Fee Payment dated Aug. 1, 2018 for U.S. Appl. No. 15/707,970, 6 pages (PER-016-DIV-CON-4), Doc 4101.

(56) References Cited

OTHER PUBLICATIONS

USPTO—Notice of Improper Submission of Request Under 37 CFR 1.48(a) dated Aug. 2, 2018 for U.S. Appl. No. 15/707,970, 11 pages (PER-016-DIV-CON-4), Doc4102.
USPTO—Corrected Notice of Allowability dated Aug. 16, 2018 for U.S. Appl. No. 15/707,970, 3 pages (PER-016-DIV-CON-4), Doc 4103.
PSemi—Petition (and Automatic Grant) for Withdraw from Issue After Payment of Issue Fee dated Aug. 22, 2018 for U.S. Appl. No. 15/707,970, 13 pages (PER-016-DIV-CON-4), Doc 4104.
PSemi—Request for Continued Examination dated Aug. 22, 2018 for U.S. Appl. No. 15/707,970, 3 pages (PER-016-DIV-CON-4), Doc 4105.
USPTO—Acceptance of Request to Correct Inventorship and Updated Filing Receipt dated Aug. 24, 2018 for U.S. Appl. No. 15/707,970, 22 pages (PER-016-DIV-CON-4), Doc 4106.
USPTO—Notice of Allowance dated Sep. 28, 2018 for U.S. Appl. No. 15/707,970, 44 pages (PER-016-DIV-CON-4), Doc 4107.
PSemi—Issue Fee Payment dated Oct. 17, 2018 for U.S. Appl. No. 15/707,970, 4 pages (PER—016-DIV-CON-4), Doc 4108.
USPTO—Issue Notification dated Nov. 20, 2018 for U.S. Appl. No. 15/707,970, 1 page (PER-016-DIV-CON-4), Doc 4109.
Brindle—U.S. Appl. No. 16/738,787, filed Jan. 9, 2020, 82 pages, (PER-016-DIV-CON-4-RE), Doc 9067.
USPTO—Filing Receipt dated Jan. 21, 2020 for U.S. Appl. No. 16/738,787, 4 pages (PER-016-DIV-CON-4-RE), Doc 9075.
Brindle—U.S. Appl. No. 16/054,959, filed Aug. 3, 2018, 151 pages (PER-016-DIV-CON-5), Doc 4197.
USPTO—Filing Receipt and Notice to File Missing Parts dated Aug. 23, 2018 for U.S. Appl. No. 16/054,959, 8 pages (PER-016-DIV-CON-5), Doc 4198.
Brindle—Response to Pre-Exam Formalities Notice dated Oct. 23, 2018 for U.S. Appl. No. 16/054,959, 13 paQes (PER-016-DIV-CON-5), Doc 4199.
Brindle—Amendment dated Dec. 11, 2018 for U.S. Appl. No. 16/054,959, 13 pages (PER-016-DIV-CON-5), Doc 4200.
USPTO—Updated Filing Receipt and Acceptance of Power of Attorney dated Dec. 14, 2018 for U.S. Appl. No. 16/054,959, 7 pages (PER-016-DIV-CON-5), Doc 4201.
USPTO—Notice of Publication dated Mar. 21, 2019 for U.S. Appl. No. 16/054,959, 1 page (PER-016-DIV-CON-5), Doc 4205.
PSemi—Power of Attorney dated May 16, 2019 for U.S. Appl. No. 15/054,959, 4 pages (PER-016-DIV-CON-5), Doc 4202.
USPTO—Acceptance of Power of Attorney dated May 20, 2019 for U.S. Appl. No. 16/054,959, 2 pages (PER-016-DIV-CON-5), Doc 4203.
USPTO—Non-final Office Action dated Jun. 7, 2019 for U.S. Appl. No. 16/054,959, 31 pages (PER-016-DIV-CON-5), Doc 4204.
Brindle—Response to Non-final Office Action dated Aug. 30, 2019 for U.S. Appl. No. 16/054,959, 14 pages (PER-016-DIV-CON-5), Doc 9036.
Brindle—Terminal Disclaimer filed Aug. 30, 2019 for U.S. Appl. No. 16/054,959, 5 pages (PER-016-DIV-CON-5), Doc 9037.
USPTO—Notice of Allowance and Notice of Allowability for U.S. Appl. No. 16/054,959 dated Sep. 23, 2019, 131 pages (PER-016-DIV-CON-5)—Doc 9007.
Brindle—312 Amendment filed Oct. 15, 2019 for U.S. Appl. No. 16/054,959, 13 pages (PER-016-DIV-CON-5), Doc 9038.
Brindle—Request to Correct Inventorship filed Dec. 20, 2019 for U.S. Appl. No. 16/054,959, 17 pages (PER-016-DIV-CON-5), Doc 9039.
Brindle—Issue Fee Payment filed Dec. 23, 2019 for U.S. Appl. No. 16/054,959, 3 pages (PER-016-DIV-CON-5), Doc 9040.
USPTO—Acceptance of Inventorship Change dated Dec. 26, 2019 for U.S. Appl. No. 16/054,959, 1 page (PER-016-DIV-CON-5), Doc 9041.
USPTO—Updated Filing Receipt dated Dec. 26, 2019 for U.S. Appl. No. 16/054,959, 4 page (PER-016-DIV-CON-5), Doc 9064.

USPTO—Corrected Notice of Allowability dated Dec. 30, 2019 for U.S. Appl. No. 16/054,959, 4 pages (PER-016-DIV-CON-5), Doc 9071.
USPTO—Corrected Notice of Allowability dated Jan. 24, 2020 for U.S. Appl. No. 16/054,959, 11 pages (PER-016-DIV-CON-5), Doc 9076.
USPTO—Office Communication dated Feb. 4, 2020 for U.S. Appl. No. 16/054,959, 4 pages (PER-016-DIV-CON-5), Doc 9090.
USPTO—Issue Notification dated Feb. 12, 2020 for U.S. Appl. No. 16/054,959, 1 page (PER-016-DIV-CON-5), Doc 9092.
USPTO—Corrected Notice of Allowability dated Mar. 13, 2020 for U.S. Appl. No. 16/054,959, 7 pages (PER-016-DIV-CON-5), Doc 9132.
USPTO—Issue Notification dated Mar. 25, 2020 for U.S. Appl. No. 16/054,959, 1 page (PER-016-DIV-CON-5), Doc 9133.
Brindle—e-Terminal Disclaimer filed Apr. 20, 2020 for U.S. Appl. No. 16/054,959, 5 pages (PER-016-DIV-CON-5), Doc 9134.
Brindle—U.S. Appl. No. 16/377,114, filed Apr. 5, 2019, 161 pages (PER-016-DIV-CON-6), Doc 4211.
Brindle—Authorization to Act in Representative Capacity dated Apr. 16, 2019 for U.S. Appl. No. 16/377,114, 4 pages (PER-016-CIP-CON-6), Doc 4212.
USPTO—Filing Receipt and Decision Granting Request for Track One dated Apr. 23, 2019 for U.S. Appl. No. 16/377,114, 8 pages (PER-016-CIP-CON-6), Doc 4213.
USPTO—Office Action dated May 24, 2019 for U.S. Appl. No. 16/377,114, 13 pages (PER-016-DIV-CON-6), Doc 4214.
PSemi—Power of Attorney dated May 29, 2019 for U.S. Appl. No. 16/377,114, 4 pages (PER-016-DIV-CON-6), Doc 4215.
USPTO—Acceptance of Power of Attorney dated May 30, 2019 for U.S. Appl. No. 16/377,114, 1 page (PER-016-DIV-CON-6), Doc 4216.
Brindle—Response to Office Action filed Aug. 26, 2019 for U.S. Appl. No. 16/377,114, 14 pages (PER-016-DIV-CON-6), Doc 9042.
Brindle—Terminal Disclaimer filed Aug. 26, 2019 for U.S. Appl. No. 16/377,114, 5 pages (PER-016-DIV-CON-6), Doc 9043.
USPTO—Notice of Allowance and Notice of Allowability for U.S. Appl. No. 16/377,114 dated Oct. 7, 2019, 111 pages (PER-016-DIV-CON-6)—Doc 9008.
Brindle—Request to Correct Inventorship filed Dec. 20, 2019 for U.S. Appl. No. 16/377,114, 17 pages (PER-016-DIV-CON-6), Doc 9044.
USPTO—Corrected Notice of Allowability dated Dec. 31, 2019 for U.S. Appl. No. 16/377,114, 4 pages (PER-016-DIV-CON-6), Doc 9045.
USPTO—Acceptance of Correction of Inventorship dated Dec. 27, 2019 for U.S. Appl. No. 16/377,114, 1 page (PER-016-DIV-CON-6), Doc 9046.
USPTO—Updated Filing Receipt dated Dec. 27, 2019 for U.S. Appl. No. 16/377,114, 4 pages (PER-016-DIV-CON-6), Doc 9063.
Brindle—Issue Fee Payment and 312 Amendment filed Jan. 6, 2020 for U.S. Appl. No. 16/377,114, 14 pages (PER-016-DIV-CON-6), Doc 9058.
USPTO—Corrected Notice of Allowability dated Jan. 24, 2020 for U.S. Appl. No. 16/377,114, 16 pages (PER-016-DIV-CON-6), Doc 9077.
USPTO—Issue Notification dated Feb. 19, 2020 for U.S. Appl. No. 16/377,114, 1 page (PER-016-DIV-CON-6), Doc 9094.
USPTO—Corrected Notice of Allowability dated Mar. 13, 2020 for U.S. Appl. No. 16/377,114, 7 pages (PER-016-DIV-CON-6), Doc 9172.
USPTO—Issue Notification dated Apr. 1, 2020 for U.S. Appl. No. 16/377,114, 1 page (PER-016-DIV-CON-6), Doc 9173.
USPTO—Notice of Allowability dated May 1, 2020 for U.S. Appl. No. 16/377,114, 8 pages (PER-016-DIV-CON-6), Doc 9174.
Brindle—e-Terminal Disclaimer filed May 11, 2020 for U.S. Appl. No. 16/377,114, 5 pages (PER-016-DIV-CON-6), Doc 9175.
USPTO—Issue Notification dated May 20, 2020 for U.S. Appl. No. 16/377,114, 1 page (PER-016-DIV-CON-6), Doc 9176.
PSemi—U.S. Appl. No. 16/590,262, filed Oct. 1, 2019, 92 pages (PER-016-DIV-CON-7)—Doc 9009.
USPTO—Filing Receipt dated Oct. 18, 2019 for U.S. Appl. No. 16/590,262, 4 pages, (PER-016-DIV-CON-7), Doc 9019.

(56) References Cited

OTHER PUBLICATIONS

USPTO—Office Action dated Nov. 20, 2019 for U.S. Appl. No. 16/590,262, 7 pages (PER-016-DIV-CON-7), Doc 9010.
USPTO—Notice of Publication dated Jan. 30, 2020 for U.S. Appl. No. 16/590,262, 1 page (PER-016-DIV-CON-7), Doc 9088.
Brindle—e-Terminal Disclaimer filed Apr. 20, 2020 for U.S. Appl. No. 16/590,262, 5 pages (PER-016-DIV-CON-7), Doc 9135.
Brindle—Response to Office Action filed Apr. 20, 2020 for U.S. Appl. No. 16/590,262, 13 pages (PER-016-DIV-CON-7), Doc 9136.
USPTO—Notice of Allowance and Allowability dated May 20, 2020 for U.S. Appl. No. 16/590,262, 105 pages (PER-016-DIV-CON-7), Doc 9177.
Brindle—Amendment Under 37 CFR 1.312 filed May 21, 2020 for U.S. Appl. No. 16/590,262, 13 pages (PER-016-DIV-CON-7), Doc 9178.
Brindle—Issue Fee filed Jun. 9, 2020 for U.S. Appl. No. 16/590,262, 6 pages (PER-016-DIV-CON-7), Doc 9179.
USPTO—Corrected notice of Allowability dated Jul. 1, 2020 for U.S. Appl. No. 16/590,262, 8 pages (PER-016-DIV-CON-7), Doc 9212.
USPTO—Corrected Notice of Allowability dated Jul. 23, 2020 for U.S. Appl. No. 16/590,262, 6 pages (PER-016-DIV-CON-7), Doc 9234.
USPTO—Corrected Notice of Allowability dated Aug. 5, 2020 for U.S. Appl. No. 16/590,262, 4 pages (PER-016-DIV-CON-7), Doc 9245.
USPTO—Corrected Notice of Allowability dated Aug. 21, 2020 for U.S. Appl. No. 16/590,262, 5 pages (PER-016-DIV-CON-7), Doc 9273.
USPTO—Issue Notification dated Sep. 16, 2020 for U.S. Appl. No. 16/590,262, 1 page (PER-016-DIV-CON-7), Doc 9274.
PSemi—U.S. Appl. No. 16/590,292, filed Oct. 21, 2019, 143 pages (PER-016-DIV-CON-8)—Doc 9011.
USPTO—Filing Receipt dated Oct. 22, 2019 for U.S. Appl. No. 16/590,292, 4 pages, (PER-016-DIV-CON-8), Doc 9020.
USPTO—Office Action dated Nov. 20, 2019 for U.S. Appl. No. 16/590,292, 7 pages (PER-016-DIV-CON-8), Doc 9012.
USPTO—Notice of Publication dated Jan. 30, 2020 for U.S. Appl. No. 16/590,292, 1 page (PER-016-DIV-CON-8), Doc 9089.
Brindle—e-Terminal Disclosure filed Apr. 20, 2020 for U.S. Appl. No. 16/590,292, 1 page (PER-016-DIV-CON-8), Doc 9110.
Brindle—Response to Office Action filed Apr. 20, 2020 for U.S. Appl. No. 16/590,292, 11 pages (PER-016-DIV-CON-8), Doc 9115.
Brindle—eTerminal Disclaimer filed May 15, 2020 for U.S. Appl. No. 16/590,292, 5 pages (PER-016-DIV-CON-8), Doc 9180.
USPTO—Notice of Allowance and Allowability dated May 28, 2020 for U.S. Appl. No. 16/590,292, 104 pages (PER-016-DIV-CON-8), Doc 9181.
Brindle—Issue Fee Payment and 312 Amendment filed Jun. 10, 2020 for U.S. Appl. No. 16/590,292, 12 pages (PER-016-DIV-CON-8), Doc 9182.
USPTO—Corrected Notice of Allowability dated Jul. 2, 2020 for U.S. Appl. No. 16/590,292, 7 paQes (PER-016-DIV-CON-8), Doc 9213.
USPTO—Notice of Allowance and Allowability dated Aug. 5, 2020 for U.S. Appl. No. 16/590,292, 46 pages (PER-016-DIV-CON-8), Doc 9244.
Brindle—Response to Notice of Allowance filed Aug. 6, 2020 for U.S. Appl. No. 16/590,292, 6 pages (PER-016-DIV-CON-8), Doc 9240.
USPTO—Corrected Notice of Allowability dated Aug. 21, 2020 for U.S. Appl. No. 16/590,292, 5 pages (PER-016-DIV-CON-8), Doc 9275.
USPTO—Issue Notification dated Aug. 21, 2020 for U.S. Appl. No. 16/590,292, 1 page (PER-016-DIV-CON-8), Doc 9276.
PSemi—U.S. Appl. No. 16/671,967, filed Nov. 1, 2019, 143 pages (PER-016-DIV-CON-9)—Doc 9013.
USPTO—Filing Receipt dated Nov. 20, 2019 for U.S. Appl. No. 16/671,967, 4 pages, (PER-016-DIV-CON-9), Doc 9021.
USPTO—Office Action dated Dec. 31, 2019 for U.S. Appl. No. 16/671,967, 7 pages, (PER-016-DIV-CON-9), Doc 9062.
USPTO—Notice of Publication dated Feb. 27, 2020 for U.S. Appl. No. 16/671,967, 1 page, (PER-016-DIV-CON-9), Doc 9097.
Brindle—Terminal Disclaimer filed Apr. 20, 2020 for U.S. Appl. No. 16/671,967, 5 pages, (PER-016-DIV-CON-9), Doc 9112.
Brindle—Response to Office Action filed Apr. 20, 2020 for U.S. Appl. No. 16/671,967, 10 pages, (PER-016-DIV-CON-9), Doc 9116.
USPTO—Notice of Allowance and Allowability dated May 20, 2020 for U.S. Appl. No. 16/671,967, 106 pages (PER-016-DIV-CON-9), Doc 9183.
Brindle—Issue Fee Payment and Response Under 37 CFR 3.312 filed Jun. 10, 2020 for U.S. Appl. No. 16/671,967, 6 pages (PER-016-DIV-CON-9), Doc 9184.
USPTO—Corrected Notice of Allowability dated Jul. 1, 2020 for U.S. Appl. No. 16/671,967, 6 pages (PER-016-DIV-CON-9), Doc 9214.
USPTO—Corrected Notice of Allowability dated Jul. 23, 2020 for U.S. Appl. No. 16/671,967, 6 pages (PER-016-DIV-CON-9), Doc 9233.
USPTO—Corrected Notice of Allowability dated Jul. 31, 2020 for U.S. Appl. No. 16/377,026, 4 pages (PER-016-DIV-CON-9), Doc 9249.
USPTO—Corrected Notice of Allowability dated Aug. 10, 2020 for U.S. Appl. No. 16/377,411, 4 pages (PER-016-DIV-CON-9), Doc 9255.
USPTO—Notice of Allowability dated Aug. 20, 2020 for U.S. Appl. No. 16/377,411, 5 pages (PER-016-DIV-CON-9), Doc 9277.
USPTO—Issue Notification dated Sep. 9, 2020 for U.S. Appl. No. 16/377,411, 1 page (PER-016-DIV-CON-9), Doc 9278.
PSemi—U.S. Appl. No. 16/673,411, filed Nov. 4, 2019, 142 pages (PER-016-DIV-CON-10)—Doc 9014.
USPTO—Filing Receipt and Notice to File Corrected Application Papers dated Nov. 21, 2019 for U.S. Appl. No. 16/673,411, 7 pages (PER-016-DIV-CON-10)—Doc9022.
Brindle—Response to Notice to File Corrected Application Papers dated Nov. 27, 2019 for U.S. Appl. No. 16/673,411, 37 pages (PER-016-DIV-CON-10), Doc 9035.
USPTO—Updated Filing Receipt dated Dec. 30, 2019 for U.S. Appl. No. 16/673,411, 37 pages (PER-016-DIV-CON-10), Doc 9061.
USPTO—Office Action dated Jan. 30, 2020 for U.S. Appl. No. 16/673,411, 8 pages (PER-016-DIV-CON-10), Doc 9081.
USPTO—Notice of Publication dated Apr. 9, 2020 for U.S. Appl. No. 16/673,411, 1 page (PER-016-DIV-CON-10), Doc 9037.
Brindle—e-Terminal Disclaimer filed Apr. 20, 2020 for U.S. Appl. No. 16/673,411, 5 pages (PER-016-DIV-CON-10), Doc9111.
Brindle—Response to Office Action filed Apr. 20, 2020 for U.S. Appl. No. 16/673,411, 9 pages (PER-016-DIV-CON-10), Doc 9138.
USPTO—Notice of Allowance and Allowability dated May 14, 2020 for U.S. Appl. No. 16/673,411, 191 pages (PER-016-DIV-CON-10), Doc 9166.
Brindle—Amendment Under 37 CFR 1.312 filed May 14, 2020 for U.S. Appl. No. 16/673,411, 9 pages (PER-016-DIV-CON-10), Doc 9167.
Brindle—eTerminal Disclaimer filed May 15, 2020 for U.S. Appl. No. 16/673,411, 5 pages (PER-016-DIV-CON-10), Doc 9168.
Brindle—Issue Fee Payment and Amendment Under 37 CFR 1.312 filed Jun. 10, 2020 for U.S. Appl. No. 16/673,411, 11 pages (PER-016-DIV-CON-10), Doc 9169.
USPTO—Corrected Notice of Allowability dated Jul. 1, 2020 for U.S. Appl. No. 16/673,411, 6 pages (PER-016-DIV-CON-10), Doc 9215.
USPTO—Notice of Allowance and Allowability dated Aug. 4, 2020 for U.S. Appl. No. 16/673,411, 52 pages (PER-016-DIV-CON-10), Doc 9247.
Brindle—Issue Fee Payment filed Aug. 6, 2020 for U.S. Appl. No. 16/673,411, 6 pages (PER-016-DIV-CON-10), Doc 9241.
USPTO—Response to Notice of Allowance dated Aug. 6, 2020 for U.S. Appl. No. 16/673,411, 105 pages (PER-016-DIV-CON-10), Doc 9243.

(56) References Cited

OTHER PUBLICATIONS

USPTO—Notice of Allowability dated Aug. 20, 2020 for U.S. Appl. No. 16/673,411, 4 pages (PER-016-DIV-CON-10), Doc 9279.
USPTO—Issue Notification dated Sep. 9, 2020 for U.S. Appl. No. 16/673,411, 1 page (PER-016-DIV-CON-10), Doc 9280.
Brindle—U.S. Appl. No. 16/853,688, filed Apr. 20, 2020, 143 pages (PER-016-DIV-CON-11), Doc 9160.
USPTO—Notice to File Corrected Application Papers dated Apr. 27, 2020 for U.S. Appl. No. 16/853,688, 2 pages (PER-016-DIV-CON-11), Doc 9170.
Brindle—Response to Notice to File Corrected Application Papers dated Jun. 9, 2020 for U.S. Appl. No. 16/853,688, 9 pages (PER-016-DIV-CON-11), Doc 9171.
Brindle—e-Terminal Disclaimer filed Jul. 1, 2020 for U.S. Appl. No. 16/853,688, 7 pages (PER-016-DIV-CON-11), Doc 9216.
USPTO—Non-final Office Action dated Jul. 14, 2020 for U.S. Appl. No. 16/853,688, 90 pages (PER-016-DIV-CON-11), Doc 9226.
Brindle—Response to Non-final Office Action filed Jul. 14, 2020 for U.S. Appl. No. 16/853,688, 7 pages (PER-016-DIV-CON-11), Doc 9227.
USPTO—Notice of Allowance and Allowability dated Aug. 6, 2020 for U.S. Appl. No. 16/673,411, 105 pages (PER-016-DIV-CON-10), Doc 9243.
Brindle—Issue Fee Payment filed Aug. 10, 2020 for U.S. Appl. No. 16/853,688, 6 pages (PER-016-DIV-CON-11), Doc 9258.
USPTO—Notice to File Corrected Application Papers dated Aug. 17, 2020 for U.S. Appl. No. 16/673,411, 3 pages (PER-016-DIV-CON-10), Doc 9281.
Brindle—Response to Notice to File Corrected Application Papers filed Aug. 28, 2020 for U.S. Appl. No. 16/673,411, 28 pages (PER-016-DIV-CON-10), Doc 9282.
USPTO—Corrected Notice of Allowability dated Sep. 2, 2020 for U.S. Appl. No. 16/673,411, 6 pages (PER-016-DIV-CON-10), Doc 9283.
USPTO—Issue Notification dated Sep. 16, 2020 for U.S. Appl. No. 16/673,411, 1 page (PER-016-DIV-CON-10), Doc 9284.
USPTO—Notice of Publication dated Sep. 17, 2020 for U.S. Appl. No. 16/673,411, 1 page (PER-016-DIV-CON-10), Doc 9285.
Brindle—U.S. Appl. No. 16/987,265, filed Aug. 6, 2020, 135 pages (PER-016-DIV-CON-12), Doc 9238.
USPTO—Notice to File Missing Parts dated Aug. 14, 2020 for U.S. Appl. No. 16/987,265, 2 pages (PER-016-DIV-CON-12), Doc 9286.
USPTO—Filing Receipt dated Aug. 14, 2020 for U.S. Appl. No. 16/987,265, 5 pages (PER-016-DIV-CON-12), Doc 9287.
Brindle—U.S. Appl. No. 13/277,108, filed Oct. 19, 2011, 119 pages (PER-016-CIP), Doc 4110.
USPTO—Filing Receipt and Notice to File Missing Parts dated Nov. 2, 2011 for U.S. Appl. No. 13/277,108, 6 pages (PER-016-CIP), Doc4111.
Brindle—Applicant Response to Pre-Exam Formalities Notice dated Feb. 1, 2012 for U.S. Appl. No. 13/277,108, 22 pages (PER-016-CIP), Doc4112.
USPTO—Updated Filing Receipt and Acceptance of Power of Attorney dated Jul. 16, 2012 for U.S. Appl. No. 13/277,108, 5 pages (PER-016-CIP), Doc4113.
USPTO—Office Action dated Sep. 26, 2012 for U.S. Appl. No. 13/277,108, 59 pages (PER-016-CIP), Doc 4114.
USPTO—Notice of Publication dated Oct. 25, 2012 for U.S. Appl. No. 13/277,108, 1 page (PER-016-CIP), Doc 4115.
Brindle—Amendment and Terminal Disclaimer dated Dec. 26, 2012 for U.S. Appl. No. 13/277,108, 23 pages (PER-016-CIP), Doc4117.
USPTO—Terminal Disclaimer Decision dated Jan. 4, 2013 for U.S. Appl. No. 13/277,108, 1 page (PER-016-CIP), Doc4118.
USPTO—Office Action dated Apr. 10, 2013 for U.S. Appl. No. 13/277,108, 246 pages (PER-016-CIP), Doc 4119.
Brindle—Amendment dated Jul. 18, 2013 for U.S. Appl. No. 13/277,108, 41 pages (PER-016-CIP), Doc 4120.
USPTO—Final Office Action dated Sep. 27, 2013 for U.S. Appl. No. 13/277,108, 32 pages (PER-016-CIP), Doc 4121.
Brindle—Response to Final Office Action dated Dec. 27, 2013 for U.S. Appl. No. 13/277,108, 15 pages (PER-016-CIP), Doc 4122.
USPTO—Notice of Allowance dated Jan. 10, 2014 for U.S. Appl. No. 13/277,108, 47 pages (PER-016-CIP), Doc 4123.
Brindle—Issue Fee Payment dated Apr. 10, 2014 for U.S. Appl. No. 13/277,108, 5 pages (PER-016-CIP), Doc 4124.
USPTO—Issue Notification dated May 14, 2014 for U.S. Appl. No. 13/277,108, 1 page (PER-016-CIP), .Doc 4125.
Peregrine—Notice of Loss of Small Entity Status dated Jun. 5, 2017 for U.S. Appl. No. 13/277,108, 1 page (PER-016-CIP), Doc 4126.
Brindle—U.S. Appl. No. 14/198,315, filed Mar. 5, 2014, 124 pages (PER-016-CIP-CON-1), Doc 4127.
USPTO—Filing Receipt and Notice to File Missing Parts dated Mar. 24, 2014 for U.S. Appl. No. 14/198,315, 7 pages (PER-016-CIP-CON-1), Doc 4128.
Brindle—Response to Pre-Exam Formalities Notice dated May 27, 2014 for U.S. Appl. No. 14/198,315, 16 pages (PER-016-CIP-CON-1), Doc 4129.
USPTO—Updated Filing Receipt, Informational Notice and Acceptance of Power of Attorney dated Jul. 15, 2014 for U.S. Appl. No. 14/198,315, 7 pages (PER-016-CIP-CON-1), Doc 4130.
USPTO—Notice of Allowance dated Aug. 20, 2014 for U.S. Appl. No. 14/198,315, 54 pages (PER-016-CIP-CON-1), Doc 4131.
USPTO—Notice of Publication dated Oct. 23, 2014 for U.S. Appl. No. 14/198,315, 1 page (PER-016-CIP-CON-1), Doc 4132.
Brindle—Request for Continued Examination and Notification of Loss of Small Entity Status dated Nov. 20, 2014 for U.S. Appl. No. 14/198,315, 7 pages (PER-016-CIP-CON-1), Doc4133.
USPTO—Notice of Allowance dated Feb. 3, 2015 for U.S. Appl. No. 14/198,315, 238 pages (PER-016-CIP-CON-1), Doc 4134.
Brindle—Substitute Statement in Lieu of Oath or Declaration dated Feb. 26, 2015 for U.S. Appl. No. 14/198,315, 6 pages (PER-016-CIP-CON-1), Doc 4135.
Brindle—Issue Fee Payment and Letter Regarding Substitute Statement dated May 4, 2015 for U.S. Appl. No. 14/198,315, 3 pages (PER-016-CIP-CON-1), Doc4136.
USPTO—Corrected Filing Receipt dated Jun. 9, 2015 for U.S. Appl. No. 14/198,315, 4 pages (PER-016-CIP-CON-1), Doc 4137.
USPTO—Issue Notification dated Jun. 30, 2015 for U.S. Appl. No. 14/198,315, 1 page (PER-016-CIP-CON-1), Doc 4138.
Peregrine—Notification of Loss of Small Entity Status dated Jul. 31, 2017 for U.S. Appl. No. 14/198,315, 1 page (PER-016-CIP-CON-1), Doc 4139.
Brindle—U.S. Appl. No. 14/804,198, filed Jul. 20, 2015, 116 pages (PER-016-CIP-CON-2), Doc 4140.
USPTO—Filing Receipt and Notice to File Missing Parts dated Aug. 5, 2015 for U.S. Appl. No. 14/804,198, 6 pages (PER-016-CIP-CON-2), Doc 4141.
Brindle—Response to Pre-Exam Formalities Notice and Power of Attorney dated Oct. 5, 2015 for U.S. Appl. No. 14/804,198, 15 pages (PER-016-CIP-CON-1), Doc 4142.
Brindle—Preliminary Amendment dated Nov. 20, 2015 for U.S. Appl. No. 14/804,198, 15 pages (PER-016-CIP-CON-2), Doc 4143.
USPTO—Updated Filing Receipt, Acceptance of Power of Attorney and Informational Notice dated Nov. 27, 2015 for U.S. Appl. No. 14/804,198, 7 pages (PER-016-CIP-CON-2), Doc 4144.
USPTO—Office Action dated Mar. 2, 2016 for U.S. Appl. No. 14,804,198, 9 pages (PER-016-CIP-CON-2), Doc 4145.
USPTO—Notice of Publication dated Mar. 3, 2016 for U.S. Appl. No. 14/804,198, 1 page (PER-016-CIP-CON-2), Doc 4146.
Brindle—Amendment dated Jun. 2, 2016 for U.S. Appl. No. 14/804,198, 17 pages (PER-016-CIP-CON-2), Doc 4147.
USPTO—Notice of Allowance dated Sep. 23, 2016 for U.S. Appl. No. 14/804,198, 33 pages (PER-016-CIP-CON-2), Doc 4148.
USPTO—Corrected Filing Receipt dated Oct. 11, 2016 for U.S. Appl. No. 14/804,198, 1 page (PER-016-CIP-CON-2), Doc 4149.
Brindle—Substitute Statement in Lieu of Oath or Declaration dated Oct. 28, 2016 for U.S. Appl. No. 14/804,198, 6 pages (PER-016-CIP-CON-2), Doc4150.
Brindle—Request for Continued Examination dated Nov. 10, 2016 for U.S. Appl. No. 14/804,198, 3 pages (PER-016-CIP-CON-2), Doc 4151.

(56) References Cited

OTHER PUBLICATIONS

USPTO—Notice of Allowance dated Dec. 7, 2016 for U.S. Appl. No. 14/804,198, 34 pages (PER-016-CIP-CON-2), Doc 4152.
Brindle—Issue Fee Payment and 312 Amendment dated Mar. 7, 2017 for U.S. Appl. No. 14/804,198, 13 pages (PER-016-CIP-CON-2), Doc4153.
USPTO—Notice of Allowance dated Mar. 27, 2017 for U.S. Appl. No. 14/804,198, 10 pages (PER-016-CIP-CON-2), Doc4154.
USPTO—312 Amendment dated Apr. 14, 2017 for U.S. Appl. No. 14/804,198, 1 paqe (PER-016-CIP-CON-2), Doc 4155.
USPTO—Issue Notification dated Apr. 26, 2017 for U.S. Appl. No. 14/804,198, 1 page (PER-016-CIP-CON-2), Doc 4156.
Brindle—U.S. Appl. No. 15/354,723, filed Nov. 17, 2016, 123 pages (PER-016-CIP-CON-3), Doc 4157.
USPTO—Filing Receipt and Notice to File Missing Parts dated Nov. 30, 2016 for U.S. Appl. No. 15/354,723, 7 pages (PER-016-CIP-CON-3), Doc 4158.
Brindle—Response to Pre-Exam Formalities Notice dated Jan. 30, 2017 for U.S. Appl. No. 15/354,723, 13 pages (PER-016-CIP-CON-3), Doc 4159.
Brindle—Preliminary Amendment dated Feb. 23, 2017 for U.S. Appl. No. 15/354,723, 13 pages (PER-016-CIP-CON-3), Doc 4160.
USPTO—Updated Filing Receipt, Informational Notice and Acceptance of Power of Attorney dated Feb. 28, 2017 for U.S. Appl. No. 15/354,723, 7 pages (PER-016-CIP-CON-3), Doc 4161.
USPTO—Office Action dated Mar. 24, 2017 for U.S. Appl. No. 15/534,723, 22 pages (PER-016-CIP-CON-3), Doc 4162.
Brindle—Amendment and Terminal Disclaimer dated Apr. 17, 2017 for U.S. Appl. No. 15/354,723, 13 pages (PER-016-CIP-CON-3), Doc 4163.
USPTO—Terminal Disclaimer Decision dated May 4, 2017 for U.S. Appl. No. 15/354,723, 1 page (PER-016-CIP-CON-3), Doc 4164.
USPTO—Notice of Publication dated Jun. 8, 2017 for U.S. Appl. No. 15/354,723, 1 page (PER-016-CIP-CON-3), Doc 4165.
USPTO—Notice of Allowance dated Jun. 21, 2017 for U.S. Appl. No. 15/354,723, 36 paQes (PER-016-CIP-CON-3), Doc 4166.
Brindle—Request for Continued Examination dated Jul. 18, 2017 for U.S. Appl. No. 15/354,723, 3 pages (PER-016-CIP-CON-3), Doc 4167.
Brindle—Substitute Statement in Lieu of Oath or Declaration dated Aug. 9, 2017 for U.S. Appl. No. 15/354,723, 6 pages (PER-016-CIP-CON-3), Doc4168.
USPTO—Notice of Allowance dated Aug. 11, 2017 for U.S. Appl. No. 15/354,723, 31 pages (PER-016-CIP-CON-3), Doc 4169.
USPTO—Issue Fee Payment dated Aug. 25, 2017 for U.S. Appl. No. 15/354,723, 1 page (PER-016-CIP-CON-3), Doc 4170.
USPTO—Corrected Notice of Allowability dated Sep. 11, 2017 for U.S. Appl. No. 15/354,723, 2 pages (PER-016-CIP-CON-3), Doc 4171.
USPTO—Issue Notification dated Sep. 20, 2017 for U.S. Appl. No. 15/354,723, 1 page (PER-016-CIP-CON-3), Doc 4172.
Brindle—U.S. Appl. No. 15/693,182, filed Aug. 31, 2017, 123 pages (PER-016-CIP-CON-4), Doc 4173.
USPTO—Filing Receipt and Notice to File Missing Parts dated Sep. 13, 2017 for U.S. Appl. No. 15/693,182, 7 pages (PER-016-CIP-CON-4), Doc 4174.
Brindle—Preliminary Amendment and Response to Pre-Exam Formalities Notice dated Nov. 13, 2017 for U.S. Appl. No. 15/693,182, 21 pages (PER-016-CIP-CON-4), Doc 4175.
USPTO—Updated Filing Receipt, Informational Notice and Acceptance of Power of Attorney dated Nov. 20, 2017 for U.S. Appl. No. 15/693,182, 7 pages (PER-016-CIP-CON-4), Doc 4176.
USPTO—Notice of Publication dated Mar. 1, 2018 for U.S. Appl. No. 15/693,182, 1 page (PER-016-CIP-CON-4), Doc 4177.
USPTO—Office Action dated Mar. 9, 2018 for U.S. Appl. No. 15/693,182, 15 pages (PER-016-CIP-CON-4), Doc 4178.
PSemi—Request to Correct Applicant Name dated Apr. 8, 2018 for U.S. Appl. No. 15/693,182, 8 pages (PER-016-CIP-CON-4), Doc 4179.
USPTO—Corrected Filing Receipt dated Apr. 10, 2018 for U.S. Appl. No. 15/693,182, 4 pages (PER-016-CIP-CON-4), Doc 4180.
PSemi—Amendment and Terminal Disclaimer dated Apr. 27, 2018 for U.S. Appl. No. 15/693,182, 19 pages (PER-016-CIP-CON-4), Doc 4181.
PSemi—Terminal Disclaimer filed Jun. 6, 2018 for U.S. Appl. No. 15/693,182, 4 pages (PER-016-CIP-CON-4), Doc 4182.
USPTO—Terminal Disclaimer decision dated Jun. 8, 2018 for U.S. Appl. No. 15/693,182, 1 page (PER-016-CIP-CON-4), Doc 4183.
USPTO—Notice of Allowance dated Jun. 21, 2018 for U.S. Appl. No. 15/693,182, 37 pages (PER-016-CIP-CON-4), Doc 4184.
PSemi—Issue Fee Payment dated Jul. 23, 2018 for U.S. Appl. No. 15/693,182, 4 pages (PER-016-CIP-CON-4), Doc 4186.
USPTO—Notice of Allowance dated Aug. 6, 2018 for U.S. Appl. No. 15/693,182, 6 pages (PER-016-CIP-CON-4), Doc 4187.
USPTO—Issue Notification dated Aug. 23, 2018 for U.S. Appl. No. 15/693,182, 1 page (PER-016-CIP-CON-4), Doc 4188.
PSemi—Substitute Statement in Lieu of Oath or Declaration dated Jul. 20, 2019 for U.S. Appl. No. 15/693,182, 6 pages (PER-016-CIP-CON-4), Doc 4185.
Brindle—U.S. Appl. No. 16/046,974, filed Jun. 26, 2018, 125 pages (PER-016-CIP-CON-5), Doc 4189.
USPTO—Filing Receipt and Notice to File Missing Parts dated Aug. 14, 2018 for U.S. Appl. No. 16/046,974, 7 pages (PER-016-CIP-CON-5), Doc 4190.
Brindle—Response to Pre-Exam Formalities Notice dated Oct. 9, 2018 for U.S. Appl. No. 16/046,974, 13 pages (PER-016-CIP-CON-5), Doc 4191.
Brindle—Preliminary Amendment dated Dec. 5, 2018 for U.S. Appl. No. 16/046,974, 14 pages (PER-016-CIP-CON-5), Doc 4192.
USPTO—Updated Filing Receipt and Acceptance of Power of Attorney dated Dec. 10, 2018 for U.S. Appl. No. 16/046,974, 7 pages (PER-016-CIP-CON-5), Doc 4193.
USPTO—Notice of Allowance dated May 8, 2019 for U.S. Appl. No. 16/046,974, 46 pages (PER-016-CIP-CON-5), Doc 4194.
PSemi—Power of Attorney dated May 16, 2019 for U.S. Appl. No. 16/046,974, 4 pages (PER-016-CIP-CON-5) Doc 4195.
USPTO—Acceptance of Power of Attorney dated May 20, 2019 for U.S. Appl. No. 16/046,974, 2 pages (PER-016-CIP-CON-5), Doc4196.
USPTO—Notice of Allowance and Notice of Allowability dated Sep. 19, 2019 for U.S. Appl. No. 16/046,974, 120 pages (PER-016-CIP-CON-5), Doc 9015.
Brindle—312 Amendment filed Nov. 1, 2019 for U.S. Appl. No. 16/046,974, 19 pages (PER-016-CIP-CON-5), Doc 9016.
Brindle—Issue Fee Payment filed Dec. 19, 2019 for U.S. Appl. No. 16/046,974, 3 pages (PER-016-CIP-CON-5), Doc 9052.
USPTO—Corrected Notice of Allowability dated Dec. 23, 2019 for U.S. Appl. No. 16/046,974, 4 pages (PER-016-CIP-CON-5), Doc 9053.
USPTO—Corrected Notice of Allowability dated Jan. 24, 2020 for U.S. Appl. No. 16/046,974, 11 pages (PER-016-CIP-CON-5), Doc 9078.
USPTO—Corrected Notice of Allowability dated Mar. 16, 2020 for U.S. Appl. No. 16/046,974, 7 pages (PER-016-CIP-CON-5), Doc 9142.
Brindle—Petition to Correct Inventorship filed Apr. 20, 2020 for U.S. Appl. No. 16/046,974, 23 pages (PER-016-CIP-CON-5), Doc 9143.
USPTO—Notice of Acceptance of Request Under 37 CFR 1.48(a) dated Apr. 27, 2020 for U.S. Appl. No. 16/046,974, 1 page (PER-016-CIP-CON-5), Doc 9185.
USPTO—Corrected Notice of Allowability dated May 1, 2020 for U.S. Appl. No. 16/046,974, 8 pages (PER-016-CIP-CON-5), Doc 9186.
Brindle—Request for Corrected Filing Receipt filed May 12, 2020 for U.S. Appl. No. 16/046,974, 20 pages (PER-016-CIP-CON-5), Doc 9187.
USPTO—Corrected Filing Receipt dated May 14, 2020 for U.S. Appl. No. 16/046,974, 4 pages (PER-016-CIP-CON-5), Doc 9188.
USPTO—Issue Notification dated Jun. 10, 2020 for U.S. Appl. No. 16/046,974, 1 page (PER-016-CIP-CON-5), Doc 9189.

(56) References Cited

OTHER PUBLICATIONS

USPTO—Corrected Notice of Allowability dated Aug. 4, 2020 for U.S. Appl. No. 16/046,974, 11 pages (PER-016-CIP-CON-5), Doc 9246.
USPTO—Corrected Notice of Allowability dated Aug. 24, 2020 for U.S. Appl. No. 16/046,974, 5 pages (PER-016-CIP-CON-5), Doc 9288.
USPTO—Issue Notification dated Sep. 16, 2020 for U.S. Appl. No. 16/046,974, 1 page (PER-016-CIP-CON-5), Doc 9289.
Brindle—U.S. Appl. No. 16/377,026, filed Apr. 5, 2019, 135 pages (PER-016-CIP-CON-6), Doc 4206.
Brindle—Authorization to Act in Representative Capacity dated Apr. 16, 2019 for U.S. Appl. No. 16/377/026, 4 pages (PER-016-CIP-CON-6), Doc 4207.
USPTO—Filing Receipt and Decision Granting Request for Track 1 dated Apr. 24, 2019 for U.S. Appl. No. 16/377,026, 8 pages (PER-016-CIP-CON-6), Doc 4208.
USPTO—Notice of Allowance dated May 29, 2019 for U.S. Appl. No. 16/377/026, 24 pages (PER-016-CIP-CON-6), Doc 4209.
USPTO—Acceptance of Power of Attorney dated May 30, 2019 for U.S. Appl. No. 16/377,026, 1 page (PER-016-CIP-CON-6), Doc 4210.
USPTO—Notice of Allowance and Notice of Allowability dated Oct. 2, 2019 for U.S. Appl. No. 16/377,026, 122 pages (PER-016-CIP-CON-6), Doc 9017.
USPTO—Corrected Notice of Allowability dated Dec. 18, 2019 for U.S. Appl. No. 16/377,026, 4 pages (PER-016-CIP-CON-6), Doc 9054.
Brindle—Issue Fee Payment and 312 Amendment filed Jan. 2, 2020 for U.S. Appl. No. 16/377,026, 26 pages (PER-016-CIP-CON-6), Doc 9059.
USPTO—Corrected Notice of Allowability dated Feb. 14, 2020 for U.S. Appl. No. 16/377,026, 17 pages (PER-016-CIP-CON-6), Doc 9091.
USPTO—Corrected Notice of Allowability dated Mar. 13, 2020 for U.S. Appl. No. 16/377,026, 8 pages (PER-016-CIP-CON-6), Doc 9190.
USPTO—Office Communication dated Mar. 26, 2020 for U.S. Appl. No. 16/377,026, 10 pages (PER-016-CIP-CON-6), Doc 9191.
USPTO—Corrected Notice of Allowability dated May 1, 2020 for U.S. Appl. No. 16/377,026, 7 pages (PER-016-CIP-CON-6), Doc 9192.
USPTO—Issue Notification dated Jun. 10, 2020 for U.S. Appl. No. 16/377,026, 1 page (PER-016-CIP-CON-6), Doc 9193.
USPTO—Corrected Notice of Allowability dated Jun. 24, 2020 for U.S. Appl. No. 16/377,026, 6 pages (PER-016-CIP-CON-6), Doc 9217.
USPTO—Corrected Notice of Allowability dated Jul. 8, 2020 for U.S. Appl. No. 16/377,026, 4 pages, (PER-016-CIP-CON-6), Doc 9218.
USPTO—Corrected Notice of Allowability dated Jul. 23, 2020 for U.S. Appl. No. 16/377,026, 6 pages (PER-016-DIV-CON-9), Doc 9235.
USPTO—Notice of Allowance and Allowability dated Aug. 18, 2020 for U.S. Appl. No. 16/377,026, 11 pages (PER-016-DIV-CON-9), Doc 9290.
Brindle—Response to Notice of Allowance filed Aug. 18, 2020 for U.S. Appl. No. 16/377,026, 6 pages (PER-016-DIV-CON-9), Doc 9291.
USPTO—Issue Notification dated Sep. 9, 2020 for U.S. Appl. No. 16/377,026, 1 page (PER-016-DIV-CON-9), Doc 9292.
Brindle—U.S. Appl. No. 16/739,093, filed Jan. 9, 2020, 132 pages, (PER-016-CIP-CON-7), Doc 9066.
USPTO—Notice of Missing Parts dated Jan. 31, 2020 for U.S. Appl. No. 16/739,093, 2 pages, (PER-016-CIP-CON-7), Doc 9083.
USPTO—Filing Receipt dated Jan. 31, 2020 for U.S. Appl. No. 16/739,093, 4 pages, (PER-016-CIP-CON-7), Doc 9084.
Brindle—Response to Notice of Missing Parts and Preliminary Amendment filed Jun. 30, 2020 for U.S. Appl. No. 16/739,093, 19 pages (PER-016-CIP-CON-7), Doc 9219.

Brindle—Terminal Disclaimers filed Jul. 1, 2020 for U.S. Appl. No. 16/739,093, 7 pages (PER-016-CIP-CON-7), Doc 9220.
USPTO—Updated Filing Receipt dated Jul. 2, 2020 for U.S. Appl. No. 16/739,093, 6 page (PER-016-CIP-CON-7), Doc 9221.
USPTO—Notice of Publication dated Oct. 8, 2020 for U.S. Appl. No. 16/739,093, 1 pages (PER-016-CIP-CON-7), Doc 9293.
USPTO—Notice of Allowance and Allowability dated Dec. 16, 2020 for U.S. Appl. No. 16/739,093, 12pages (PER-016-CIP-CON-7), Doc 9296.
Brindle—U.S. Appl. No. 11/881,816, filed Jul. 26, 2007 (PER-018-CIP), 45 pages, Doc 4433.
USPTO—Filing Receipt and Pre-Exam Formalities Notice dated Aug. 13, 2007 for U.S. Appl. No. 11/881,816 (PER-018-CIP), 5 pages, Doc 4434.
Brindle—Response to Pre-Exam Formalities Notice and Request for Corrected Filing Receipt dated Oct. 18, 2007 for U.S. Appl. No. 11/881,816 (PER-018-CIP), 16 pages, Doc 4435.
USPTO—Updated Filing Receipt dated Nov. 5, 2007 for U.S. Appl. No. 11/881,816 (PER-018-CIP), 3 pages, Doc 4436.
Brindle—Request for Corrected Filing Receipt dated Nov. 23, 2007 for U.S. Appl. No. 11/881,816 (PER-018-CIP), 4 pages, Doc 4437.
USPTO—Corrected Filing Receipt dated Dec. 19, 2007 for U.S. Appl. No. 11/881,816 (PER-018-CIP), 3 paQes, Doc 4438.
USPTO—Notice of Publication dated Mar. 27, 2008 for U.S. Appl. No. 11/881,816 (PER-018 CIP), 1 page, Doc 4439.
USPTO—Restriction Requirement dated Oct. 7, 2008 for U.S. Appl. No. 11/881,816 (PER-018-CIP), 5 pages, Doc 4440.
Brindle—Amendment filed Jan. 12, 2009 for U.S. Appl. No. 11/881,816 (PER-018-CIP}, 7 pages, Doc 4441.
USPTO—Notice of Non-Responsive Amendment dated Apr. 28, 2009 for U.S. Appl. No. 11/881,816 (PER-018-CIP), 3 paqes, Doc 4442.
Brindle—Amendment filed Aug. 31, 2009 for U.S. Appl. No. 11/881,816 (PER-018-CIP), 7 pages, Doc 4443.
Brindle—Amendment filed Jul. 21, 2010 for U.S. Appl. No. 11/881,816 (PER-018-CIP), 23 pages, Doc 4445.
USPTO—Final Office Action dated Oct. 14, 2010 for U.S. Appl. No. 11/881,816 (PER-018-CIP), 17 pages, Doc 4446.
Brindle—Amendment dated Jan. 14, 2011 for U.S. Appl. No. 11/881,816 (PER-018-CIP), 19 pages, Doc 4447.
USPTO—Advisory Action dated Mar. 18, 2011 for U.S. Appl. No. 11/881,816 (PER-018-CIP}, 3 pages, Doc 4448.
USPTO—Examiner Interview Summary dated Apr. 18, 2011 for U.S. Appl. No. 11/881,816 (PER-018-CIP}, 3 paQes, Doc 4449.
Brindle—Letter Confirming No Formal Response to Examiner Interview Summary Required dated Jun. 29, 2011 for U.S. Appl. No. 11/881,816 (PER-018-CIP), 1 page, Doc 4450.
USPTO—Notice of Allowance dated Oct. 12, 2011 for U.S. Appl. No. 11/881,816 (PER-018-CIP}, 10 pages, Doc 4451.
Brindle—Issue Fee Payment dated Jan. 17, 2012 for U.S. Appl. No. 11/881,816 (PER-018-CIP}, 1 page, Doc 4452.
USPTO—Issue Notification dated Mar. 7, 2012 for U.S. Appl. No. 11/881,816 (PER-018-CIP), 1 page, Doc 4453.
Brindle—Auto-Granted Petition to Remove from Issue dated Mar. 26, 2012 for U.S. Appl. No. 11/881,816 (PER-018-CIP), 6 pages, Doc 4454.
Brindle—Request for Continued Examination filed Mar. 26, 2012 for U.S. Appl. No. 11/881,816 (PER-018-CIP}, 3 pages, Doc 4455.
USPTO—Notice of Withdrawal from Issue dated Apr. 11, 2012 for U.S. Appl. No. 11/881,816 (PER-018-CIP}, 1 paQe, Doc4456.
USPTO—Notice of Allowance dated Jun. 4, 2012 for U.S. Appl. No. 11/881,816 (PER-018-CIP}, 17 pages, Doc 4457.
Brindle—Issue Fee Payment dated Sep. 4, 2012 for U.S. Appl. No. 11/881,816 (PER-018-CIP), 1 page, Doc 4458.
USPTO—Issue Notification dated Oct. 10, 2012 for U.S. Appl. No. 11/881,816 (PER-018-CIP}, 1 page. Doc4459.
Brindle—Auto-Granted Petition to Remove from Issue dated Oct. 17, 2012 for U.S. Appl. No. 11/881,816 (PER-018-CIP), 7 pages, Doc 4460.
Brindle—Request for Continued Examination filed Oct. 17, 2012 for U.S. Appl. No. 11/881,816 (PER-018-CIP), 3 pages, Doc 4461.
USPTO—Office Action dated Mar. 1, 2013 for U.S. Appl. No. 11/881,816 (PER-018-CIP), 12 pages, Doc 4462.

(56) References Cited

OTHER PUBLICATIONS

Brindle—Amendment filed Jun. 3, 2013 for U.S. Appl. No. 11/881,816 (PER-018-CIP), 30 pages, Doc 4463.
USPTO—Final Rejection dated Oct. 23, 2013 for U.S. Appl. No. 11/881,816 (PER-018-CIP), 12 pages, Doc 4464.
Brindle—Amendment filed Feb. 4, 2014 in U.S. Appl. No. 11/881,816 (PER-018-CIP), 21 pages, Doc 4465.
USPTO—Advisory Action dated Feb. 19, 2014 for U.S. Appl. No. 11/881,816 (PER-018-CIP), 3 pages, Doc 4466.
Brindle—Notice of Appeal with Pre-Brief Conference Request filed Feb. 20, 2014 in U.S. Appl. No. 11/881,816 (PER-018-CIP), 13 pages, Doc 4467.
USPTO—Pre-Appeal Brief Conference Decision dated Apr. 21, 2014 for U.S. Appl. No. 11/881,816 (PER-018-CIP), 2 pages, Doc 4468.
USPTO—Notice of Abandonment dated Dec. 23, 2014 for U.S. Appl. No. 11/881,816, (PER-018-CIP), 2 pages, Doc 4469.
USPTO—Office Action dated Jan. 19, 2010 for U.S. Appl. No. 11/881,816 (PER-018-CIP), 8 pages, Doc 4444.
Dribinsky—U.S. Appl. No. 14/257,808, filed Apr. 21, 2014, 47 pages (PER-018-CIP-CON-1), Doc 4327.
USPTO—Filing Receipt and Notice to File Missing Parts dated May 8, 2014 for U.S. Appl. No. 14/257,808, 6 pages (PER-018-CIP-CON-1), Doc 4306.
Dribinsky—Power of Attorney and Response to Notice to File Missing Parts dated Jul. 7, 2014 for U.S. Appl. No. 14/257,808, 15 pages (PER-018-CIP-CON-1), Doc 4307.
USPTO—Updated Filing Receipt, Informational Notice, and Acceptance of Power of Attorney dated Oct. 9, 2014 for U.S. Appl. No. 14/257,808, 6 pages (PER-018-CIP-CON-1), Doc 4308.
USPTO—Notice of Publication dated Jan. 15, 2015 for U.S. Appl. No. 14/257,808. 1 page (PER-018-CIP-CON-1), Doc 4309.
Dribinsky—Substitute Statement in Lieu of Oath or Declaration dated Mar. 11, 2015 for U.S. Appl. No. 14/257,808, 6 pages (PER-018-CIP-CON-1), Doc 4310.
Shingleton—Office Action dated Apr. 10, 2015 for U.S. Appl. No. 14/257,808, 8 pages (PER-018-CIP-CON), Doc 0958.
USPTO—Office Action dated Apr. 10, 2015 for U.S. Appl. No. 14/257,808, 10 pages (PER-018-CIP-CON-1), Doc 4311.
Dribinsky—Amendment dated Oct. 13, 2015 for U.S. Appl. No. 14/257,808, 27 pages (PER-018-CIP-CON-1), Doc 4312.
USPTO—Notice of Allowance dated Dec. 10, 2015 for U.S. Appl. No. 14/257,808, 181 pages (PER-018-CIP-CON-1), Doc 4313.
Dribinsky—Issue Fee Payment dated Jan. 12, 2016 for U.S. Appl. No. 14/257,808, 1 page (PER-018-CIP-CON-1), Doc 4314.
USPTO—Issue Notification dated Jun. 26, 2016 for U.S. Appl. No. 14/257,808, 15 pages (PER-018-CIP-CON-1), Doc 4315.
Dribinsky—U.S. Appl. No. 14/987,360, filed Jan. 4, 2016, 58 pages (PER-018-CIP-CON-2), Doc 4316.
USPTO—Filing Receipt and Notice to File Missing Parts dated Jan. 20, 2016 for U.S. Appl. No. 14/987,360, 7 pages (PER-018-CIP-CON-2), Doc 4317.
Dribinsky—Power of Attorney and Response to Notice to File Missing Parts dated Mar. 21, 2016 for U.S. Appl. No. 14/987,360, 16 pages (PER-018-CIP-CON-2), Doc 4318.
USPTO—Updated Filing Receipt, Informational Notice and Acceptance of Power of Attorney dated Apr. 25, 2016 for U.S. Appl. No. 14/987,360, 7 pages (PER-018-CIP-CON-2), Doc 4319.
USPTO—Notice of Publication dated Aug. 4, 2016 for U.S. Appl. No. 14/987,360, 1 page (PER-018-CIP-CON-2), Doc 4320.
USPTO—Office Action dated Sep. 14, 2016 for U.S. Appl. No. 14/987,360, 18 pages (PER-018-CIP-CON-2), Doc 4321.
Dribinsky—Amendment dated Dec. 14, 2016 for U.S. Appl. No. 14/987,360, 35 pages (PER-018-CIP-CON-2), Doc 4322.
Dribinsky—Terminal Disclaimer dated Dec. 14, 2016 for U.S. Appl. No. 14/987,360, 2 pages (PER-018-CIP-CON-2), Doc 4323.
USPTO—Terminal Disclaimer Decision dated Jan. 7, 2017 for U.S. Appl. No. 14/987,360, 1 page (PER-018-CIP-CON-2), Doc4324.
USPTO—Notice of Allowance dated Aug. 10, 2017 for U.S. Appl. No. 14/987,360, 54 pages (PER-018-CIP-CON-2), Doc 4325.
Dribinsky—Issue Fee Payment dated Oct. 31, 2017 for U.S. Appl. No. 14/987,360, 4 pages (PER-018-CIP-CON-2), Doc 4328.
USPTO—Issue Notification dated Jan. 17, 2018 for U.S. Appl. No. 14/987,360, 1 page (PER-018-CIP-CON-2), Doc 4329.
Dribinsky—U.S. Appl. No. 15/826,453, filed Nov. 29, 2017, 58 pages (PER-018-CIP-CON-3), Doc 4330.
USPTO—Filing Receipt and Notice to File Missing Parts dated Dec. 20, 2017 for U.S. Appl. No. 15/826,453, 7 pages (PER-018-CIP-CON-3), Doc 4331.
Dribinsky—Response to Pre-Exam Formalities Notice, Power of Attorney and 3.73 Statement dated Feb. 20, 2018 for U.S. Appl. No. 15/826,453, 14 pages (PER-018-CIP-CON-3), Doc 4332.
Dribinsky—Request for Change of Applicant dated Apr. 15, 2018 for U.S. Appl. No. 15/826,453, 8 pages (PER-018-CIP-CON-3), Doc 4333.
USPTO—Notice of Acceptance of Power of Attorney, Updated Filing Receipt and Informational Notice dated Apr. 17, 2018 for U.S. Appl. No. 15/826,453, 7 pages (PER-018-CIP-CON-3), Doc 4334.
USPTO—Notice of Publication dated Jul. 26, 2018 for U.S. Appl. No. 15/826,453, 1 page (PER-018-CIP-CON-3), Doc 4335.
USPTO—Office Action dated Feb. 14, 2019 for U.S. Appl. No. 15/826,453, 36 pages (PER-018-CIP-CON-3), Doc 4336.
Dribinsky—Response to Office Action dated May 9, 2019 for U.S. Appl. No. 15/826,453, 25 pages (PER-018-CIP-CON-3), Doc 4337.
USPTO—Final Office Action dated Jun. 6, 2019 for U.S. Appl. No. 15/826,453, 18 pages (PER-018-CIP-CON-3), Doc 4338.
PSemi—Request for Continued Examination and Amendment filed Nov. 6, 2019 for U.S. Appl. No. 15/826,453, 28 pages (PER-018-CIP-CON-3)—Doc 9018.
USPTO—Notice of Allowance dated Jan. 13, 2020 for U.S. Appl. No. 15/826,453, 5 pages (PER-018-CIP-CON-3)—Doc 9073.
USPTO—Notice Requiring Inventor's Oath or Declaration dated Mar. 10, 2020 for U.S. Appl. No. 15/826,453, 1 page (PER-018-CIP-CON-3)—Doc 9101.
USPTO—Notice to File Corrected Application Papers dated Mar. 16, 2020 for U.S. Appl. No. 15/826,453, 3 pages (PER-018-CIP-CON-3)—Doc 9157.
Dribinsky—Request for Continued Examination filed Apr. 12, 2020 for U.S. Appl. No. 15/826,453, 23 pages (PER-018-CIP-CON-3)—Doc 9158.
Dribinsky—Preliminary Amendment filed Apr. 15, 2020 for U.S. Appl. No. 15/826,453, 11 pages (PER-018-CIP-CON-3)—Doc 9159.
Dribinsky—Response to Notice Requiring Inventor's Oath filed Apr. 21, 2020 for U.S. Appl. No. 15/826,453, 1 page (PER-018-CIP-CON-3), Doc 9194.
USPTO—Non-final Office Action dated May 7, 2020 for U.S. Appl. No. 15/826,453, 144 pages (PER-018-CIP-CON-3), Doc 9195.
Dribinsky—eTerminal Disclaimer filed May 8, 2020 for U.S. Appl. No. 15/826,453, 5 pages (PER-018-CIP-CON-3), Doc 9196.
Dribinsky—Response to Non-final Office Action dated May 8, 2020 for U.S. Appl. No. 15/826,453, 11 pages (PER-018-CIP-CON-3), Doc 9197.
Dribinsky—Response to Notice to File Corrected Application Papers filed May 12, 2020 for U.S. Appl. No. 15/826,453, 9 pages (PER-018-CIP-CON-3), Doc 9198.
USPTO—Final Office Action dated May 27, 2020 for U.S. Appl. No. 15/826,453, 5 pages (PER-018-CIP-CON-3), Doc 9199.
Dribinsky—Response to Final Office Action filed Jun. 9, 2020 for U.S. Appl. No. 15/826,453, 12 pages (PER-018-CIP-CON-3), Doc 9200.
Dribinsky—e-Terminal Disclaimer filed Jun. 9, 2020 for U.S. Appl. No. 15/826,453, 12 pages (PER-018-CIP-CON-3), Doc 9201.
USPTO—Notice of Allowance dated Jun. 17, 2020 for U.S. Appl. No. 15/826,453, 5 pages (PER-018-CIP-CON-3), Doc 9202.
Dribinsky—Issue Fee Payment filed Jun. 20, 2020 for U.S. Appl. No. 15/826,453, 5 pages (PER-018-CIP-CON-3), Doc 9203.
USPTO—Corrected Notice of Allowability dated Jul. 22, 2020 for U.S. Appl. No. 15/826,453, 8 pages, (PER-018-CIP-CON-3), Doc 7238.
USPTO—Corrected Notice of Allowability dated Jul. 31, 2020 for U.S. Appl. No. 15/826,453, 4 pages, (PER-018-CIP-CON-3), Doc 9250.

(56) References Cited

OTHER PUBLICATIONS

USPTO—Notice of Allowability dated Aug. 10, 2020 for U.S. Appl. No. 15/826,453, 3 pages (PER-018-CIP-CON-3), Doc 9254.
USPTO—Corrected Notice of Allowability dated Aug. 19, 2020 for U.S. Appl. No. 15/826,453, 4 pages (PER-018-CIP-CON-3), Doc 9294.
USPTO—Issue Notification dated Sep. 3, 2020 for U.S. Appl. No. 15/826,453, 1 page (PER-018-CIP-CON-3), Doc 9295.
Patel—Office Action dated Dec. 5, 2011 for U.S. Appl. No. 13/046,560, 18 pages (PER-019-DIV), Doc 0797.
Englekirk—Amendment dated Mar. 5, 2012 for U.S. Appl. No. 13/046,560, 7 pages (PER-019-DIV), Doc 0803.
Patel—Notice of Allowance dated May 24, 2012 for U.S. Appl. No. 13/046,560, 15 pages (PER-019-DIV), Doc 0817.
Patel—Notice of Allowance dated Dec. 3, 2012 for U.S. Appl. No. 13/046,560, 198 pages (PER-019-DIV), Doc 0829.
Patel—Notice of Allowance dated Mar. 15, 2013 for U.S. Appl. No. 13/046,560, 16 pages (PER-019-DIV), Doc 0847.
Englekirk—Fee Transmittal and Comments on Allowance dated Jun. 17, 2013 for U.S. Appl. No. 13/046,560, 4 paQes (PER-019-DIV), Doc 0855.
Patel—Office Action dated Aug. 15, 2014 for U.S. Appl. No. 14/028,357, 12 pages (PER-019-DIV-CON-1), Doc 0923.
Patel—Final Office Action dated Apr. 7, 2015 for U.S. Appl. No. 14/028,357, 160 pages (PER-019-DIV-CON-1), Doc 0957.
Englekirk—Response to Final Office Action dated Jun. 8, 2015 for U.S. Appl. No. 14/028,357, 10 pages (PER-019-DIV-CON-1), Doc 0964.
Patel—Notice of Allowance dated Jun. 25, 2015 for U.S. Appl. No. 14/028,357, 18 pages (PER-019-DIV-CON-1), Doc 0966.
Patel—Office Action dated Jun. 22, 2016 for U.S. Appl. No. 14/883,122, 12 pages (PER-019-DIV-CON-2), Doc 0999.
Patel—Notice of Allowance dated Nov. 2, 2016 for U.S. Appl. No. 14/883,122, 21 pages (PER-019-DIV-CON-2), Doc 1010.
Dang—Notice of Allowance dated Jan. 25, 2013 for U.S. Appl. No. 12/735,954, 57 pages (PER-024-PAP), Doc 0839.
Dang—Office Action dated Feb. 26, 2014 for U.S. Appl. No. 12/735,954, 34 pages. (PER-024-PAP), Doc 0892.
EPO—Communications pursuant to Article 94(3) EPC from EPO dated Mar. 22, 2010 for Application No. EP05763216.8, 7 pages, Doc 0733.
EPO—Communication under Rule 71(3) EPC for Application No. EP05763216.8, dated Apr. 25, 2014, 47 pages, Doc 0902.
JPO—Notice of Reasons for Refusal for Application No. 2007-518298, dated Jul. 13, 2010, 9 pages, Doc 0747.
Peregrine—Amendment for Application No. JP2007518298, dated Oct. 15, 2010, 10 pages, Doc 0761.
JPO—Notice of Reasons for Refusal for Application No. JP2010232563, dated Mar. 23, 2011, 7 pages, Doc 0770.
WIPO—Corrected Publication for Application No. PCT/US02/32266 dated Apr. 17, 2003, 66 pages (4200-116PCT), Doc 2000.
WIPO—Correction of entry in Section I of the PCT Gazette for Application No. PCT/US02/32266 dated Apr. 17, 2003, 2 pages (4200-116PCT), Doc 2001.
WIPO—International Publication without Search Report for Application No. PCT/US02/32266 dated Apr. 17, 2003, 65 pages (4200-116PCT), Doc 2003.
WIPO—International Publication for Application No. PCT/US02/32266 dated Apr. 17, 2003, 3 pages (4200-116PCT), Doc 2002.
PCT—International Preliminary Examination Report for Application No. PCT/US02/32266 dated Sep. 27, 2004, 13 pages (4200-116PCT), Doc 2004.
PCT—International Search Report for Application No. PCT/US2005/022407, dated Nov. 15, 2005 2 pages, Doc 0633.
Peregrine—Communication Pursuant to Article 94(3) EPC from EPO dated Jun. 19, 2008 for Application No. EP02800982.7, 3 pages (PER-001-EPO), Doc 0664.
Peregrine—EP Response dated Dec. 23, 2008 for Application No. EP02800982.7, 22 pages (PER-001-EPO), Doc 0680.
EPO—Communication pursuant to Rule 94(3) EPC for Application No. EP02800982.7, dated Aug. 6, 2009, 2 pages (PER-001-EPO), Doc 0703.
Peregrine—EP Response filed Oct. 7, 2009 for Application No. EP02800982.7, 23 pages (PER-001-EPO), Doc 0715.
EPO—Communication under Rule 71(3) EPC and Annex Form 2004 for Application No. EP02800982.7, dated Nov. 27, 2009, 68 pages (PER-001-EPO), Doc 0717.
EPO—Communication of a Notice of Opposition for Application No. EP02800982.7, dated Nov. 8, 2011, 33 pages (PER-001-EPO), Doc 0793.
Huber—Response to Notice of Opposition for Application No. EP1451890, dated Apr. 17, 2012, 46 pages (PER-001-EPO), Doc 0809.
Huber—Response for Application No. EP10011669.8, dated May 15, 2012, 19 pages (PER-001-EPO), Doc 0816.
EPO—Summons to Attend Oral Proceedings pursuant to Rule 115(1) EPC, dated Oct. 17, 2013 for Application No. EP02800982.7, 20 pages (PER-001-EPO), Doc 0873.
Huber—Response to Summons to attend Oral Proceedings dated Oct. 17, 2013 for Application No. EP02800982.7, dated Jan. 9, 2014 21 pages (PER-001-EPO), Doc 0882.
Nguyen—Notice of Allowance for U.S. Appl. No. 13/277,108, dated Jan. 10, 2014, 47 pages (PER-001-EPO), Doc 0883.
EPO—Brief Communication regarding Oral Proceedings for Application No. EP02800982.7, dated Jan. 16, 2014, 1 pages (PER-001-EPO), Doc 0884.
Huber—Report on Decision in EPO Opposition Division for Application No. EP02800982.7, dated Feb. 25, 2014, 13 pages (PER-001-EPO), Doc 0891.
EPO—Communication Pursuant to Article 101(1) and 81(2) to (3) EPC for Application No. EP02800982.7, dated Mar. 3, 2014, 7 pages (PER-001-EPO), Doc 0893.
EPO—Provision of a copy of the minutes in accordance with Rule 124(4) EPC for Application No. EP02800982.7, dated Apr. 10, 2014, 11 pages (PER-001-EPO), Doc 0900.
EPO—Brief Communication for Application No. EP02800982.7, dated May 8, 2014, 2 pages (PER-001-EPO), Doc 0905.
Huber—Reply to Official Communication for Application No. EP02800982.7, dated May 8, 2014, 84 pages (PER-001-EPO), Doc 0906.
EPO—Brief Communication dated Aug. 14, 2014 for Application No. EP02800982.7, dated Aug. 14, 2014, 2 pages (PER-001-EPO), Doc 0920.
EPO—Brief Communication from EPO for Application No. EP02800982.7, dated Oct. 24, 2014, 2 pages (PER-001-EPO), Doc 0934.
EPO—Interlocutory Decision in Opposition Proceedings for Application No. EP02800982.7, dated Nov. 14, 2014, 79 pages (PER-001-EPO), Doc 0935.
EPO—Request for Grant of a Divisional Patent, Application No. EP10011669.8, dated Sep. 29, 2010, 73 pages (PER-001-EPO-DIV-1), Doc 2081.
EPO—Noting of Loss of Rights Rule 112(1) EPC for Application No. EP10011669.8, dated Dec. 15, 2010, 4 pages (PER-001-EPO-DIV-1), Doc2082.
Huber—Response to Noting of Loss of Rights Rule 112(1) EPC for Application No. EP10011669.8, dated Dec. 21, 2010, 5 pages (PER-001-EPO-DIV-1), Doc 2083.
EPO—Communication Under Rule 112(2) EPC for Application No. EP10011669.8, dated Feb. 15, 2011, 1 page (PER-001-EPO-DIV-1), Doc 2084.
EPO—Communication Pursuant to Rule 58 EPC Invitation to Remedy Deficiencies in the Application Documents for Application No. EP10011996.8, dated Mar. 1, 2011, 3 pages (PER-001-EPO-DIV-1), Doc 2085.
Huber—Response to Invitation to Remedy Deficiencies Pursuant to Rule 58 EPC dated Mar. 1, 2011 for Application No. EP10011669.8, dated Mar. 25, 2011, 14 pages (PER-001-EPO-DIV-1), Doc 2086.
Huber—Response to the Communication Pursuant to Rule 19(1)EPC dated Mar. 23, 2011 for Application No. EP10011669.8, dated Apr. 15, 2011, 1 page (PER-001-EPO-DIV-1), Doc 2087.

(56) References Cited

OTHER PUBLICATIONS

EPO—Extended European Search Report for Application No. EP10011669.8, dated Sep. 30, 2011, 8 pages (PER-001-EPO-DIV-1), Doc 2088.
EPO—Notification of European Publication Number and Information on the Application of Article 67(3) EPC for Application No. EP10011669.8, dated Oct. 19, 2011, 2 pages (PER-001-EPO-DIV-1), Doc 2089.
EPO—Communication Pursuant to Rule 69 EPC Reminder Concerning Payment of the Designation Fee and the Examination Fee for Application No. EP10011669.8, dated Nov. 21, 2011, 2 pages (PER-001-EPO-DIV-1), Doc 2090.
Huber—Response to Communication dated Nov. 21, 2011 for Application No. EP10011669.8, dated May 15, 2012, 19 pages (PER-001-EPO-DIV-1), Doc 2091.
EPO—Payment of Fees and Costs for Application No. EP10011669.8, dated Oct. 31, 2012, 1 page (PER-001-EPO-DIV-1), Doc 2092.
EPO—Communication Pursuant to Article 94(3) EPC for Application No. EP10011669.8, dated Apr. 9, 2014, 5 pages (PER-001-EPO-DIV-1), Doc 2093.
Huber—Response to Communication Pursuant to Article 94(3) EPC dated Apr. 9, 2014 for Application No. EP10011669.8, dated Aug. 6, 2014, 1 page (PER-001-EPO-DIV-1), Doc 2094.
EPO—Extension of Time Limit Pursuant to Rule 132(2) EPC for Application No. EP10011669.8, dated Aug. 12, 2014, 1 paoe (PER-001-EPO-DIV-1), Doc 2095.
Huber—Response to Office Action dated Apr. 9, 2014 for Application No. EP10011669.8, dated Oct. 14, 2014, 30 pages (PER-001-EPO-DIV-1), Doc 0971.
Huber—Response to Office Action dated Apr. 9, 2014 for Application No. EP10011669.8, dated Oct. 14, 2014, 30 pages (PER-001-EPO-DIV-1), Doc 2096.
Huber—Acknowledgement of Receipt of Response to Office Action dated Apr. 9, 2014 forApplication No. EP10011669.8, dated Oct. 14, 2014, 30 pages (PER-001-EPO-DIV-1), Doc 2097.
EPO—CDS Clean Up—Amended Data Concerning the Representative for the Applicant for Application No. EP10011669.8, dated Dec. 23, 2014, 1 page (PER-001-EPO-DIV-1), Doc 2098.
Huber—Enquiry as to when a Communication from the Examining Division can be Expected for Application No. EP10011669.8, dated Oct. 12, 2015, 1 page (PER-001-EPO-DIV-1), Doc 2099.
EPO—Response to Enquiry for Communication from the Examining Division for Application No. EP10011669.8, dated Oct. 16, 2015, 1 page (PER-001-EPO-DIV-1), Doc 2100.
EPO—Communication Under Rule 71(3) EPC for Application No. EP10011669.8, dated Dec. 1, 2015, 78 pages (PER-001-EPO-DIV-1), Doc 2101.
Huber—Response to Communication dated Dec. 1, 2015 for Application No. EP10011669.8, dated Mar. 16, 2016, 11 pages (PER-001-EPO-DIV-1), Doc 2102.
EPO—Decision to Grant a European Patent Pursuant to Article 97(1) EPC for Application No. EP10011669.8 dated Apr. 7, 2016, 2 pages (PER-001-EPO-DIV-1), Doc 2103.
EPO—Transmission of the Certificate for a European Patent Pursuant to Rule 74 EPC for Application No. EP10011669.8, dated May 4, 2016, 1 page (PER-001-EPO-DIV-1), Doc 2104.
EPO—Communication Regarding the Expiry of the Time Limit Within Which Notice of Opposition May be Filed for Application No. EP10011669.8, dated Mar. 10, 2017, 1 page (PER-001-EPO-DIV-1), Doc 2105.
EPO—Request for Grant of European Divisional Patent for Application No. EP16020116.6, dated Apr. 6, 2016, 62 pages (PER-001-EPO-DIV-1-DIV), Doc 2106.
EPO—Payment of Fees and Costs for Application No. EP16020116.6, dated May 3, 2016, 2 page (PER-001-EPO-DIV-1-DIV), Doc 2107.
EPO—Communication Pursuant to Rule 58 EPC Invitation to Remedy Deficiencies in the Application Documents for Application No. EP16020116.6 dated May 19, 2016, 4 pages (PER-001-EPO-DIV-1-DIV), Doc 2108.
Huber—Response to Official Communication dated May 19, 2016 for Application No. EP16020116.6, dated May 31, 2016, 14 pages (PER-001-EPO-DIV-1-DIV), Doc 2109.
Huber—Response to Invitation to Remedy Deficiencies to (R. 58 EPC) dated May 19, 2014 for Application No. EP16020116.6, dated Jul. 28, 2016, 6 pages (PER-001-EPO-DIV-1-DIV), Doc2110.
EPO—Payment of Fees and Costs for Application No. EP16020116.6, dated Aug. 3, 2016, 2 page (PER-001-EPO-DIV-1-DIV), Doc 2111.
EPO—Notice of Debiting of Fees for Application No. EP16020116.6, dated Aug. 17, 2016, 1 page (PER-001-EPO-DIV-1-DIV), Doc 2112.
Huber—Addition to Letter dated Jul. 28, 2016 for Application No. EP16020116.6, dated Sep. 6, 2016, 2 pages (PER-001-EPO-DIV-1-DIV), Doc 2113.
EPO—Payment of Fees and Costs for Application No. EP16020116.6, dated Oct. 24, 2016, 2 pages (PER-001-EPO-DIV-1-DIV), Doc 2114.
EPO—Notice of Debiting of Fees for Application No. EP16020116.6, dated Nov. 4, 2016, 1 page (PER-001-EPO-DIV-1-DIV), Doc 2115.
EPO—Extended European Search Report for Application No. EP16020116.6, dated Dec. 6, 2016, 9 pages (PER-001-EPO-DIV-1-DIV), Doc 2116.
EPO—Notification of European Publication Number and Information on the Application of Article 67(3) EPC for Application No. EP16020116.6, dated Dec. 7, 2016, 2 pages (PER-001-EPO-DIV-1-DIV), Doc 2117.
EPO—Refund of fees for Application No. EP16020116.6, dated Dec. 14, 2016, 1 page (PER-001-EPO-DIV-1-DIV), Doc 2118.
EPO—Communication Pursuant to Rule 69 EPC Reminder Concerning Payment of the Designation Fee and the Examination Fee for Application No. EP16020116.6, dated Jan. 10, 2017, 2 pages (PER-001-EPO-DIV-1-DIV), Doc 2119.
EPO—Noting of Loss of Rights Pursuant to Rule 112(1) EPC for Application No. EP16020116.6, dated Aug. 11, 2017, 2 pages (PER-001-EPO-DIV-1-DIV), Doc 2120.
EPO—Final Instructions (application deemed to be withdrawn/application refused) for Application No. EP16020116.6, dated Nov. 21, 2017, 1 page (PER-001-EPO-DIV-1-DIV), Doc 2121.
Huber—Additions to Response dated Jul. 28, 2016 for Application No. EP16020116.6, dated Sep. 6, 2016, 2 pages (PER-001-EPO-DIV-2), Doc 1001.
EPO—Extended Search Report for Application No. EP16020116.6, dated Dec. 6, 2016, 9 pages (PER-001-EPO-DIV-2), Doc 1012.
TMI Associates—Letter Regarding Office Action Response for Application No. JP2003-535287, dated Nov. 30, 2005, 1 page (PER-001-JP), Doc 2342.
JPO—Notice of Reasons for Refusal for Application No. JP2003535287, dated Feb. 9, 2006, 5 pages (PER-001-JP), Doc 0638.
TMI Associates—Letter Regarding Office Action for Application No. JP2003-535287, dated Mar. 1, 2006, 5 pages (PER-001-JP), Doc 2343.
Kuhn—Expert Testimony of Kuhn for Application No. JP2003-535287, dated Aug. 3, 2006, 12 pages (PER-001-JP), Doc 2337.
Kuhn—Response to JP Final Rejection for Application No. JP2003-535287, dated Aug. 3, 2006, 32 pages (PER-001-JP) , Doc 2339.
J&A—Letter Regarding Replying to Final Rejection dated Feb. 13, 2006 for Application No. JP2003-535287, dated Aug. 7, 2006, 4 pages (PER-001-JP), Doc 2338.
Peregrine—JP Response to Notice of Refusal for Application No. JP2003535287, dated Aug. 14, 2006, 10 pages (PER-001-JP), Doc 0647.
JPO—Notice of Reasons for Refusal for Application No. JP2003535287, dated Oct. 5, 2006, 7 pages (PER-001-JP), Doc 0650.
TMI Associates—Confirmation of Letter Regarding Response to Office Action for Application No. JP2003-535287, dated Oct. 5, 2006, 3 pages (PER-001-JP), Doc 2341.
J&A—Letter Regarding Invoice for Application No. JP2003-535287, dated Jan. 25, 2006, 2 pages (PER-001-JP), Doc 2334.
Burgener—Email Regarding No Longer Pursuing Application for Application No. JP2003-535287, dated Jan. 5, 2007, 1 page (PER-001-JP), Doc 2335.

(56) References Cited

OTHER PUBLICATIONS

TMI Associates—Letter Regarding Extension of Time for Response to Office Action for Application No. JP2003-535287, dated Feb. 23, 2007, 1 page (PER-001-JP), Doc 2344.
Burgener—Email Regarding Abandoning Application for Application No. JP2003-535287, dated Jan. 5, 2007, 1 page (PER-001-JP), Doc 2336.
TMI Associates—Letter Regarding Closing Matter for Application No. JP2003-535287, dated Apr. 4, 2007, 2 pages (PER-001-JP), Doc 2340.
J&A—Letter Responding to Office Action with Replacement Claims for Application JP2003-535287, dated Nov. 10, 2015, 16 pages (PER-001-JP), Doc2332.
PCT—International Search Report from USRO dated Mar. 28, 2003 for Application No. PCT/US02/32266, 2 pages (PER-001-PCT), Doc 0586.
Peregrine—Communication and supplementary European Search Report dated Nov. 27, 2009 for Application No. EP05763216.8, 7 pages (PER-006-CIP-EPO), Doc 0718.
L&P—Response to Communication Pursuant to Article 94(3) dated Jan. 21, 2013 for Application No. EP05763216.8, 17 pages (PER-006-CIP-EPO), Doc 0863.
EPO—Decision to Grant EP Patent pursuant to Article 97(1) EPC for Application No. EP05763216.8, dated Sep. 4, 2014, 2 pages (PER-006-CIP-EPO), Doc 0927.
L&P—Response to Invitation Pursuant to Rule 58 EPC dated Oct. 9, 2014 for Application No. EP14182150.4, dated Dec. 4, 2014, 6 pages (PER-006-CIP-EPO-DIV-1), Doc 0939.
EPO—Invitation Pursuant to Rule 63(1) EPC for Application No. EP14182150.4, dated Mar. 3, 2015, 3 pages (PER-006-CIP-EPO-DIV-1), Doc 0953.
L&P—Response to Invitation Pursuant to Rule 63(1) for Application No. EP14182150.4, dated Apr. 29, 2015, 12 pages (PER-006-CIP-EPO-DIV-1), Doc 0962.
EPO—Extended Search Report for Application No. EP14182150.4, dated Jun. 11, 2015, 9 pages (PER-006-CIP-EPO-DIV-1), Doc 0965.
EPO—Communication pursuant to Article 94(3) EPC for Application No. EP14182150.4, dated Jul. 2, 2018, 4 pages (PER-006-CIP-EPO-DIV-1), Doc 1056.
EPO—Communication under Rule 71(3) EPC for Application No. EP14182150.4, dated Nov. 2, 2018, 82 pages (PER-006-CIP-EPO-DIV-1), Doc 1068.
PCT—Chapter II Demand filed Aug. 17, 2012 for Application No. PCT/US2011/056942, 41 pages (PER-106-CIP-PCT), Doc 0824.
EPO—Information on Entry into European Phase for Application No. EP06814836.0, dated Feb. 1, 2008, 3 pages (PER-015-CIP-EPO), Doc2138.
EPO—Request for Entry into the European Phase for Application for EP06814836.0, dated Mar. 13, 2008, 5 pages (PER-015-CIP-EPO), Doc 2139.
EPO—Amendments Received Before Examination for Application No. EP06814836.0, dated Mar. 31, 2008, 15 pages (PER-015-CIP-EPO), Doc 2140.
EPO—Communication Pursuant to Rules 161 and 162 EPC for Application No. EP06814836.0, dated Apr. 22, 2008, 2 pages (PER-015-CIP-EPO), Doc 2141.
EPO—Communication of European Publication Number and Information on Application of Article 67(3) EPC for Application No. EP06814836.0, dated May 2, 2008, 1 page (PER-015-CIP-EPO), Doc 2142.
PCT—Notification of Transmittal of the International Search Report and the Written Opinion of the International Searching Authority, or the Declaration for Application No. PCT/US06/036240, dated Jul. 3, 2008, 10 pages (PER-015-CIP-EPO), Doc 2145.
EPO—Enquiry with the International Bureau for Application No. EP06814836.0, dated Aug. 18, 2008, 1 page (PER-015-CIP-EPO), Doc 2143.
EPO—Reply by International Bureau for Application No. EP06814836.0, dated Sep. 3, 2008, 1 page (PER-015-CIP-EPO), Doc 2144.
EPO—Letter Accompanying Subsequently Filed Items for Application No. EP06814836.0, dated Sep. 4, 2008, 1 page (PER-015-CIP-EPO), Doc 2146.
PCT—International Preliminary Report on Patentabliity for Application No. PCT/US06/036240, filed Sep. 15, 2006, 6 pages (PER-015-CIP-EPO), Doc 2147.
WIPO—Partial Publication with International Search Report for Application No. PCT/US06/036240, dated Mar. 29, 2007, 3 pages (PER-015-CIP-PCT), Doc 2148.
EPO—Extended European Search Report for Application No. EP06814836.0, dated Feb. 17, 2010, 7 pages (PER-015-CIP-EPO), Doc 2149.
EPO—Proceeding Further with European Patent Application Pursuant to Rule 70(2) EPC for Application No. EP06814836.0, dated Mar. 8, 2010, 1 page (PER-015-CIP-EPO), Doc 2150.
EPO—Letter Accompanying Subsequently Filed Items for Application No. EP06814836.0, dated Mar. 26, 2010, 3 page (PER-015-CIP-EPO), Doc 2151.
EPO—Communication Pursuant to Article 94(3) EPC for Application No. EP06814836.0, dated Apr. 14, 2010, 1 page (PER-015-CIP-EPO), Doc 2152.
SIB—Request for Extension of Time Limit Under Rule 132(2) EPC for Application No. EP06814836.0, dated Aug. 4, 2010, 1 page (PER-015-CIP-EPO), Doc 2153.
EPO—Extension of Time Under Rule 132(2) EPC for Application No. EP06814836.0, dated Aug. 9, 2010, 1 page (PER-015-CIP-EPO), Doc 2154.
Peregrine—EP Response filed for Application No. EP06814836.0 dated Oct. 12, 2010, 25 pages (PER-015-CIP-EPO), Doc 0756.
SIB—Response to Communication dated Feb. 17, 2010 for Application No. EP06814836.0, dated Oct. 12, 2010, 25 pages (PER-015-CIP-EPO), Doc 2155.
SIB—Enquiry as to When a Communication from the Examining Division Can be Expected for Application No. EP06814836.0, dated Apr. 11, 2013, 1 page (PER-015-CIP-EPO), Doc 2156.
EPO—Notice Regarding Examination Started for Application No. EP06814836.0, dated Dec. 12, 2013, 1 page (PER-015-CIP-EPO), Doc 2157.
EPO—Communication Pursuant to Article 94(3) EPC for Application No. EP06814836.0, dated Dec. 18, 2013, 5 pages (PER-015-CIP-EPO), Doc 2158.
EPO—Noting of Loss of Rights Pursuant to Rule 112(1) EPC for Application No. EP06814836.0, dated May 27, 2014, 1 page (PER-015-CIP-EPO), Doc 2159.
EPO—Closure of the Procedure in Respect of Application for Application No. EP06814836.0, dated Aug. 26, 2014, 1 page (PER-015-CIP-EPO), Doc 2160.
Peregrine—Request Form for Application No. PCT/US06/036240, dated Sep. 15, 2006, 5 pages (PER-015-CIP-PCT), Doc 2133.
WIPO—Initial Publication without International Search Report for Application No. PCT/US06/036240, dated Mar. 29, 2007, 107 pages (PER-015-CIP-PCT), Doc2134.
TAT—International Search Report and Written Opinion from USRO dated Jul. 3, 2008 for Application No. PCT/US06/36240, 10 pages (PER-015-CIP-PCT), Doc 0666.
PCT—Written Opinion of the International Searching Authority for Application No. PCT/US06/036240, dated Jul. 3, 2008, 5 pages (PER-015-CIP-PCT), Doc 2136.
PCT—International Preliminary Report on Patentability for Application No. PCT/US06/036240, filed Sep. 15, 2006, 6 pages (PER-015-CIP-PCT), Doc 2137.
WIPO—Partial Publication with International Search Report for Application No. PCT/US06/036240, dated Mar. 29, 2007, 3 pages (PER-015-CIP-PCT), Doc2135.
GPO—Office Action for Application No. DE112011103554.3, dated May 18, 2017, 15 pages (PER-016-CIP-DE), Doc 2348.
Huber—Response to Office Action for Application No. DE112011103554.3, dated Nov. 28, 2017, 26 pages (PER-016-CIP-DE), Doc 2349.
Huber—Pending Claims for Application No. PCT/US2011/056942, dated Jan. 22, 2013, 10 pages (PER-016-CIP-JP), Doc 2350.

(56) References Cited

OTHER PUBLICATIONS

Steinfl & Bruno—Letter Regarding Filing Receipt for Application No. JP2013-535054, dated Aug. 19, 2013, 1 paQe (PER-016-CIP-JP), Doc 2351.
Steinfl & Bruno—Letter Regarding Examination Requested for Application No. JP2013-535054, dated Oct. 14, 2014, 1 page (PER-016-CIP-JP), Doc 2357.
Translation of JP Office Action for Application No. JP2013-535054, dated Dec. 1, 2015, 3 pages (PER-016-CIP-JP), Doc 2358.
Comment Regarding Response to Office Action for Application No. JP2013-535054, dated Jan. 19, 2016, 3 pages (PER-016-CIP-JP), Doc 2362.
Steinfl & Bruno—Letter Regarding Office Action for Application No. JP2013-535054, dated Jan. 21, 2016, 1 page (PER-016-CIP-JP), Doc 2363.
Peregrine—Request for Extension of Time for Application No. JP2013-535054, dated Feb. 29, 2016 (PER-016-CIP-JP), Doc 2355.
Peregrine—Amendment for Application No. JP2013-535054, dated Mar. 31, 2016, 31 pages (PER-016-CIP-JP), Doc 0994.
Peregrine—Amendment for Application No. JP2013-535054, dated Mar. 31, 2016, 13 pages (PER-016-CIP-JP), Doc 2353.
Peregrine—Opinion for Application No. JP2013-535054, dated Mar. 31, 2016, 10 pages (PER-016-CIP-JP), Doc 2354.
Steinfl & Bruno Letter Reporting Response to Office Action for Application No. JP2013-535054, dated Apr. 15, 2016, 1 page (PER-016-CIP-JP), Doc 2364.
Peregrine—Decision to Grant a Patent for Application No. JP2013-535054, dated Aug. 2, 2016, 6 pages (PER-016-CIP-JP), Doc 2359.
Steinfl & Bruno—Letter Reporting Notice of Allowance for Application No. JP2013-535054, dated Aug. 15, 2016, 2 pages (PER-016-CIP-JP), Doc 2360.
Allowed Claims for Application No. JP2013-535054, dated Aug. 15, 2016, 10 pages (PER-016-CIP-JP), Doc 2361.
Peregrine—Letter of Payment of Patent Fee for Application No. JP2013-535054, dated Sep. 8, 2016, 2 pages (PER-016-CIP-JP), Doc 2366.
Steinfl & Bruno—Letter Regarding Issue Fee and Maintenance Fees Paid for Application No. JP2013-535054, dated Sep. 13, 2016, 1 page (PER-016-CIP-JP), Doc 2365.
Steinfl & Bruno—Letter Reporting Letters Patent for Application No. JP2013-535054, dated Oct. 24, 2016, 4 pages (PER-016-CIP-JP), Doc 2367.
JPO—Notice of Reasons for Refusal for Application JP2016-175339, dated Jun. 19, 2017, 7 pages (PER-016-CIP-JP-DIV), Doc 1029.
Request for Divisional Application for Application No. JP2016175339, dated Sep. 8, 2016, 163 pages (PER-016-CIP-JP-DIV-1), Doc 2369.
File History for Application No. JP20160175339, dated Sep. 8, 2016, 264 pages (PER-016-CIP-JP-DIV-1), Doc 2376.
Steinfl & Bruno—Letter Reporting Divisional Application as Filed for Application No. JP2016-175339, dated Sep. 13, 2016, 2 pages (PER-016-CIP-JP-DIV-1), Doc 2378.
Request for Examination for Application No. JP2016175339, dated Oct. 6, 2016, 11 pages (PER-016-CIP-JP-DIV-1), Doc 2370.
Request for Examination for Application No. JP2016175339, dated Oct. 6, 2016, 2 pages (PER-016-CIP-JP-DIV-1), Doc 2391.
Steinfl & Bruno—Letter Reporting Exam Requested for Application No. JP2016-175339, dated Oct. 10, 2016, 1 page (PER-016-CIP-JP-DIV-1), Doc2379.
Correction of Defective Abstract for Application No. JP2016175339, dated Nov. 28, 2016, 2 pages (PER-016-CIP-JP-DIV-1), Doc 2392.
Notice of Reasons for Rejection for Application No. JP2016175339, dated Jun. 27, 2017, 14 pages (PER-016-CIP-JP-DIV-1), Doc 2377.
Steinfl & Bruno—Debit Report JP Office Action for Application No. JP2016-175339, dated Jul. 26, 2017, 1 page (PER-016-CIP-JP-DIV-1), Doc2375.
Notice of Reason for Rejection for Application No. JP2016175339, dated Feb. 27, 2018, 8 pages (PER-016-CIP-JP-DIV-1), Doc 2384.
Translation of JP Office Action for Application No. JP2016-175339, dated Feb. 27, 2018, 4 pages (PER-016-CIP-JP-DIV-1), Doc 2385.
Comment Regarding Response to Office Action for Application No. JP2016-175339, dated Mar. 26, 2018, 10 pages (PER-016-IP-JP-DIV-1), Doc 2386.
Decision to Refuse for Application No. JP2016175339, dated Oct. 30, 2018, 20 pages (PER-016-CIP-JP-DIV-1), Doc 2390.
WIPO—Publication with International Search Report for Application No. PCT/US06/026965, dated Jan. 18, 2007, 112 pages (PER-016-CIP-PCT), Doc 2127.
PCT—International Search Report for Application No. PCT/U82011/056942, dated 2/2772012, 12 paces (PER-016-CIP-PCT), Doc 0801.
Brindle—Application as Filed for-.Apo[ication No. PCT/US1110569942, filed Oct. 19, 2011, 112 pages (PER-016-CIP-PCT), Doc2128.
WIPO—Publication with International Search Report for Application No. PCT/US11/056942, dated Apr. 26, 2012, 116 pages (PER-016-CIP-PCT), Doc 2130.
PCT—First Notice Informing the Applicant of the Communication of the International Application for Application No. PCT/US11/056942, dated May 24, 2012, 1 page (PER-016-CIP-PCT), Doc 2129.
Huber—Technical Comments to Written Opinion of the IPEA dated Dec. 21, 2012 for Application No. PCT/US2011/056942, dated Jan. 21, 2013, 27 pages (PER-016-CIP-PCT), Doc 0833.
PCT—International Preliminary Report on Patentability from EPO dated Feb. 6, 2013 for Application No. PCT/US2011/056942, 27 pages (PER-016-CIP-PCT), Doc 0841.
PCT—Written Opinion of the International Searching Authority for Application No. PCT/US111056942, filed Oct. 19, 2011, 8 pages (PER-016-CIP-PCT), Doc2131.
PCT—International Preliminary Report on Patentability for Application No. PCT/US11/056942, filed Oct. 19, 2011, 27 paqes (PER-016-CIP-PCT), Doc2132.
CN Office Action dated Jul. 31, 2009 for Application No. CN200680025128.7, 10 pages (PER-16-CN), Doc 0701.
Translation of CN Response dated Nov. 30, 2009 for Application No. CN200680025128.7, 13 pages (PER-016-CN), Doc 0722.
Translation ofOffice Action dated Nov. 2, 2011 forApplication No. CN200680025128.7, 16 pages (PER-016-CN), Doc 0792.
Translation of CN Response dated Mar. 1, 2012 for Application No. CN200680025128.7, 14 page (PER-016-CN), Doc 0802.
L&P—Letter to Client Regarding Proposed Amendments for Application No. CN200680025128.7, dated Jun. 12, 2012, 2 pages (PER-016-CN), Doc 2394.
L&P—Proposed Claims for Application No. CN200680025128.7, dated Jun. 12, 2012, 10 pages (PER-016-CN), Doc 2395.
L&P—Letter Regarding Claim Amendments for Application No. CN200680025128.7, dated Jun. 20, 2012, 12 pages (PER-016-CN), Doc 2397.
L&P—Letter to Client Regarding Response to Office Action filed for Application No. CN200680025128.7, dated Jun. 29, 2012, 1 page (PER-016-CN), Doc2396.
Brindle—Particulars of Letters Patent for Application No. CN200680025128.7 dated Dec. 16, 2013.pages (PER-016-CN), Doc 2393.
JPO—Notice for Reasons for Refusal for Application No. JP2013-003388, dated Feb. 27, 2014, 9 pages (PER-016-DIV-JAPAN), Doc 0896.
Peregrine—Amendment for Application No. JP2013-003388, dated Jul. 9, 2014, 17 pages (PER-016-DIV-JP), Doc 0912.
EPO—Request for entry into the European Phase and Claims forApplication No. EP02800982.7 dated Apr. 28, 2004, 15 pages (PER-001-EPO), Doc2009.
EPO—Communication to designated inventor for Application No. EP02800982.7 dated May 19, 2004, 2 pages (PER-001-EPO), Doc 2010.
EPO—Communication Pursuant to Rules 109 and 110 EPC for Application No. EP02800982.7 dated May 27, 2004, 2 pages (PER-001-E'PO), Doc 2011.
EPO—Communication regardino Intgrnational Preliminary Examination Report for Application No. EP02800982.7 dated Jul. 15, 2004, 1 page (PER-001-EPO), Doc 2012.

(56) References Cited

OTHER PUBLICATIONS

EPO—Reply to Communication regarding International Preliminary Examination Report for Application No. EP02800982.7 dated Jul. 15, 2004, 1 page (PER-001-EPO), Doc 2013.
EPO—Supplementary European Search Report for Application No. EP02800982.7 dated Oct. 1, 2004, 3 pages (PER-001-EPO), Doc 2014.
EPO—Proceeding Further with the European Patent Application Pursuant to Article 96(1) and Rule 51(1) EPC for Application No. EP02800982.7 dated Oct. 5, 2004, 1 page (PER-001-EPO), Doc 2015.
PCT—International Preliminary Search Report and Claims for Application No. PCT/US02/32266 dated Sep. 27, 2004, 16 pages (PER-001-EPO), Doc 2016.
Huber—Amendments received before examination for Application No. EP02800982.7 dated Dec. 6, 2004, 19 pages (PER-001-EPO), Doc 2018.
EPO—Notice Regarding Fees for Application No. EP02800982.7 dated Dec. 9, 2005, 1 page (PER-001-EPO), Doc 2019.
Brinole—Application as Filed for Application No. EP06786943.8, filed Sep. 11, 2006, 107 pages (PER-016-EPO), Doc 2161.
PCT—Notification Relating to Priority Claim for Application No. PCT/US06/026965, dated Oct. 19, 2006, 2 pages (PER-016-EPO), Doc 2162.
PCT—Notification Relating to Priority Claim for Application No. PCT/US06/026965, dated Nov. 1, 2006, 1 paqes (PER-016-EPO), Doc 2163.
PCT—International Search Report and Written Opinion from EPO dated Nov. 7, 2006 for Application No. PCT/US2006/026965, 19 pages (PER-016-EPO), Doc 0652.
EPO—Notice Regarding Fees for Application No. EP02800982.7 dated Nov. 27, 2006, 1 page (PER-001-EPO), Doc 2020.
WIPO—Publication with International Search Report for Application No. PCT/US06/026965, dated Jan. 18, 2007, 112 pages (PER-016-EPO), Doc 2164.
PCT—Invitation to Correct Defects in Demand for Application No. PCT/US06/026965, dated Feb. 20, 2007, 11 pages (PER-016-EPO), Doc 2166.
PCT—Notification Concerning Documents Transmitted for Application No. PCT/US06/026965, dated Mar. 8, 2007, 1 page (PER-016-EPO), Doc 2167.
PCT—Invitation to Submit Amendments for Application No. PCT/US06/026965, dated May 25, 2007, 1 page (PER-016-EPO), Doc 2168.
EPO—Noting of Loss of Rights (R.69(1) EPC) for Application No. EP02800982.7 dated Jun. 4, 2007, 1 paqe (PER-001-EPO), Doc 2021.
PCT—International Preliminary Report on Patentability for Application No. PCT/US06/026965, dated Jun. 21, 2007, 24 pages (PER-016-EPO), Doc 2169.
EPO—Communication Pursuant to Rule 69(2) EPC for Application No. EP02800982.7 dated Aug. 9, 2007, 1 page (PER-001-EPO), Doc 2023.
EPO—Refund of fees for Application No. EP02800982.7 dated Aug. 16, 2007, 1 page (PER-001-EPO), Doc 2024.
EPO—Information on Entry into European Phase for Application No. EP06786943.8, dated Nov. 23, 2007, 3 pages (PER-016-EPO), Doc 2170.
EPO—Notice Drawing Attention to Article 86(2) EPC, Art 2 No. 5 of the Rules Relating to Fees—Payment of the Renewal Fee Plus Additional Fee for Application EP02800982.7 dated Dec. 5, 2007, 1 page (PER-001-EPO), Doc 2025.
EPO—Request for Entry into the European Phase for Application for EP06786943.8, dated Jan. 8, 2008, 7 pages (PER-016-EPO), Doc 2171.
EPO—Communication Pursuant to Rule 161 and 162 EPC for Application No. EP06786943.8, dated Feb. 21, 2008, 2 pages (PER-016-EPO), Doc 2172.
EPO—Notice Concerning Payment of Fees for Application No. EP06786943.8, dated Mar. 31, 2008, 1 page (PER-016-EPO), Doc 2173.
L&P—Reply to Communication Pursuant to Rules 161 and 162 EPC dated Feb. 21, 2008 for Application No. EP06786943.8, dated Apr. 1, 2008, 32 pages (PER-016-EPO), Doc 2174.
EPO—Confirmation of Receipt of Reply to Communication Pursuant to Rules 161 and 162 EPC dated Feb. 21 , 2008 for Application No. EP06786943.8, dated Apr. 7, 2008, 32 pages (PER-016-EPO), Doc 2175.
EPO—Communication Pursuant to Article 94(3) EPC for Application No. EP02800982.7 dated Jun. 19, 2008, 3 pages (PER-001-EPO), Doc 2026.
Huber—Response to Communication Pursuant to Article 94(3) EPC for Application No. EP02800982.7 dated Oct. 16, 2008, 1 page (PER-001-EPO), Doc 2027.
EPO—Extension of Time Limit Pursuant to Rule 132(2) EPC for Application No. EP02800982.7 dated Oct. 27, 2008, 1 page (PER-001-EPO), Doc 2028.
Huber—Reply to communication from the Examining Division for Application No. EP02800982.7 dated Dec. 23, 2008, 22 pages (PER-001-EPO), Doc 2029.
EPO—Communication Pursuant to Article 94(3) EPC for Application No. EP06786943.8, dated Feb. 4, 2009, 7 pages (PER-016-EPO), Doc 2176.
L&P—Request for Extension of Time Limit to Respond to Office Action for Application No. EP06786943.8, dated Jun. 2, 2009, 1 page (PER-016-EPO), Doc 2177.
EPO—Extension of Time Under Rule 132(2) EPC for Application No. EP06786943.8, dated Jun. 16, 2009, 1 page (PER-016-EPO), Doc 2178.
Huber—Enquiry as to when a communication from the Examining Division can be expected for Application No. EP02800982.7 dated Jul. 7, 2009, 1 page (PER-001-EPO), Doc 2030.
EPO—Response to enquiry for communication from the Examining Division for Application No. EP02800982.7 dated Jul. 14, 2009, 1 page (PER-001-EPO), Doc 2031.
EPO—Communication Pursuant to Article 94(3) EPC for Application No. EP02800982.7, dated Aug. 6, 2009, 2 pages (PER-001-EPO), Doc 2032.
L&P—Reply to Communication Pursuant to Article 94(3) EPC for Application No. EP06786943.8, dated Feb. 4, 2009, dated Aug. 13, 2009, 31 pages (PER-016-EPO), Doc2179.
EPO—Confirmation of Receipt for Reply to Communication Pursuant to Rule 94(3) EPC for Application No. EP06786943.8, dated Aug. 18, 2009, 31 pages (PER-016-EPO), Doc 2180.
Huber—Reply to Communication Pursuant to Article 94(3) EPC for Application EP02800982.7 dated Oct. 7, 2009 23 pages (PER-001-EPO), Doc 2033.
Huber—Confirmation of Reply to Communication Pursuant to Article 94(3) EPC for Application No. EP02800982.7 dated Oct. 9, 2009 23 pages (PER-001-EPO), Doc 2034.
EPO—Communication Pursuant to Rule 71(3)EPC for Application No. EP02800982.7 dated Nov. 27, 2009, 67 pages (PER-001-EPO), Doc 2035.
Huber—Response to Communication Pursuant to Article 71(3) EPC for Application No. EP02800982.7 dated Mar. 31, 2010, 29 pages (PER-001-EPO), Doc 2036.
EPO—After Communication Under Rule 71(3) EPC but Before Decision to Grant for Application No. EP02800982.7 dated Apr. 20, 2010, 3 pages (PER-001-EPO), Doc 2037.
L&P—Enquiry as to When a Communication from the Examining Division can be Expected for Application No. EP06786943.8, dated Nov. 2, 2010, 1 page (PER-016-EPO), Doc2181.
EPO—Response to Enquiry for Communication from the Examining Division for Application No. EP06786943.8, dated Nov. 17, 2010, 1 page (PER-016-EPO), Doc 2182.
EPO—Documents for grant of a patent for Application No. EP02800982.7 dated Nov. 29, 2010, 3 pages (PER-001-EPO), Doc 2038.
EPO—Amendment or Correction to Text Intended for Grant for Application No. EP02800982.7 dated Dec. 3, 2010, 1 page (PER-001-EPO), Doc 2039.

(56) References Cited

OTHER PUBLICATIONS

EPO—Decision to Grant a European Patent Pursuant to Article 97(1) EPC for Application No. EP02800982.7 dated Jan. 7, 2011, 2 pages (PER-001-EPO), Doc 2040.
L&P—Letter Concerning Fees and Payments for Application No. EP06786943.8, dated Jun. 27, 2011, 9 pages (PER-016-EPO), Doc2183.
L&P—Enquiry as to When a Communication from the Examining Division can be Expected for Application No. EP06786943.8, dated Jul. 11, 2011, 2 pages (PER-016-EPO), Doc 2184.
Peregrine—Summons to Attend Oral Proceedings Pursuant to Rule 115(1) from EPO dated Jul. 22, 2011 for Application No. EP06786943.8, 9 pages (PER-016-EPO), Doc0784.
EPO—Summons to Attend Oral Proceedings Pursuant to Rule 115(1) EPC for Application No. EP06786943.8, dated Jul. 22, 2011, 9 pages (PER-015-EPO), Doc 2185.
Deutsche Post—Advice of delivery for Application No. EP06786943.8, dated Jul. 27, 2011, 2 pages (PER-016-EPO), Doc2186.
Peregrine—EP Response filed Oct. 24, 2011 for Application No. EP06786943.8, 1 page (PER-016-EPO), Doc 0791.
L&P—Reply to Summons to Attend Oral Proceedings Issued on Jul. 22, 2011 for Application No. EP06786943.8, dated Oct. 24, 2011, 1 page (PER-016-EPO), Doc 2187.
EPO—Notice Regarding Maintenance/Change/Cancelation of Oral Proceedings for Application No. EP06786943.8, dated Oct. 25, 2011, 2 pages (PER-016-EPO), Doc 2188.
Shweiger—Notice of Opposition for Patent No. EP1451890, dated Oct. 31, 2011, 164 pages (PER-001-EPO), Doc 2041.
EPO—Notice Regarding Oral Proceedings for Application No. EP06786943.8, dated Nov. 4, 2011, 1 page (PER-016-EPO), Doc 2189.
EPO—Communication of a Notice of Opposition for Application No. EP02800982.7 dated Nov. 8, 2011, 1 page (PER-001-EPO), Doc 2042.
EPO—Brief Communication for Application No. EP02800982.7 dated Nov. 10, 2011, 1 page (PER-001-EPO), Doc 2043.
EPO—Decision to Refuse European Patent Application (Art. 97(2) EPC) dated Nov. 18, 2011 for Application No. EP06786943.8, dated Nov. 18, 2011, 5 pages (PER-016-EPO), Doc 2190.
Deutsche Post—Advice of delivery for Application No. EP06786943.8, dated Nov. 18, 2011, 2 pages (PER-016-EPO), Doc2191.
EPO—Communication of Opposition (R.79(1) EPC) for Application EP02800982.7, dated Dec. 7, 2011, 2 pages (PER-001-EPO), Doc 2044.
L&P—Notice of Appeal for Application No. EP 06786943.8, dated Jan. 17, 2012, 2 pages (PER-016-EPO), Doc 1086.
L&P—Notice of Appeal for Application No. EP06786943.8, dated Jan. 17, 2012, 2 pages (PER-016-EPO), Doc 2192.
L&P—Appeal to the Decision of Refusal dated Nov. 18, 2011 for Application No. EP06786943.8, dated Mar. 20, 2012, 27 pages (PER-016-EPO), Doc 2193.
Huber—Substantive Response to Opposition for Application EP02800982.7, dated Apr. 17, 2012, 46 pages (PER-001-EPO), Doc 2045.
EPO—Communication Regarding Opposition Proceedings for Application No. EP02800982.7, dated Apr. 23, 2012, 1 page (PER-001-EPO), Doc 2046.
EPO—Communication of Amended Entries Concerning the Representative (R.143(1)(h) EPC) for Application No. EP06786943.8, dated May 10, 2012, 1 page (PER-016-EPO), Doc 2194.
EPO—Notice Drawing Attention to Rule 51(2) EPC, Article 2 No. 5 of the Rules Relating to Fees-Payment of Renewal Fee Plus Additional Fee for Application No. EP06786943.8, dated Sep. 4, 2012, 2 pages (PER-016-EPO), Doc 2195.
EPO—Communication Indicating Deficiencies in the Notice of Opposition Which May be Remedied for Application No. EP02800982.7, dated Apr. 10, 2013, 3 pages (PER-001-EPO), Doc 2047.

Schweiger—Reply to the Communication Indicating Deficiencies in the Notice of Opposition Which May be Remedied for Application No. EP02800982.7, dated Jun. 11, 2013, 1 page (PER-001-EPO), Doc 2049.
EPO—Brief Communication for Application No. EP02800982.7, dated Jun. 17, 2013, 1 page (PER-001-EPO), Doc 2050.
EPO—Summons to Attend Oral Proceedings Pursuant to Rule 115(1) EPC for Application No. EP02800982.7, dated Oct. 17, 2013, 20 pages (PER-001-EPC), Doc 2051.
EPO—Form 2310 Requesting Acknowledgement of Receipt from Moore for Application No. EP02800982.7, dated Oct. 17, 2013, 3 pages (PER-001-EPO), Doc 2052.
EPO—Form 2310 Requesting Acknowledgement of Receipt from Schussler for Application No. EP02800982.7, dated Oct. 17, 2013, 1 pages (PER-001-EPO), Doc 2053.
Schweiger—Request for Interpreters During Oral Proceedings for Application No. EP02800982.7, dated Dec. 10, 2013, 1 page (PER-001-EPO), Doc 2055.
EPO—Brief Communication, Summons to Attend Oral Proceedings for Application No. EP02800982.7, dated Dec. 16, 2013, 1 page (PER-001-EPO), Doc 2056.
Schweiger—Response to Summons to Attend Oral Proceedings for Application No. EP02800982.7, dated Jan. 10, 2014, 35 pages (PER-001-EPO), Doc 2057.
EPO—Brief Communication Regarding Language for Oral Proceedings for Application No. EP02800982.7, dated Jan. 15, 2014, 1 page (PER-001-EPO), Doc 2058.
EPO—Brief Communication for Application No. EP02800982.7, dated Jan. 16, 2014, 1 page (PER-001-EPO), Doc 2059.
EPO—Brief Communication Regarding Summons to Attend Oral Proceedings for Application No. EP02800982.7, dated Jan. 17, 2014, 2 pages (PER-001-EPO), Doc 2060.
EPO—Brief Communication Regarding Summons to Attend Oral Proceedings for Application No. EP02800982.7, dated Jan. 28, 2014, 1 pages (PER-001-EPO), Doc 2061.
EPO—Information Regarding the Oral Proceedings for Application No. EP02800982.7, dated Feb. 12, 2014, 1 page (PER-001-EPO), Doc 2062.
EPO—Communication Pursuant to Article 101(1) and Rule 81(2) to (3) EPC for Application No. EP02800982.7, dated Mar. 3, 2014, 4 pages (PER-001-EPO), Doc 2063.
L&P—Letter Relating to Appeal Procedure for Application No. EP06786943.8, dated Mar. 25, 2014, 12 pages (PER-016-EPO), Doc 2196.
EPO—Provision of a Copy the Minutes in Accordance with Rule 124(4) EPC for Application No. EP02800982.7, dated Apr. 10, 2014, 11 pages (PER-001-EPO), Doc 2064.
Schweiger—Response to Communication Pursuant to Article 101(1) and Rule 81(2) to (3) EPC for Application No. EP02800982.7, dated May 2, 2014, 1 page (PER-001-EPO), Doc 2065.
Schweiger—Response to Communication Pursuant to Article 101(1) and Rule 81(2) to (3) EPC for Application No. EP02800982.7, dated May 2, 2014, 1 page (PER-001-EPO), Doc 2066.
Huber—Response to Official Communication of Mar. 3, 2014 for Application EP02800982.7, dated May 8, 2014, 83 pages (PER-001-EPO), Doc 2067.
EPO—Brief Communication Regarding Letter from Proprietor for Application No. EP02800982.7, dated May 14, 2014, 1 page (PER-001-EPO), Doc 2068.
EPO—Brief Communication Regarding Copies of Letter from Proprietor for Application No. EP02800982.7, dated Aug. 14, 2017, 2 pages (PER-001-EPO), Doc 2069.
L&P—Document Concerning Representation for Application No. EP06786943.8, dated Oct. 8, 2014, 2 pages (PER-016-EPO), Doc 2197.
L&P—Confirmation of Document Concerning Representation for Application No. EP06786943.8, dated Oct. 14, 2014, 2 pages (PER-016-EPO), Doc 2198.
Schweiger—Response to Brief Communication dated Aug. 14, 2014 for Application No. EP02800982.7, dated Oct. 20, 2014, 1 paoe (PER-001-EPO), Doc 2070.

(56) References Cited

OTHER PUBLICATIONS

EPO—Interlocutory Decision in Opposition Proceedings for Application No. EP02800982.7, dated Nov. 14, 2014, 79 pages (PER-001-EPO), Doc 2071.
EPO—Acknowledgement from Schwieger for Application No. EP02800982.7, dated Nov. 14, 2014, 3 page (PER-001-EPO), Doc 2072.
EPO—Acknowledgement from Schussler for Application No. EP02800982.7, dated Nov. 14, 2014, 1 page (PER-001-EPO), Doc 2073.
EPO—Maintenance of the Patent with the Documents Specified in the Final Decision for Application No. EP02800982.7, dated Apr. 23, 2015, 1 page (PER-001-EPO), Doc 2074.
EPO—Communication Pursuant to Rule 82(2) EPC for Application No. EP02800982.7, dated May 7, 2015, 7 pages (PER-001-EPO), Doc 2075.
L&P—Enquiry as to When a Communication Regarding the Appeal Proceedings can be Expected for Application No. EP06786943.8, dated Jun. 3, 2015, 1 pages (PER-016-EPO), Doc 2199.
Huber—Response to Official Communication Pursuant to Rule 82(2) dated May 7, 2015 for Application No. EP02800982.7, dated Aug. 7, 2015, 22 pages (PER-001-EPO), Doc 2076.
Huber—Confirmation of Response to Official Communication Pursuant to Rule 82(2) dated May 7, 2015 for Application No. EP02800982. 7, dated Aug. 8, 2015, 21 pages (PER-001-EPO), Doc 2077.
EPO—Termination of the Opposition Proceedings with Maintenance of Patent for Application No. EP02800982.7, dated Aug. 21, 2015, 1 page (PER-001-EPO), Doc 2078.
EPO—Decision to Maintain European Patent in Amended Form (Art. 101(3)(a) EPC) for Application No. EP02800982.7, dated Aug. 27, 2015, 2 pages (PER-001-EPO), Doc 2079.
EPO—Board of Appeals; Oral Proceedings to be Held for Application No. EP06786943.8, dated Nov. 13, 2015, 1 page (PER-016-EPO), Doc 2200.
EPO—Change of Composition of the Board for Application No. EP06786943.8, dated Apr. 1, 2016, 1 page (PER-016-EPO), Doc 2202.
EPO—Change of Composition of the Board for Application No. EP06786943.8, dated Apr. 6, 2016, 1 page (PER-016-EPO), Doc 2203.
L&P—Reply to Summons to Attend Oral Proceedings Issued on Nov. 18, 2015 for Application No. EP06786943.8, dated Apr. 15, 2016, 26 pages (PER-016-EPO), Doc 2204.
EPO—Confirmation of Reply to Summons to Attend Oral Proceedings Issued on Nov. 18, 2015 for Application No. EP06786943.8, dated Apr. 18, 2016, 26 pages (PER-016-EPO), Doc 2205.
EPO—The Minutes of the Oral Proceedings for Application No. EP06786943.8, dated Oct. 10, 2016, 35 pages (PER-016-EPO), Doc 1004.
EPO—The Minutes of the Oral Proceedings for Application No. EP06786943.8, dated Oct. 10, 2016, 35 pages (PER-016-EPO), Doc 2206.
EPO—Decision of the Board of Appeal for Application No. EP06786943.8, dated Nov. 3, 2016, 32 pages (PER-016-EPO), Doc 2207.
Deutsche Post—Advice of delivery for Application No. EP06786943. 8, dated Nov. 3, 2016, 3 pages (PER-016-EPO), Doc 2208.
EPO—Grant of a Patent with the Documents Specified in the Final Decision of the Board of Appeal for Application No. EP06786943.8, dated Nov. 22, 2016, 2 pages (PER-016-EPO), Doc 2209.
EPO—Communication Under Rule 71(3) EPC for Application No. EP06786943.8, dated Dec. 1, 2016, 99 pages (PER-016-EPO), Doc 2210.
L&P—Filing of the Translations of the Claims for Application No. EP06786943.8, dated Mar. 1, 2017, 10 pages (PER-016-EPO), Doc 2211.
EPO—Confirmation of the Filing of the Translations of the Claims for Application No. EP06786943.8, dated Mar. 3, 2017, 10 pages (PER-016-EPO), Doc 2212.
EPO—Decision to Grant a European Patent Pursuant to Article 97(1) EPC for Application No. EP06786943.8, dated Mar. 16, 2017, 2 pages (PER-016-EPO), Doc 2213.
EPO—Transmission of the Certificate for a European Patent Pursuant to Rule 74 EPC for Application No. EP06786943.8, dated Apr. 12, 2017, 1 page (PER-016-EPO), Doc 2214.
EPO—Communication Regarding the Expiry of Opposition Period for Application No. EP06786943.8, dated Feb. 16, 2018, 1 page (PER-016-EPO), Doc2215.
EPO—Acknowledgement Receipt for Board of Appeals for Application No. EP06786943.8, dated Nov. 18, 2018, 1 page (PER-016-EPO), Doc 2201.
PCT—Chapter II Demand for Application No. PCT/US06/026965, dated Feb. 12, 2007, 11 pages (PER-016-EPO), Doc 2165.
L&P—Response to Communication Pursuant to Article 94(3) dated Dec. 3, 2015 for Application No. EP11153241.2, dated Mar. 30, 2016, 15 pages (PER-016-EPO-DIV 3), Doc 0991.
EPO—Request for Grant of a European Patent for Application No. EP11153227.1, dated Feb. 3, 2011, 125 pages (PER-016-EPO-DIV-1), Doc 2216.
EPO—Designation as Inventor-Communication Under Rule 19(3) EPC for Application No. EP11153227.1, dated Apr. 26, 2011, 2 pages (PER-016-EPO-DIV-1), Doc2217.
Peregrine—EP Response dated May 16, 2011 for Application No. EP11153227.1, 5 pages (PER-016-EPO-DIV-1), Doc 0775.
Peregrine—EP Response dated May 16, 2011 for Application No. 11153247.9, 6 pages (PER-016-EPO-DIV-1), Doc 0777.
L&P—Reply to Communication Pursuant to Rule 58 EPC dated Mar. 17, 2011 for Application No. EP11153227.1, dated May 16, 2011, 5 pages (PER-016-EPO-DIV-1), Doc 2218.
EPO—Communication Pursuant to Rule 19(1) EPC for Application No. EP11153227.1, dated May 23, 2011, 2 pages (PER-016-EPO-DIV-1), Doc 2219.
EPO—Notification of European Publication Number and Information on the Application of Article 67(3) for Application No. EP11153227. 1, dated Jun. 29, 2011, 1o pages (PER-016-EPO-DIV-1), Doc 2220.
EPO—Reply to Communication Pursuant to Rule 19(1) EPC for Application No. EP11153227.1, dated Jul. 5, 2011, 2 pages (PER-016-EPO-DIV-1), Doc 2221.
EPO—Extended European Search Report for Application No. EP11153227.1, dated May 4, 2012, 4 pages (PER-016-EPO-DIV-1), Doc 2222.
L&P—Reply to Communication Pursuant to Rules 69 and 70a(1) EPC dated Jun. 4, 2012 and the European Search Opinion dated May 4, 2012 for Application No. EP11153227.1, dated Nov. 27, 2012, 10 pages (PER-016-EPO-DIV-1), Doc 2224.
L&P—Letter regarding References Cited in US Prosecution for Application No. EP11153227.1, dated Jun. 18, 2013, 129 pages (PER-016-EPO-DIV-1), Doc 2225.
L&P—Document Concerning Representation for Application No. EP11153227.1, dated Oct. 8, 2014, 2 pages (PER-016-EPO-DIV-1), Doc 2227.
EPO—Confirmation of Document Concerning Representation for Application No. EP11153227.1, dated Oct. 14, 2014, 2 pages (PER-016-EPO-DIV-1), Doc 2228.
L&P—Enquiry as to when a Communication from the Examining Division can be Expected for Application No. EP11153227.1, dated Jun. 1, 2015, 1 page (PER-016-EPO-DIV-1), Doc 2229.
EPO—Response to Enquiry for Communication from the Examining Division for Application No. EP11153227.1, dated Jun. 9, 2015, 1 page (PER-016-EPO-DIV-1), Doc 2230.
EPO—Notice Regarding Substantive Examination Started for Application No. EP11153227.1, dated Nov. 27, 2015, 1 page (PER-016-EPO-DIV-1}, Doc2231.
EPO—Communication Pursuant to Article 94(3) EPC for Application No. EP11153227.1, dated Dec. 3, 2015, 4 pages (PER-016-EPO-DIV-1), Doc 2232.
L&P—Reply to Communication Pursuant to Article 94(3) EPC for Application No. EP11153227.1 dated Dec. 3, 2015, dated Mar. 30, 2016, 13 pages (PER-016-EPO-DIV-1), Doc 2233.
EPO—Confirmation of Reply to Communication Pursuant to Article 94(3) EPC for Application No. EP11153227.1, dated Apr. 5, 2016, 13 pages (PER-016-EPO-DIV-1), Doc 2234.

(56) References Cited

OTHER PUBLICATIONS

EPO—Communication pursuant to Article 94(3) for Application No. EP11153227.1, dated Oct. 17, 2018, 4 pages (PER-016-EPO-DIV-1), Doc 1065.
EPO—Communication Pursuant to Article 94(3) EPC for Application No. EP11153227.1, dated Oct. 17, 2018, 4 paQes (PER-016-EPO-DIV-1), Doc2235.
L&P—Reply to Communication Pursuant to Article 94(3) EPC for Application No. EP11153227.1 dated Oct. 17, 2018, dated Feb. 11, 2019, 36 pages (PER-016-EPO-DIV-1), Doc 2236.
EPO—Confirmation of Reply to Communication Pursuant to Article 94(3) EPC for Application No. EP11153227.1, dated Feb. 13, 2019, 36 pages (PER-016-EPO-DIV-1), Doc 2237.
EPO—Communication Pursuant to Rule 69 EPC—Reminder Concerning Payment of the Designation Fee (Art. 79(2) EPC) and of the examination fee (Art. 94(1) EPC)—and invitation pursuant to Rule 70a(1) EPC for Application No. EP11153227 .1, dated Jun. 4, 2012, 2 pages (PER-016-EPO-DIV-1), Doc 2223.
L&P—Reply to Communication Pursuant to Article 94(3) filed Dec. 20, 2019 for Application No. EP11153227.1, 11 pages, (PER-016-EPO-DIV-1) Doc9069.
EPO—Communication Pursuant to Article 94(3) dated Apr. 16, 2020 for EP Application No. EP11153227.1 (PER-016-EPO-DIV-1), 4 pages, Doc 9107.
EPO—Request for Grant of a European Patent for Application No. EP11153241.2, dated Feb. 3, 2011, 125 pages (PER-016-EPO-DIV-2), Doc 2238.
EPO—Designation as Inventor-Communication Under Rule 19(3) EPC for Application No. EP11153241.2, dated Apr. 26, 2011, 2 pages (PER-016-EPO-DIV-2), Doc 2239.
L&P—Reply to Communication Pursuant to Rule 58 EPC dated March 17, 2011 for Application No. EP11153241.2, dated May 16, 2011, 5 pages (PER-016-EPO-DIV-2), Doc 2240.
EPO—Communication Pursuant to Rule 19(1) EPC for Application No. EP11153241.2, dated May 23, 2011, 2 pages (PER-016-EPO-DIV-2), Doc 2241.
EPO—Notification of European Publication Number and Information on the Application of Article 67(3) for Application No. EP11153241.2, dated Jun. 29, 2011, 1o pages (PER-016-EPO-DIV-2), Doc 2242.
L&P—Response to Communications Pursuant to Rule 19(1) EPC dated May 20, 2011 and May 23, 2011 for Application No. EP11153241.2, dated Jul. 5, 2011, 4 pages (PER-016-EPO-DIV-2), Doc 2243.
EPO—Extended Search Report for Application No. EP11153241.2, dated May 7, 2012, 4 pages (PER-016-EPO-DIV-2), Doc 2244.
EPO—Communication Pursuant to Rule 69 EPC—Reminder Concerning Payment of the Designation Fee (Art. 79(2) EPC) and of the examination fee (Art. 94(1) EPC)—and invitation pursuant to Rule 70a(1) EPC for Application No. EP11153241.2, dated Jun. 12, 2012, 2 pages (PER-016-EPO-DIV-2), Doc 2245.
EPO—Notice Drawing Attention to Rule 51(2) EPC, Article 2 No. 5 of the Rules Relating to Fees-Payment of Renewal Fee Plus Additional Fee for Application No. EP11153241.2, dated Sep. 4, 2012, 2 pages (PER-016-EPO-DIV-2), Doc2246.
L&P—Response to Communication Pursuant to Rule 69 and 70a(1) EPC dated Jun. 12, 2012 for Application No. EP11153241.2, dated Dec. 5, 2012, 30 pages (PER-016-EPO-DIV-2), Doc 2247.
L&P—Letter regarding References Cited in US Prosecution for Application No. EP11153241.2, dated Jun. 18, 2013, 129 pages (PER-016-EPO-DIV-2), Doc2248.
L&P—Document Concerning Representation for Application No. EP1153241.2, dated Oct. 8, 2014, 2 pages (PER-016-EPO-DIV-2), Doc 2252.
EPO—Confirmation of Document Concerning Representation for Application No. EP1153241.2, dated Oct. 14, 2014, 2 pages (PER-016-EPO-DIV-2), Doc 2253.
L&P—Enquiry as to when a Communication from the Examining Division can be Expected for Application No. EP11153241.2, dated Jun. 1, 2015, 1 page (PER-016-EPO-DIV-2), Doc 2254.
EPO—Communication in Response to Enquiry for Application No. EP 11153241.2, dated Jun. 9, 2015, 1 page (PER-016-EPO-DIV-2), Doc 2255.
EPO—Communication Pursuant to Article 94(3) for Application No. EP11153247.9, dated Dec. 3, 2015, 4 pages (PER-016-EPO-DIV-2), Doc 0980.
EPO—Communication Pursuant to Article 94(3) EPC for Application No. EP11153241.2, dated Dec. 3, 2015, 5 pages (PER-016-EPO-DIV-2), Doc 2256.
L&P—Reply to Communication Pursuant to Article 94(3) EPC for Application No. EP11153241.2, dated Dec. 3, 2015, dated Mar. 30, 2016, 15 pages (PER-016-EPO-DIV-2), Doc 2257.
EPO—Confirmation of Reply to Communication Pursuant to Article 94(3) dated Dec. 3, 2015 for Application No. EP11153241.2, dated Apr. 5, 2016, 15 pages (PER-016-EPO-DIV-22, Doc 2258.
EPO—Notice Drawing Attention to Rule 51(2) EPC, Article 2 No. 5 of the Rules Relating to Fees—Payment Fee Plus Additional Fee for Application No. EP1153241.2, dated Sep. 4, 2017, 2 pages (PER-016-EPO-DIV-2), Doc 2259
EPO—Noting of Loss of Rights Pursuant to Rule 112(1) EPC for Application No. EP11153241.2, dated Feb. 28, 2018, 1 page (PER-016-EPO-DIV-2), Doc 2260.
EPO—Closure of the Procedure in Respect of Application for Application No. EP11153241.2, dated May 30, 2018, 2 pages (PER-016-EPO-DIV-2), Doc2261.
EPO—Communication pursuant to Article 94(3) for Application No. EP11153247.9, dated Oct. 17, 2018, 4 pages (PER-016-EPO-DIV-2), Doc 1066.
EPO—Communication Pursuant to Article 94(3) for Application No. EP11153247.9 dated Aug. 27, 2019, 4 pages (PER-016-EPO-DIV-2) Doc 9002.
EPO—Request for Grant of European Patent for Application No. EP 11153247.9, dated Feb. 3, 2011, 125 pages (PER-016-EPO-DIV-3), Doc 2262.
EPO—Designation as Inventor-Communication Under Rule 19(3) EPC for Application No. EP11153247.9, dated Apr. 26, 2011, 2 pages (PER-016-EPO-DIV-3), Doc2263.
L&P—Reply to Communication Pursuant to Rule 58 EPC dated Mar. 17, 2011 for Application No. EP11153247.9, dated May 16, 2011, 6 pages (PER-016-EPO-DIV-3), Doc 2264.
EPO—Communication Pursuant to Rule 19(1) EPC for Application No. EP11153247.9, dated May 23, 2011, 2 pages (PER-016-EPO-DIV-3), Doc 2265.
EPO—Notification of European Publication Number and Information on the Application of Article 67(3) EPC for Application No. EP11153247.9, dated Jun. 29, 2011, 10 pages (PER-016-EPO-DIV-3), Doc 2266.
L&P—Reply to Communication Pursuant to Rule 19(1) EPC dated May 20 & 23, 2011 for Application No. EP11153247.9, dated Jul. 5, 2011, 2 pages (PER-016-EPO-DIV-3), Doc 2267.
EPO—Extended European Search Report for Application No. EP11153247.9, dated May 7, 2012, 4 pages (PER-016-EPO-DIV-3), Doc 2268.
EPO—Communication Pursuant to Rule 69 EPC—Reminder Concerning Payment of the Designation Fee (Art. 79(2) EPC) and the Examination Fee (Art. 79(2) EPC)—and Invitation Pursuant to Rule 70a(1) EPC for Application No. EP11153247.9, dated Jun. 12, 2012, 2 pages (PER-016-EPO-DIV-3), Doc 2269.
EPO—Notice Drawing Attention to Rule 51(2) EPC, Article 2 No. 5 of the Rules Relating to the Fees—Payment of the Renewal Fee and Additional Fee for Application No. EP11153247.9, dated Sep. 4, 2012, 2 pages (PER-016-EPO-DIV-3), Doc 2270.
L&P—Reply to Communication Pursuant to Rule 69 and 71a(1) EPC dated Jun. 12, 2012 and the European Search Opinion dated May 7, 2012 for Application No. EP11153247.9, dated Dec. 5, 2012, 24 pages (PER-016-EPO-DIV-3), Doc 2271.
L&P—Letter Regarding References Cited in US Prosecution for Application No. EP11153247.9, dated Jun. 18, 2013, 129 pages (PER-016-EPO-DIV-3), Doc2272.
L&P—Letter Regarding References Cited in JP Prosecution for Application No. EP11153247.9, dated Mar. 25, 2014, 12 pages (PER-016-EPO-DIV-3), Doc 2273.

(56) References Cited

OTHER PUBLICATIONS

L&P—Document Concerning Representation for Application No. EP11153247.9, dated Oct. 8, 2014, 2 pages (PER-016-EPO-DIV-3), Doc 2274.
EPO—Confirmation of Document Concerning Representation for Application No. EP11153247.9, dated Oct. 14, 2014, 2 pages (PER-016-EPO-DIV-3), Doc 2275.
L&P—Enquiry as to When a Communication from the Examining Division can be Expected for Application No. EP11153247.9, dated Jun. 1, 2015, 1 page (PER-016-EPO-DIV-3), Doc 2276.
EPO—Response to Enquiry for Communication from the Examining Division for Application No. EP11153247.9, dated Jun. 9, 2015, 1 page (PER-016-EPO-DIV-3), Doc 2277.
EPO—Substantive Examination Started for Application No. EP11153247.9, dated Nov. 30, 2015, 3 pages (PER-016-EPO-DIV-3), Doc 2278.
EPO—Communication Pursuant to Article 94(3) for Application No. EP11153241.2, dated Dec. 3, 2015, 5 pages (PER-016-EPO-DIV-3), Doc 0979.
EPO—Communication Pursuant to Article 94(3) EPC for Application No. EP11153247.9, dated Dec. 3, 2015, 4 pages (PER-016-EPO-DIV-3), Doc2279.
L&P—Reply to Communication Pursuant to 94(3) EPC dated Dec. 2, 2015 for Application No. EP11153247.9, dated Mar. 30, 2016, 13 pages (PER-016-EPO-DIV-3), Doc 2280.
EPO—Confirmation of Reply to Communication Pursuant to 94(3) EPC dated Dec. 2, 2015 for Application No. EP11153247.9, dated Apr. 5, 2016, 13 pages (PER-016-EPO-DIV-3), Doc 2281.
EPO—Communication Pursuant to Article 94(3) EPC for Application No. EP11153247.9, dated Oct. 17, 2018, 4 pages (PER-016-EPO-DIV-3), Doc 2282.
L&P—Reply to Communication Pursuant to Article 94(3) EPC for Application No. EP11153247.9 dated Oct. 17, 2018, dated Feb. 11, 2019, 39 pages (PER-016-EPO-DIV-3), Doc 2283.
EPO—Confirmation of Reply to Communication Pursuant to Article 94(3) EPC dated Oct. 17, 2018 for Application No. EP11153247.9, dated Feb. 13, 2019, 39 pages (PER-016-EPO-DIV-4), Doc 2284.
EPO—Request for Grant of a European Patent for Application No. EP11153281.8, dated Feb. 4, 2011, 125 pages (PER-016-EPO-DIV-4), Doc 2285.
EPO—Designation as Inventor-Communication Under Rule 19(3) EPC for Application No. EP11153281.8, dated Apr. 26, 2011, 2 paoes (PER-016-EPO-DIV-4), Doc2286.
L&P—Reply to Communication Pursuant to Rule 58 EPC dated March 17, 2011 for Application No. EP11153281.8, dated May 16, 2011, 7 pages (PER-016-EPO-DIV-4), Doc 2287.
EPO—Confirmation of Reply to Communication Pursuant to Rule 58 EPC dated Mar. 17, 2011 for Application No. EP11153281.8, dated May 18, 2011, 7 pages (PER-016-EPO-DIV-4), Doc 2288.
EPO—Communication Pursuant to Rule 19(1) EPC for Application No. EP11153281.8, dated May 20, 2011, 2 pages (PER-016-EPO-DIV-4), Doc 2289.
EPO—Notification of European Publication Number and Information on the Application of Article 67(3) EPC for Application No. EP11153281.8, dated Jun. 29, 2011, 11 pages (PER-016-EPO-DIV-4), Doc 2290.
L&P—Response to Communication Pursuant to Rule 91(1) EPC dated May 20, 2011 and May 23, 2011 for Application No. EP11153281.8, dated Jul. 5, 2011, 2 pages (PER-016-E.PO-DIV-4), Doc 2291.
EPO—Extended European Search Report for Application No. EP11153281.8, dated May 8, 2012, 4 pages (PER-016-EPO-DIV-4), Doc 2292.
EPO—Communication Pursuant to Rule 69 EPC—Reminder Concerning Payment of Designation Fee (Art. 79(2) EPC) and of the Examination Fee (Art. 94(1) EPC)—and Invitation Pursuant to Rule 70a(1) EPC for Application No. EP11153281.8, dated Jun. 12, 2012, 2 pages (PER-016-EPO-DIV-4), Doc 2293.
EPO—Notice Drawing Attention to Rule 51(2) EPC, Article 2 No. 5 of the Rules Relating to Fees, Payment of the Renewal Fee Plus Additional Fee for Application No. EP11153281.8, dated Sep. 4, 2012, 2 pages (PER-016-EPO-DIV-4), Doc 2294.
L&P—Response to Communication Pursuant to Rule 69 EPC and 70a(1) dated Jun. 12, 2012 for Application No. EP11153281.8, dated Dec. 5, 2012, 30 pages (PER-016-EPO-DIV-4), Doc 2295.
L&P—Listing of References Cited During Prosecution of Corresponding US Application for Application No. EP11153281.8, dated Jun. 18, 2013, 129 pages (PER-016-EPO-DIV-4), Doc 2296.
L&P—Listing of References Cited During Prosecution of Corresponding JP Application for Application No. EP11153281.8, dated Mar. 25, 2014, 12 pages (PER-016-EPO-DIV-4), Doc 2297.
L&P—Document Concerning Representation for Application No. EP11153281.8, dated Oct. 8, 2014, 2 pages (PER-016-EPO-DIV-4), Doc 2298.
EPO—Confirmation of Document Concerning Representation for Application No. EP11153281.8, dated Oct. 14, 2014, 2 pages (PER-016-EPO-DIV-4), Doc 2299.
L&P—Enquiry as to When a Communication from the Examining Division can be Expected for Application No. EP11153281.8, dated Jun. 1, 2015, 1 page (PER-016-EPO-DIV-4), Doc 2300.
EPO—Response to Enquiry for Communication from the Examining Division for Application No. EP11153281.8, dated Jun. 9, 2015, 1 page (PER-016-EPO-DIV-4), Doc 2301.
EPO—Substantive Examination Started for Application No. EP11153281.8, dated Nov. 30, 2015, 1 page (PER-016-EPO-DIV-4), Doc 2302.
EPO—Communication Pursuant to Article 94(3) EPC for Application No. EP11153281.8, dated Dec. 4, 2015, 5 pages (PER-016-EPO-DIV-4), Doc 2303.
L&P—Reply to Communication Pursuant to Article 94(3) EPC dated Dec. 4, 2015 for Application No. EP11153281.8, dated Mar. 30, 2016, 13 pages (PER-016-EPO-DIV-4), Doc 2304.
EPO—Confirmation of Reply to Communication Pursuant to Article 94(3) EPC dated Dec. 4, 2015 for Application No. EP11153281.8, dated Apr. 5, 2016, 18 pages (PER-016-EPO-DIV-4), Doc 2305.
EPO—Communication Pursuant to Article 94(3) EPC for Application No. EP11153281.8, dated Oct. 16, 2018, 9 pages (PER-016-EPO-DIV-4), Doc 2306.
EPO—Communication Pursuant to Article 94(3) for Application No. EP11153281.8 dated Aug. 27, 2019, 4 pages (PER-016-EPO-DIV-4) Doc 9001.
EPO Request for Grant of a European Patent for Application No. EP11153313.s, dated Feb. 4, 2011, 125 pages (PER-016-EPO-DIV-5), Doc 2307.
EPO—Designation as Inventor-Communication Under Rule 19(3) EPC for Application No. EP11153313.9, dated Apr. 26, 2011, 2 pa es (PER-016-EPO-DIV-5), Doc 2308.
L&P—Reply to Communication Pursuant to Rule 58 EPC dated Mar. 17, 2011 for Application No. EP11153313.9, dated May 16, 2011, 8 pages (PER-016-EPO-DIV-5), Doc 2309.
EPO—Communication Pursuant to Rule 19(1) EPC for Application No. EP11153313.9, dated May 20, 2011, 3 paoes (PER-016-EPO-DIV-5), Doc 2310.
EPO—Notification of European Publication Number and Information on the Application of Article 67(3) for Application No. EP11153313.9, dated Jun. 29, 2011, 1o pages (PER-016-EPO-DIV-5), Doc 2311.
L&P—Response to Communication Pursuant to Rule 19(1) EPC dated May 20, 2011 and May 23, 2011 for Application No. EP11153313.9, dated Jul. 5, 2011, 4 pages (PER-016-EPO-DIV-5), Doc 2312.
EPO—Extended European Search Report for Application No. EP11153313.9, dated May 8, 2012, 4 pages (PER-016-EPO-DIV-5), Doc2313.
EPO—Communication Pursuant to Rule 69 EPC—Reminder Concerning Payment of the Designation Fee (Art. 79(2) EPC) and of the Examination Fee (Art. 94(1) EPC)—and Invitation Pursuant to Rule 70a(1) EPC for Application No. EP11153313.9, dated Jun. 12, 2012, 2 pages (PER-016-EPO-DIV-5), Doc 2314.
L&P—Response to Communication Pursuant to Rule 69 EPC and 70a(1) dated Jun. 12, 2012 and the European Search Report dated May 8, 2012 for Application No. EP11153313.9, dated Dec. 5, 2012, 30 pages (PER-016-EPO-DIV-5), Doc 2315.

(56) References Cited

OTHER PUBLICATIONS

L&P—List of References Cited in Corresponding US Application for Application No. EP11153313.9, dated Jun. 18, 2013, 129 pages (PER-016-EPO-DIV-5), Doc 2316.
L&P—List of References Cited in Corresponding JP Application for Application No. EP11153313.9, dated Mar. 25, 2014, 12 pages (PER-016-EPO-DIV-5), Doc2317.
L&P—Document Concerning Representation for Application No. EP11153313. 9, dated Oct. 8, 2014, 2 pages (PER-016-EPO-DIV-5), Doc 2318.
EPO—Confirmation of Document Concerning Representation for Application No. EP11153313.9, dated Oct. 14, 2014, 2 pages (PER-016-EPO-DIV-5), Doc2319.
L&P—Enquiry as to when a Communication from the Examining Division can be Expected for Application No. EP11153313.9, dated Nov. 18, 2015, 1 page (PER-016-EPO-DIV-5), Doc 2320.
EPO—Confirmation of Enquiry as to when a Communication from the Examining Division can be Expected for Application No. EP11153313.9, dated Nov. 21, 2015, 1 page (PER-016-EPO-DIV-5), Doc 2321.
EPO—Communication in Response to Enquiry for Application No. EP11153313.9, dated Nov. 24, 2015, 1 page (PER-016-EPO-DIV-5), Doc 2322.
EPO—Substantive Examination Started for Application No. EP11153313.9, dated May 9, 2016, 1 page (PER-016-EPO-DIV-5), Doc 2323.
EPO—Communication Pursuant to Article 94(3) EPC for Application No. EP11153313.9, dated May 13, 2016, 4 pages (PER-016-EPO-DIV-5), Doc 2324.
EPO—Noting Loss of Rights Pursuant to Rule 112(1) EPC for Application No. EP11153313.9, dated Oct. 21, 2016, 1 page (PER-016-EPO-DIV-5), Doc 2325.
EPO—Closure of the Procedure in Respect of Application EP11153313. 9, dated Jan. 20, 2017, 1 page (PER-016-EPO-DIV-5), Doc 2326.
JPO—Notice of Reasons for Refusal for Application No. JP2008-521544, dated Jul. 10, 2012, 4 pages (PER-016-JP), Doc 0820.
Notification of Reason for Refusal for Application No. JP2008-521544, dated Jul. 17, 2012, 4 pages (PER-016-JP), Doc 2401.
Amended Claims for Application No. JP2008-521544, dated Jan. 8, 2013, 8 pages (PER-016-JP), Doc 2403.
L&P—Particulars of Letters Patent for Patent No. JP5215850, dated Apr. 11, 2013, 5 pages (PER-016-JP), Doc 2402.
Pending Claims for Application No. JP2009500868, 7 pages (PER-016-JP), Doc 2400.
L&P—Letter Regarding Filing Divisional Application for Application No. JP2013-003388, dated Jul. 3, 2014, 14 pages (PER-016-JP-DIV), Doc 2406.
Jaquez Land Richman—Letter Regarding Notice of Allowance for Application No. JP2013-003388, dated Dec. 18, 2014, 1 page (PER-016-JP-DIV), Doc 2407.
JPO—Grant of Patent for Application No. JP2013-003388, dated Jan. 9, 2015, 5 pages (PER-016-JP-DIV), Doc 2408.
Jaquez Land Richman—Letter Regarding Patent Grant for Application No. JP2013-003388, dated Apr. 9, 2015, 1 page (PER-016-JP-DIV), Doc 2409.
PCT—International Search Report for PCT/US2006/026965, dated Nov. 7, 2006, 19 pages (PER-016-PCT), Doc 0651.
PCT—Notification Concerning Submission or Transmittal of Priority Document for Application No. PCT/US06/026965, dated Sep. 26, 2006, 131 page (PER-016-PCT), Doc 2122.
WIPO—Publication with International Search Report for Application No. PCT/US06/026965, dated Jan. 18, 2007, 112 pages (PER-016-PCT), Doc2124.
Peregrine—Request Form for Application No. PCT/US06/026965, dated Mar. 14, 2007, 1 page (PER-016-PCT), Doc 2123.
Geier—International Preliminary Report on Patentability from EPO dated Jun. 21, 2007 for Application No. PCT/US2006/026965, 12 pages (PER-016-PCT), Doc 0658.
PCT—Written Opinion of the International Searching Authority for Application No. PCT/US06/026965, filed Jul. 11, 2006, 11 pages (PER-016-PCT), Doc 2125.
PCT—International Preliminary Report on Patentability for Application No. PCT/US06/026965, filed Jul. 11, 2006, 12 pages (PER-016-PCT), Doc 2126.
L&P—Response to Communication Pursuant to Rule 69 EPC dated Jul. 20, 2015 for Application No. EP14182150.4, dated Jan. 14, 2016, 24 paQes (PER-018-EPO), Doc 0987.
EPO—Noting Loss of Rights Pursuant to Rule 112(1) EPC for Application No. EP07794407.2, dated May 8, 2014, 1 page (PER-019-EPO-1), Doc 0904.
Societa—Response for Application No. EP07794407.2, dated Jul. 11, 2014, 32 pages (PER-019-EPO-1), Doc 0915.
Peregrine—Response to communication dated Nov. 16, 2012 for Application No. EP09174085.2, dated May 23, 2013, 18 pages (PER-019-EPO-2), Doc 0852.
JPO—Decision to Grant a Patent for Application No. JP2013-006353, dated Jul. 1, 2014, 6 pages (PER-019-JAP-DIV-1), Doc 0914.
JPO—Notice of Reasons for Refusal for Application No. JP2010506156, dated Apr. 9, 2012, 4 pages (PER-019-JAP), Doc 0808.
JPO—Notice of Reasons for Refusal for Application No. JP2013-006353, dated Oct. 21, 2013, 10 pages (PER-019-JAP-DIV-1), Doc 0876.
Peregrine—Amendment for Application No. JP2013-006353, dated Apr. 28, 2014, 18 pages (PER-019-JAP-DIV-1), Doc 0961.
EPO—Extended Search Report for Application No. EP12194187.6, dated Feb. 7, 2013, 11 pages (PER-024-EPO-DIV-1), Doc 0840.
EPO—Extended Search Report for Application No. EP14165804.7, dated May 27, 2014, 8 pages (PER-024-EPO-DIV-2), Doc 0909.
EPO—Communication Pursuant to Article 94(3) for Application No. EP11153227.1, dated Jul. 4, 2019, 7 pages (PER-016-EPO-DIV-1) Doc 2412.
EPO—Communication Pursuant to Article 94(3) for Application No. EP11153281.8 dated Aug. 27, 2019, 4 paqes (PER-016-EPO-DIV-4) Doc 9001.
RFMD's Petition for Inter Partes Review of U.S. Pat. No. 8,405,147 Under 35 U.S.C. 311 filed Mar. 27, 2014 in IPR2014-00546, 7810 pages, Doc 8086A-8086U.
RFMD's Corrected Petition for Inter Partes Review of U.S. Pat. No. 8,405,147 under 35 U.S.C. 311 filed Apr. 14, 2014 in IPR2014-00546, 64 pages, Doc 8087.
RFMD's Corrected Petition for Inter Partes Review of U.S. Pat. No. 8,405,147 under 35 U.S.C. 311 (Redline Copy) filed Apr. 14, 2014 in IPR2014-00546, 68 pages, Doc 8088.
Peregrine's Patent Owner Preliminary Response Pursuant to 37 C.F.R. 42.107 filed Jul. 10, 2014 in IPR2014-00546, 101 pages, Doc 8089.
Examiner Initialed 1449s/8B08s for U.S. Appl. No. 15/826,453, filed Nov. 29, 2017 (PER-018-CIP-CON-3).
Examiner Initialed 1449s/S808s for U.S. Appl. No. 14/987,360, filed Jan. 4, 2016 (PER-018-CIP-CON-2).
Examiner Initialed 1449s/8B08s for U.S. Appl. No. 14/257,808, filed Apr. 21, 2014 (PER-018-CIP-CON-1).
Examiner Initialed 1449s/S808s for U.S. Appl. No. 11/881,816, filed Jul. 26, 2007 (PER-018-CIP).
Examiner Initialed 1449s/8B08s for U.S. Appl. No. 11/520,912, filed Sep. 14, 2006 (PER-015-CIP).
Examiner Initialed 1449s/S808s for U.S. Appl. No. 11/484,370, filed Jul. 10, 2006 (PER-016-PAP).
RF Micro Devices Inc., Invalidity Contentions for U.S. Pat. No. 8,405,147, Dec. 10, 2013 (Civil Case#: 3:12-cv-00911-H-JLB), 324 pages, Doc 8000.
RF Micro Devices Inc., Invalidity Contentions for U.S. Pat. No. 7,910,993, Dec. 10, 2013 (Civil Case#: 3:12-cv-00911-H-JLB), 1697 pages, Doc 8001.
RF Micro Devices Inc., Exhibit listing prior art identified in connection with Invalidity Contentions for U.S. Pat. No. 7,910,993 and U.S. Pat. No. 8,405,147, Dec. 10, 2013, (Civil Case#: 3:12-cv-00911-H-JLB), 21 pages, Doc 8004.

(56) References Cited

OTHER PUBLICATIONS

RF Micro Devices Inc., Amended Invalidity Contentions for U.S. Pat. No. 8,405,147, Dec. 10, 2013 (Civil Case#: 3:12-cv-00911-H-JLB), 362 pages, Doc 8006.
RF Micro Devices Inc., Amended Invalidity Contentions for U.S. Pat. No. 7,910,993, Dec. 10, 2013 (Civil Case#: 3:12-cv-00911-H-JLB), 110 pages, Doc8007.
RF Micro Devices Inc., Amended Exhibit listing prior art identified in connection with Invalidity Contentions for U.S. Pat. No. 7,910,993 and U.S. Pat. No. 8,405,147, Dec. 10, 2013, (Civil Case#: 3:12-cv-00911-H-JLB), 33 pages, Doc 8005.
RF Micro Devices Inc., Invalidity Contentions for U.S. Pat. No. 7,860,499, Dec. 10, 2013 (Civil Case#: 3:12-cv-00911-H-JLB), 403 pages, Doc 8002.
RF Micro Devices Inc., Invalidity Contentions for U.S. Pat. No. 7,123,898, Dec. 10, 2013 (Civil Case#: 3:12-cv-00911-H-JLB), 383 pages, Doc 8003.
RF Micro Devices Inc., Amended Invalidity Contentions for U.S. Pat. No. 7,860,499, Dec. 10, 2013 (Civil Case#: 3:12-cv-00911-H-JLB), 445 pages, Doc 8008.
RF Micro Devices Inc., Amended Invalidity Contentions for U.S. Pat. No. 7,123,898, Dec. 10, 2013 (Civil Case#: 3:12-cv-00911-H-JLB), 430 pages, Doc 8009.
RF Micro Devices Inc., Invalidity Contentions for U.S. Pat. No. 7,860,499, Dec. 10, 2013 (Civil Case#: 3:12-cv-00911-H-JLB), 403 pages, Doc 8010.
RF Micro Devices Inc., Invalidity Contentions for U.S. Pat. No. 7,123,898, Dec. 10, 2013 (Civil Case#: 3:12-cv-00911-H-JLB), 383 pages, Doc 8011.
RF Micro Devices Inc., Amended Invalidity Contentions for U.S. Pat. No. 7,860,499, Dec. 10, 2013 (Civil Case#: 3:12-cv-00911-H-JLB), 445 pages, Doc 8012.
RF Micro Devices Inc., Amended Invalidity Contentions for U.S. Pat. No. 7,123,898, Dec. 10, 2013 (Civil Case#: 3:12-cv-00911-H-JLB), 504 pages, Doc 8013.
Docket for Case No. CACD-8-12-cv-00248 filed Feb. 14, 2012 in the United States District Court, Central District of California, Southern Division, 4 pages, Doc 8022.
Docket for Case 377-TA-848 filed Feb. 14, 2012 in the International Trade Commission, 14 pages, Doc 8023.
Docket for Case No. CASD-3-12-cv-00911 filed Feb. 13, 2012 in the United States District Court, Central District of California, Southern Division, 42 pages, Doc 8024.
Docket for Case No. CASD-3-12-cv-01160 filed May 11, 2012 in the United States District Court, Central District of California, Southern Division, 1O pages, Doc 8025.
Docket for Case No. CASD-3-13-cv-00725 filed Mar. 26, 2013 in the United States District Court, Central District of California, Southern Division, 4 pages, Doc 8026.
Docket for Case No. NCMD-1-12-cv-00377 filed Apr. 16, 2012 in the United States District Court, North Carolina Middle District, 5 pages, Doc 8027.
Peregrine's Verified Complaint filed with ITC Feb. 14, 2012 in 337-TA-848, 39 pages, Doc 8067.
Peregrine's Letter to Supplement Feb. 14, 2012 Complaint filed Feb. 16, 2012 in 337-TA-848, 1 page, Doc 8080.
Peregrine's Letter to Clarify and Supplement Feb. 14, 2012 Complaint filed Feb. 28, 2012 in 337-TA-848, 1 page, Doc 8081.
Peregrine's First Amended Complaint filed May 11, 2012 in 337-TA-848, 38 pages, Doc 8068.
Peregrine's Errata to Correct Typographical Error in Peregrine's First Amended Complaint filed May 15, 2012 in 337-TA-848, 2 pages, Doc 8071.
HTC's Response to First Amended Complaint filed Jul. 2, 2012 in 337-TA-848, 22 pages, Doc 8070.
Motorola's Exhibit A to the Response to Amended Complaint filed Jul. 2, 2012 in 337-TA-848, 3 pages, Doc 8073.
Motorola's Response to Amended Complaint filed Jul. 2, 2012 in 337-TA-848, 24 pages, Doc 8074.
RFMD's Response to First Amended Complaint filed Jul. 2, 2012 in 337-TA-848, 26 pages, Doc 8078.
HTC's Response to Amended Complaint filed Jul. 3, 2012 in 337-TA-848, 3 pages, Doc 8069.
Peregrine's Appendices A and I to Accompany First Amended Complaint filed Jul. 3, 2012 in 337-TA-848, 2 pages, Doc 8076.
Peregrine's Motion for Leave to Amend Complaint filed Jul. 20, 2012 in 337-TA-848, 87 pages, Doc 8077.
Peregrine's Letter to Supplement First Amended Complaint filed Jul. 25, 2012 in 337-TA-848, 3 pages, Doc 8072.
Peregrine's Notice of Patent Priority Dates filed Aug. 22, 2012 in 337-TA-848, 4 pages, Doc 8075.
Commission Investigative Staffs Notice of Prior Art filed Aug. 31, 2012 in 337-TA-848, 3 pages, Doc 8079.
Peregrine's Complaint for Damages and Injunctive Relief filed Feb. 14, 2012 in CACD-8-12-cv-00248, 101 pages, Doc 8082.
Peregrine's Complaint for Injunctive Relief filed Apr. 13, 2012 in CASD-3-12-cv-00911, 199 pages, Doc 8030.
RFMD and Motorola's Answer to Complaint and RFMD's Counterclaim filed Jun. 8, 2012 in CASD-3-12-cv-00911, 18 pages, Doc 8031.
RFMD's Answer, Defenses and Counterclaims to Plaintiff's Complaint filed May 1, 2013 in CASD-3-12-cv-00911, 11 pages, Doc 8032.
Peregrine's Answer to RFMD's Counterclaims filed May 28, 2013 in CASD-3-12-cv-00911 1o pages, Doc 8033.
Peregrine's First Amended Complaint filed Nov. 21, 22013 in CASD-3-12-cv-00911, 348 pages, Doc 8035.
Peregrine's Motion for Preliminary Injunction filed Nov. 25, 2013 in CASD-3-12-cv-00911, 327 pages, Doc 8036.
RFMD's Amended Answer, Defenses and Counterclaims to Plaintiff's Complaint (Redacted Public Version) filed Dec. 12, 2013 in CASD-3-12-cv-00911, 65 pages, Doc 8034.
Defendant RFMD's Opposition to Peregrine's Motion for Preliminary Injunction filed Dec. 13, 2013 in CASD-3-12-cv-00911, 504 pages, Docs 8028A-8028D.
Peregrine's Reply in Support of Its Motion for Preliminary Injunction (Public Redacted Version) filed Dec. 20, 2013 in CASD-3-12-cv-00911, 130 pages, Doc 8037.
RFMD's Unopposed Motion for Leave to File Short Surreply in Opposition to Peregrine's Motion for Preliminary Injunction filed Jan. 3, 2014 in CASD-3-12-cv-00911, 60 pages, Doc 8038.
Peregrine's Unopposed Motion for Leave to File Response to RFMD's Surreply filed Jan. 3, 2014 in CASD-3-12-cv-00911, 15 pages, Doc 8039.
Peregrine's Answer and Counterclaims to RFMD's Counterclaims filed Jan. 6, 2014 in CASD-3-12-cv-00911, 23 pages, Doc 8040.
Order Denying Peregrine's Motion for Preliminary Injunction filed Jan. 8, 2014 in CASD-3-12-cv-00911, 7 pages, Doc 8041.
RFMD's Answer to Peregrine's Counterclaims filed Jan. 27, 2014 in CASD-3-12-cv-00911, 5 pages, Doc 8042.
RFMD's Motion to Dismiss Peregrine's 3rd, 4th, 6th, 7th and 8th Counts for Lack of Subject Matter Jurisdiction filed Jan. 30, 2014 in CASD-3-12-cv-00911, 323 pages, Doc 8043.
Defendant Benton's Answer and Defenses to Plaintiffs First Amended Complaint filed Jan. 31, 2014 in CASD-3-12-cv-00911, 36 pages, Doc 8044.
Joint Claim Construction and Prehearing Statement Pursuant to Patent L.R. 4.2 filed Feb. 4, 2014 in CASD-3-12-cv-00911, 176 pages, Doc 8045.
Defendant Benton's Notice of Joinder to RFMD's Motion to Dismiss and Motion and Memorandum in Support of Motion to Dismiss Peregrine's 1 st, 2nd, and 3rd Causes of Action for Lack of Subject Matter Jurisdiction filed Feb. 26, 2014 in CASD-3-12-cv-00911, 13 pages, Doc 8046.
Peregrine's Memorandum in Opposition to RFMD's Motion to Dismiss filed Mar. 3, 2014 in CASD-3-12-cv-00911, 184 pages, Doc 8047.
Peregrine's Opening Claim Construction Brief filed Mar. 4, 2014 in CASD-3-12-cv-00911, 377 pages, Docs 8029A and 80298.
RFMD's Opening Brief on Claim Construction (Public Redacted Version) filed Mar. 4, 2014 in CASD-3-12-cv-00911, 27 pages, Doc 8048.

(56) References Cited

OTHER PUBLICATIONS

RFMD's Declaration of Mark Tung in Support of RFMD's Opening Claim Construction Brief filed Mar. 4, 2014 in CASD-3-12-cv-00911, 162 pages, Doc 8049.
RFMD's Reply Memorandum in Support of Its Motion to Dismiss Peregrine's 4th, 6th, 7th and 8th Counts for Lack of Subject Matter Jurisdiction filed Mar. 10, 2014 in CASD-3-12-cv-00911, 37 pages, Doc 8051.
Peregrine's Memorandum in Opposition to Benton's Motion to Dismiss (Public Redacted Version) filed Mar. 14, 2014 in CASD-3-12-cv-00911, 86 pages, Doc 8052.
Order (1) Granting in Part and Denying in Part RFMD's Motion to Dismiss; (2) Granting Benton's Motion to Dismiss; and (3) Denying Peregrine's Motion to Stay filed Mar. 18, 2014 in CASD-3-12-cv-00911, 10 pages, Doc 8053.
Stricken Document: Response to Claim Construction Brief Pursuant to Order 214 filed Mar. 18, 2014 in CASD-3-12-cv-00911, 1 page, Doc 8054.
RFMD's Responsive Brief on Claim Construction filed Mar. 18, 2014 in CASD-3-12-cv-00911, 36 pages, Doc 8055.
Order Striking Peregrine's Mar. 18, 2014 Filings and Granting Peregrine's Motion to File Responsive Claim Construction Brief filed Mar. 20, 2014 in CASD-3-12-cv-00911, 2 pages, Doc 8056.
Peregrine's Substitute Responsive Claim Construction Brief (Public Redacted Version) filed Mar. 24, 2014 in CASD-3-12-cv-00911, 20 pages, Doc 8057.
Peregrine's Opening Claim Construction Brief for U.S. Pat. No. 6,903,426 filed Apr. 4, 2014 in CASD-3-12-cv-00911, 149 pages, Doc 8058.
RFMD's Opening Brief on Claim Construction for U.S. Pat. No. 6,903,426 filed Apr. 4, 2014 in CASD-3-12-cv-00911, 148 pages, Doc 8059.
Peregrine's Responsive Claim Construction Brief for U.S. Pat. No. 6,903,426 filed Apr. 11, 2014 in CASD-3-12-cv-00911, 31 pages, Doc 8060.
RFMD's Responsive Brief on Claim Construction filed Apr. 11, 2014 in CASD-3-12-cv-00911, 79 pages, Doc 8061.
Tentative Claim Construction Order for U.S. Pat. Nos. 7,910,993, 8,405,147 and 6,903,426 filed Apr. 16, 2014 in CASD-3-12-cv-00911, 87 pages, Doc 8062.
Peregrine's Markman Hearing Slide Deck filed Apr. 18, 2014 in CASD-3-12-cv-00911, 62 pages, Doc 8063.
RFMD's Markman Hearing Slide Deck filed Apr. 18, 2014 in CASD-3-12-cv-00911, 36 pages, Doc 8064.
Claim Construction Order for U.S. Pat. Nos. 7,910,993, 8,405,147 and 6,903,426 filed Apr. 23, 2014 in CASD-3-12-cv-00911, 16 pages, Doc 8065.
Claim Construction Charts for U.S. Pat. Nos. 7,910,993, 8,405,147 and 6,903,426 filed Apr. 23, 2014 in CASD-3-12-cv-00911, 72 pages, Doc 8066.
Declaration of Brian Floyd, Ph.D. filed 3/'-12016 1n CASD-3-12-cv-00911, 23 pages, Doc 8050.
Peregrine's Complaint for Damages and Injunctive Relief filed May 11, 2012 in CASD-3-12-cv-01160, 9 pages, Doc 8083.
Peregrine's Complaint and Demand for Jury Trial filed Mar. 26, 2013 in CASD-3-13-cv-00725, 68 pages, 68 pages, Doc 8084.
RFMD's Complaint for Declaratory Judgment of Patent Non-Infringement and Invalidity filed Apr. 16, 2012 in NCMD-1-12-cv-00377, 246 pages, Doc 8085.
Voldman—"Dynamic Threshold Body- and Gate-coupled SOI ESD Protection Networks", Journal of Electrostatics 44, Mar. 20, 1998, pp. 239-255, Doc 8015.
Matloubian—"Smart Body Contact for SOI MOSFETs" 1989 IEEE SOS/SOI Technology Conference pp. 128-129, Oct. 3-5, 1989, 2 pages, Doc 0425.
Hieda—Floating-Body Effect Free Concave SOI-MOSFETs (COS-MOS), ULSI Research Center, Toshiba Corporation, IEEE 1991, pp. 26.2.1-26.2.4, Dec. 8-11, 1991, 4 pages, Doc 0187.

Patel—"A Novel Body Contact for SIMOX Based SOI MOSFETs", Solid-State Electronics vol. 34, No. 10, pp. 1071-1075, Apr. 22, 1991, 6 pages, Doc 3000.
Katzin—"High Speed 100+ W RF Switched Using GaAs MMICs", IEEE Transactions on Microwave Theory and Techniques, Nov. 1992, pp. 1989-1996, 8 pages, Doc 0194.
Armijos—"High Speed DMOS FET Analog Switches and Switch Arrays", Temic Semiconductors Jun. 22, 1994, pp. 1-10, 10 pages, Doc 0202.
Li—"Suppression of Geometric Component of Charge Pumping Current SOI/MOSFETs", Proc. Int. Symp. VLSI Technology, Systems & Applications (IEEE May 31-Jun. 2, 1995), pp. 144-148, 5 pages, Doc 8016.
Chan—"A Novel SOI CBiCMOS Compatible Device Structure for Analog and Mixed-Mode Circuits", Dept. of EECS, University of California at Berkeley, IEEE Nov. 1995, pp. 40-43, 4 pages, Doc 1078.
Kohama—"High Power DPDT Antenna Switch MMIC for Digital Cellular Services", IEEE Journal of Solid-State Circuits, Oct. 1996, pp. 1406-1411, 6 pages, Doc 0244.
Tenbroek—"Electrical Measure of Silicon Film and Oxide Thickness in Partially Depleted SOI Technologies", Solid-State Electronics, vol. 39, No. 7, pp. 1011-1014, Nov. 14, 1995, 4pages, Doc8019.
NEC Corporation—"uPG13xG Series L-Band SPOT Switch GaAs MMIC", Document No. P1096EJ1VOANDO (1st Edition), Feb. 1996, 30 pages, Doc 0248.
Kuge—"SOI-DRAM Circuit Technologies for Low Power High Speed Multigiga Scale Memories", Jun. 8-10, 1995, IEEE Journal of Solid-State Circuits, vol. 31, No. 4, Apr. 1996, pp. 586-591, 6 pages, Doc 0259.
Fung—"Frequency Dispersion in Partially Depleted SOI MOSFET Output Resistance", Proceedings 1996 IEEE International SOI Conference, Oct. 1996, pp. 146-147, 2 pages, Doc 0268.
Yamamoto—"A Single-Chip GaAs RF Transceiver for 1.9GHz Digital Mobile Communication Systems", IEEE Dec. 1996, pp. 1964-1973, 10 pages, Doc 0255.
Johnson—"Silicon-On-Sapphire Technology for Microwave Circuit Applications", Dissertation UCSD Jan. 1997, IEEE May 1998, pp. 1-184, 214 pages, Doc 0288.
Koh—"1Giga Bit SOI DRAM with Fully Bulk Compatible Process and Body-Contacted SOI MOSFET Structure", IEEE Dec. 10, 1997, pages, Doc 8021.
Maeda—"A Highly Reliable .35um Field Body-Tied SOI Gate Array for Substrate-Bias-Effect Free Operation", 1997 Symposium on VLSI Technology Digest of Technical Papers, Jun. 10-12, 1997, 2 pages, Doc 8020.
Koh—"Body-Contacted SOI MOSFET Structure with Fully Bulk CMOS Compatible Layout and Process", IEEE Electron Device Letters, vol. 18, No. 3, Mar. 1997, pp. 102-104, 3 pages, Doc 0305.
Huang—"Device Physics, Performance Simulations and Measured Results of SOI MOS and DTMOS Transistors and Integrated Circuits", Beijing Microelectronics Technology Institute, Oct. 23, 1998 IEEE, pp. 712-715, 4 pages, Doc 0333.
Hirota—"0.5V 320MHz 8b Multiplexer/Demultiplier Chips Based on a Gate Array with Regular-Structured DRMOS/SOI", Feb. 5-7, 1998, 1998 IEEE International Solid-State Circuits Conference. Digest of Technical Papers, ISSCC. First Edition, pp. 12.2-1-12.2-11, 11 pages, Doc0351.
Chuang—"SOI for Digital CMOS VLSI Design: Design Considerations and Advances", Proceedings of the IEEE vol. 86, No. 4, Apr. 1, 1998 pp. 689-720, 32 pages, Doc 1079.
Duyet—"Suppression of Geometric Component of Charge Pumping Current in Thin Film Silicon on insulator Metal-Oxide-Semiconductor Field-Effect Transistors", Japanese Journal of Applied Physics, Jul. 15, 1998, vol. 37, pp. L855-L858, 4 pages, Doc 0729.
Gil—"A High Speed and Low Power SOI Inverter using Active Body-Bias", Proceedings International Symposium on Low Power Electronics and Design, Sep. 1998, pp. 59-63, 5 pages, Doc 0359.
Tseng—"AC Floating-Body Effects an Submicron Fully Depleted (FD) SOI nMOSFETs and the Impact on Analog Applications", IEEE Electron Devices, vol. 19, No. 9, Sep. 1998, pp. 351-353, 3 pages, Doc 0362.

(56) References Cited

OTHER PUBLICATIONS

Duyet—"Effects of Body Reverse Pulse Bias on Geometric Component of Charge Pumping Current in FD SOI MOSFETs", Proceedings IEEE Intl SOI Conference, Oct. 5-8, 1998, pp. 79-80, 2 pages, Doc 0364.
Chung—"A New SOI MOSFET Structure with Junction Type Body Contact", International Electron Device Meeting (IEDM) Technical Digest, Dec. 5-8, 1999, pp. 59-62, 4 pages, Doc 0379.
Devlin—"The Design of Integrated Switches and Phase Shifters", Nov. 24, 1999, 15 pages, Doc 0381.
Lim—"Partial SOI LDMOSFETs for High-Side Switching", Dept. of Engineering, University of Cambridge, Oct. 5-9, 1999 IEEE, pp. 149-152, 4 pages, Doc 0393.
Maeda—"Substrate Bias Effect and Source Drain Breakdown Characteristics in Body Tied Short Channel SOI MOSFETs", IEEE Transactions on Electron Devices, vol. 46, No. 1, Jan. 1999, pp. 151-158, 8 pages, Doc 0397.
Rodgers—"Silicon UTSi CMOS RFIC for CDMA Wireless Communications System", IEEE MTT-S Digest, Jun. 14-15, 1999, pp. 485-488, 4 pages, Doc 0406.
Yamamoto—"A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512, 11 pages, Doc 0417.
Chen—"Low Power, Multi-Gigabit DRAM Cell Design Issues Using SOI Technologies", http://bwrc.eecs.berkeley.edu/people/grad_students/chenff/reports, May 14, 1999, 6 pages, Doc 0418.
Allen—"Characterization and Modeling of Silicon-on-Insulator Field Effect Transistors", Department of Electrical Engineering and Computer Science, MIT May 20, 1999, 80 pages, Doc 0419.
Tseng—"AC Floating-Body Effects and the Resultant Analog Circuit Issues in Submicron Floating Body and Body-Grounded SOI MOSFETs", IEEE Transactions on Electron Devices, vol. 46, No. 8, Aug. 1999, 8 pages, Doc 0420.
Fung—"Controlling Floating-Body Effects for 0.13um and .10um SOI CMOS", IDEM 00-231-234, Dec. 10-13, 2000, IEEE, 4 pages, Doc 8017.
Imam—"A Simple Method to Determine the Floating-Body Voltage of SOI CMOS Devices", IEEE Electron Device Letters, vol. 21, No. 1, Jan. 2000, pp. 21-23, 3 pages, Doc 0441.
Kanda—"A Si RF Switch MMIC for the Cellular Frequency Band Using SOI-CMOS Technology", The Institute of Electronics, Information and Communication Engineers, vol. 100, No. 152, Jun. 2000, pp. 79-83, 5 pages, Doc 0443.
Shahid!—"Issues in SOI CMOS Technology and Design", IEEE 2000 Custom Integrated Circuits Conference, Publication/Presentation dated May 21, 2000, 78 pages, Doc 8014.
Horiuchi—"A Dynamic-Threshold SOI Device with a J-FET Embedded Source Structure and a Merged Body-Bias-Control Transistor—Part II: Circuit Simulation", IEEE Transactions on Electron Devices, vol. 47, No. 8, Aug. 2000, pp. 1593-1598, 6 pages, Doc 0457.
Horiuchi—"A Dynamic-Threshold SOI Device with a J-FET Embedded Source Structure and a Merged Body-Bias-Control Transistor—Part I: A J-FET Embedded Source Structure Properties", IEEE Transactions on Electron Devices, vol. 47, No. 8, Aug. 2000, pp. 1587-1592, 6 pages, Doc 0456.
Scheinberg—"A Computer Simulation Model for Simulating Distortion in FET Resistors", IEEE Transactions on Computer-Aided Design of Integrated Circuits and Systems, vol. 19, No. 9, Sep. 2000, pp. 981-989, 9 pages, Doc 0461.
Cristoloveanu—"The Four-Gate Transistor", Institute of Microelectronics, Electromagnetism and Photonics, ESSDERC Sep. 24-26, 2002, pp. 323-326, 4 pages, Doc 0478.
Reedy—"Utsi CMOS: A Complete RF SOI Solution", Peregrine Semiconductor Nov. 2000, pp. 1-6, 6 pages, Doc 0508.
Yamamoto—"A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197, 12 pages, Doc 0527.
Adan—"OFF-State Leakage Current Mechanisms in BulkSi and SOI MOSFETs and Their Impact on CMOS ULSIs Standby Current", IEEE Transactions on Electron Devices, vol. 48, No. 9, Sep. 2001, pp. 2050-2057, 8 pages, Doc 0528.
Goldman—"0.15um SOI DRAM Technology Incorporating Sub-Volt Dynamic ; Threshold Devices for Embedded Mixed-Signal & RF Circuits", Oct. 1-4, 2001 IEEE SOI Conference, pp. 97-98, 2 pages, Doc 0531.
Fung—"Present Status and Future Direction of BSIM SOIL Model for High-Performance/Low-Power/RF Application", IBM Microelectronics, Semiconductor Research and Development Center, Apr. 2002, 4 pages, Doc 0554.
Adan—"Linearity and Low-Noise Performance of SOI MOSFETs for RF Applications", IEEE Transactions on Electron Devices, May 2002 vol. 49, No. 5, pp. 881-888, 8 pages, Doc 0555.
Akarvardar—"Multi-Bias Dependence of Threshold Voltage, Subthreshold Swing, and Mobility in G4-FETs", Institute of Microelectronics, Electromagnetism, and Photonics, IEEE Oct. 2003, pp. 127-130, 4 pages, Doc 1075.
Dufrene—"The G4-FET: Low Voltage to High Voltage Operation and Performance", Dept. of Electrical and Computer Engineering, The University of Tennessee, IEEE Jan. 2003, pp. 55-56, 2 pages, Doc 0565.
Marks—"SOI for Frequency Synthesis in RF Integrated Circuits", Thesis submitted to North Carolina State University, May 2003, 155 pages, Doc 0574.
Zhu Ming—"A New Structure of Silicon-on-Insulator Metal-Oxide Semiconductor Field Effect Transistor to Suppress the Floating Body Effect", Nov. 4, 2002, Chin. Phys. Lett., vol. 20, No. 5 (2003) pp. 767-769, 3 pages, Doc 0575.
Fung—"On the Body-Source Built-In Potential Lowering of SOI MOSFETS", IEEE Electron Device Letters, vol. 24, No. 2, Feb. 2003, pages, Doc 8018.
Tinella—"Study of the Potential of CMOS-SOI Technologies Partially Abandoned for Radiofrequency Applications", Thesis for obtaining the standard of Doctor of INPG, National Polytechnic of Grenoble, Sep. 25, 2003, 187 pages, Doc 0594.
De Houck—"Design of EEPROM Memory Cells in Fully Depleted 'CMOS SOI Technology'", Universite Catholique de Louvain Faculty of Applied Science, Laboratory of Electronics and Microelectronics, Academic Year 2003-2004, Jan. 2003, 94 pages, Doc 0599.
Streetman—"Solid State Electronic Devices", Microelectronics Research Center, Dept. of Electrical and Computer Engineering, The University of Texas at Austin, Chapter 6, Jan. 2004 by Pearson Education Inc., 4 pages, Doc 0602.
Zhu—"Simulation of Suppression of Floating-Body Effect in Partially Depleted SOI MOSFET Using a Sil-xGex Dual Source Structure", Materials Science and Engineering B 114-115 Dec. 15, 2004, pp. 264-268, 5 pages, Doc 0604.
Chen—"G4-FET Based Voltage Reference", Masters Theses, University of Tennessee, Knoxville, Trace: Tennessee Research and Creative Exchange, May 2004, 57 pages, Doc 0607.
Ippoushi—"SOI Structure Avoids Increases in Chip Area and Parasitic Capacitance Enables Operational Control of Transistor Threshold Voltage", Renesas Edge, vol. 2004.5, Jul. 2004, p. 15, 1 page, Doc 0610.
Akarvardar—"Threshold Voltage Model of the SOI 4-Gate Transistor", 2004 IEEE International SOI Conference, Oct. 4-7, 2004, pp. 89-90, 2 pages, Doc 0613.
Dufrene—"Investigation of the Four-Gate Action in G4-FETs", IEEE Transactions or Electron Devices, vol. 51, No. 11, Dec. 2004, pp. 1931-1935, 5 pages, Doc 0617.
Cathelin—"Antenna Switch Devices in RF Modules for Mobile Applications", ST Microelectronics, Front-End Technology Manufacturing, Crolles, France, Mar. 2005, 42 pages, Doc 0623.

\* cited by examiner

CIRCUIT AND METHOD FOR CONTROLLING CHARGE INJECTION IN RADIO FREQUENCY SWITCHES

CROSS-REFERENCE TO RELATED UTILITY AND PROVISIONAL APPLICATIONS—CLAIMS OF PRIORITY

This application is a continuation of co-pending and commonly assigned U.S. patent application Ser. No. 14/987,360, filed Jan. 4, 2016, entitled "Circuit and Method for Controlling Charge Injection in Radio Frequency Switches", which application is a continuation of commonly assigned U.S. patent application Ser. No. 14/257,808, filed Apr. 21, 2014, (now U.S. Pat. No. 9,397,656 issued Jul. 19, 2016) entitled "Circuit and Method for Controlling Charge Injection in Radio Frequency Switches", which application Ser. No. 14/257,808 is a continuation of and commonly assigned U.S. patent application Ser. No. 11/881,816, filed Jul. 26, 2007, entitled "Circuit and Method for Controlling Charge Injection in Radio Frequency Switches", which is a Continuation-in-Part (CIP) of commonly assigned U.S. patent application Ser. No. 11/520,912, filed Sep. 14, 2006 (now U.S. Pat. No. 7,890,891 issued Feb. 15, 2011) entitled "METHOD AND APPARATUS IMPROVING GATE OXIDE RELIABILITY BY CONTROLLING ACCUMULATED CHARGE", which claims the benefit under 35 U.S.C. § 119(e) of U.S. Provisional Application No. 60/718,260, filed Sep. 15, 2005; the cited application Ser. No. 11/520,912, filed Sep. 14, 2006, is a CIP of U.S. patent application Ser. No. 11/484,370, filed Jul. 10, 2006 (now U.S. Pat. No. 7,910,993 issued Mar. 22, 2011) entitled "METHOD AND APPARATUS FOR USE IN IMPROVING LINEARITY OF MOSFETS USING AN ACCUMULATED CHARGE SINK", which claims the benefit under 35 U.S.C. § 119(e) of U.S. Provisional Application No. 60/698,523, filed Jul. 11, 2005; CIP application Ser. No. 11/881,816 is also a CIP of the cited U.S. patent application Ser. No. 11/484,370, filed Jul. 10, 2006 (now U.S. Pat. No. 7,910,993 issued Mar. 22, 2011); CIP application Ser. No. 11/881,816 also claims the benefit under 35 U.S.C. § 119(e) of U.S. Provisional Application No. 60/833,562, filed Jul. 26, 2006, entitled "CIRCUIT AND METHOD FOR CONTROLLING CHARGE INJECTION IN RADIO FREQUENCY SWITCHES". The present continuation application is related to each of the applications set forth above. All of the applications and issued patents set forth above are hereby incorporated by reference herein as if set forth in full.

BACKGROUND

1. Field

The present teachings relate to electronic switches, and particularly to a circuit and method for controlling charge injection in semiconductor-on-insulator (SOI) radio frequency (RF) switches.

2. Description of Related Art

Radio frequency (RF) switches for directing RF signals are found in many different RF devices such as televisions, video recorders, cable television equipment, cellular telephones, wireless pagers, wireless infrastructure equipment, and satellite communications equipment. As is well known, the performance of RF switches is controlled by three primary operating performance parameters: insertion loss, switch isolation, and the "1 dB compression point." The "1 dB compression point" is related to, and is indicative of, the linearity performance of an RF switch. Linearity performance is also indicated by the levels of RF signal harmonics generated by an RF switch, particularly at high RF power levels. These three performance parameters are tightly coupled, and any one parameter can be emphasized in the design of RF switch components at the expense of others. A fourth performance parameter that is occasionally considered in the design of RF switches is commonly referred to as the switching time or switching speed (defined as the time required to turn one side of a switch on and turn the other side off). Other characteristics important in RF switch design include ease and degree (or level) of integration of the RF switch, complexity, yield, return loss and cost of manufacture.

Charge injection is a problem that may occur in switching circuits such as SOI RF switches. Charge injection occurs when an applied voltage, such as a gate bias voltage, is connected to a "resistively-isolated node" through a coupling capacitance. A resistively-isolated node is defined herein as a node that at some interval during operation is connected to other circuit elements only through very high resistance connections. For example, a resistively-isolated node may occur at a transistor channel node located between series-connected transistors when the transistors are in an OFF-state. The coupling capacitance through which charge injection occurs may be either a parasitic capacitance of a circuit element (e.g., gate-to-source capacitance in a transistor), or a capacitance associated with a capacitor. For example, a bias voltage applied to the gate of a transistor may be connected to a resistively-isolated source node of the transistor through the gate-to-source capacitance. In general, charge injection may be a problem for many types of switching circuits. In particular, charge injection is significantly deleterious to the performance properties of SOI RF switches. Further, teachings on prior art SOI RF switches do not address this problem, for reasons described in more detail hereinbelow. Consequently, a need exists for a novel circuit and method for controlling charge injection in SOI RF switches.

SUMMARY

A novel circuit and method for controlling charge injection in an SOI RF switch are disclosed. The SOI RF switch may comprise a plurality of switching transistors connected in series (referred to herein as "stacked" switching transistors) implemented as a monolithic integrated circuit (IC) on an SOI substrate. In one embodiment the SOI RF switch is fabricated on an Ultra-Thin-Silicon ("UTSi") substrate, also referred to herein as "silicon on sapphire" (SOS). In another embodiment, the SOI RF switch is fabricated in silicon-on-bonded wafer technology.

In an embodiment according to the present disclosure, an SOI RF switch includes at least one stack comprising a plurality of switching transistors connected in a series circuit. Charge injection control elements are connected to receive injected charge from resistively-isolated nodes located between the switching transistors, and to convey the injected charge to one or more nodes that are not resistively-isolated. Optionally, the charge injection control elements may be connected to receive a control signal for switching the charge injection control elements between ON-states and OFF-states. In one embodiment, each switching transistor in a stack of the SOI RF switch has at least one charge injection control element operatively connected between a source node and a drain node of each switching transistor.

In one embodiment, the charge injection control elements comprise charge injection control resistors. In another embodiment, the charge injection control elements comprise charge injection control transistors connected to receive a control signal for switching the injection control transistors between and ON-state and an OFF-state. The charge injection control transistors are operated so that they are in the ON-state when the switching transistors are in an ON-state. When the switching transistors are switched from the ON-state to an OFF-state, the charge injection control transistors are switched from an ON-state to an OFF-state after a selected delay time interval, thereby allowing the injected charge to be conveyed to the least one node that is not resistively-isolated.

In one embodiment, a method for controlling charge injection includes: 1) causing charge injection to occur at resistively-isolated nodes located between the switching transistors; 2) conveying the injected charge via charge injection control elements to at least one node that is not resistively-isolated; and, 3) optionally switching the charge injection control elements from an ON-state to an OFF-state.

According to one embodiment of the method for controlling charge injection, the charge injection control elements may comprise charge injection control resistors. In another embodiment, the charge injection control elements may comprise charge injection control transistors.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The problems caused by charge injection in SOI RF switches may be described with reference to FIG. 1A. An SOI RF switch 100 comprises stacked switching transistors 111, 113, 115 and 117. As disclosed in commonly-assigned U.S. application Ser. Nos. 10/922,135 and 10/267,531, incorporated by reference hereinabove, RF switches using stacked switching transistors have many performance advantages over prior art RF switches, such as higher RF power capability and reduced generation of harmonics in the switched RF signal. (For further information on stacked switching transistors, see commonly assigned application Ser. No. 10/922,135, filed Aug. 18, 2004, which issued Oct. 17, 2006 as U.S. Pat. No. 7,123,898, and is a continuation application of application Ser. No. 10/267,531, filed Oct. 8, 2002, which issued Oct. 12, 2004 as U.S. Pat. No. 6,804,502, entitled "SWITCH CIRCUIT AND METHOD OF SWITCHING RADIO FREQUENCY SIGNALS"; application Ser. No. 10/267,531 claimed the benefit under 35 U.S.C. § 119(e) of U.S. Provisional Application No. 60/328,353, filed Oct. 10, 2001. All of the applications and issued patents set forth in the preceding sentence are hereby incorporated by reference herein as if set forth in full.) Although four stacked switching transistors are shown in FIG. 1A, it will be apparent to persons skilled in the arts of electronic circuits that the present teachings apply to RF switches having an arbitrary plurality of stacked switching transistors.

Figure 1A:
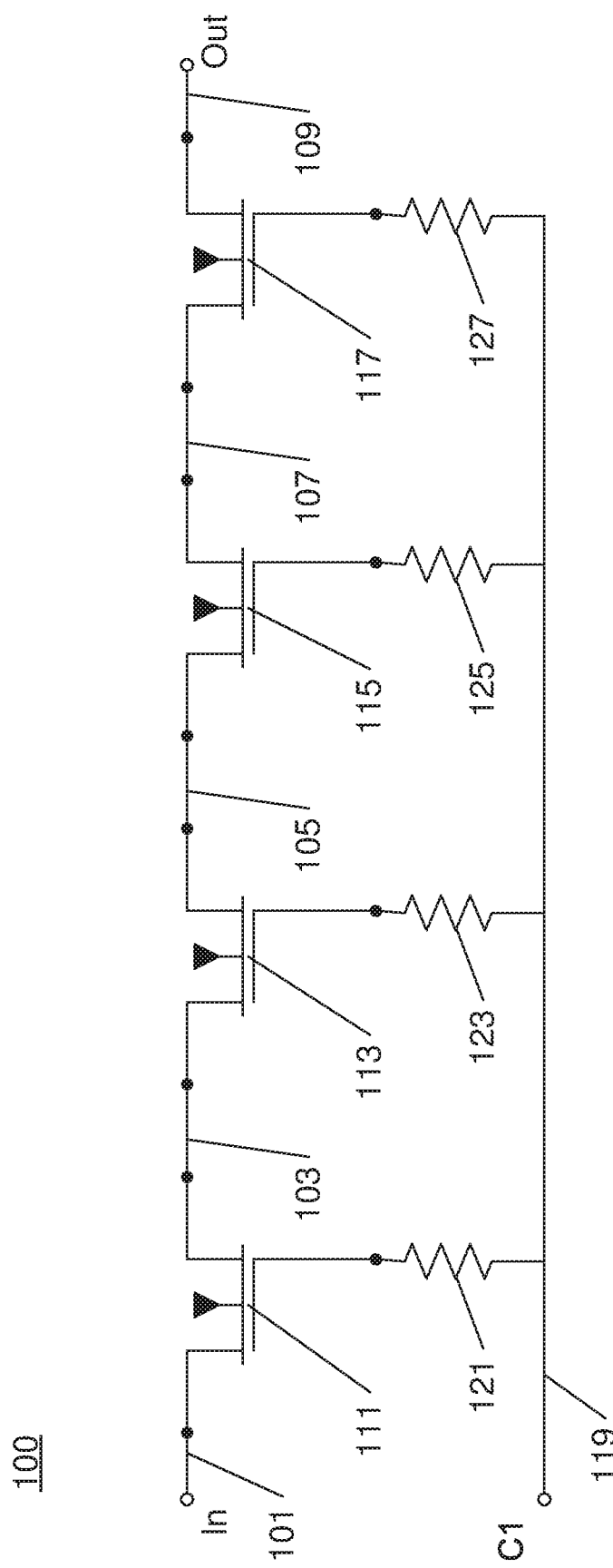
FIG. 1A schematically illustrates an SOI RF switch circuit using stacked switching transistors.

As shown in FIG. 1A, a first channel node of the switching transistor 111 may receive an input RF signal from a node 101. A second channel node of the switching transistor 111 is operatively connected through a node 103 to a first node of the switching transistor 113. A second channel node of the switching transistor 113 is operatively connected through a node 105 to a first channel node of the switching transistor 115. A second channel node of the switching transistor 115 is operatively connected through a node 107 to a first channel node of the switching transistor 117. A second channel node of the switching transistor 117 is connected to a node 109, which may output an RF signal. Typically, the nodes 101 and 109 are connected to load impedances (not shown) having resistance values to ground on the order of 50 or 75 ohms.

Gate nodes of the switching transistors 111, 113, 115 and 117 are separately connected to gate resistors 121, 123, 125 and 127, respectively. As disclosed in U.S. application Ser. Nos. 10/922,135 and 10/267,531, the gate resistors are included to enable voltage division of RF signals across the switching transistors, protect bias circuits, and prevent transmission of parasitic RF signals between the stacked switching transistors. In some embodiments, the resistance Rg of each gate resistor should be at least ten times larger than the RF impedance of the gate-to-drain capacitance Cgd of the switching transistor to which it is connected. The gate resistors 121, 123, 125 and 127 are jointly connected to a gate control line 119 to receive a gate control signal C1.

The operation and advantages of RF switches such as the SOI RF switch 100 have been previously disclosed, as for example in U.S. application Ser. Nos. 10/922,135 and 10/267,531. However, the charge injection problem and solution have not been previously disclosed. In the present example, as illustrated by FIG. 1A, charge injection may occur at the nodes 103, 105 and 107 in the following manner. For the present example, the switching transistors 111, 113, 115 and 117 comprise enhancement-mode n-channel Metal-Oxide-Semiconductor Field Effect Transistors (MOSFETs) with a threshold voltage of +0.3 V. The gate control signal C1 is varied between a voltage of +3.0 V wherein the switching transistors are ON, and a voltage of −3.0 V wherein the switching transistors are OFF.

When the gate control signal C1 changes from +3 V to −3 V, the voltage passes through the switching transistor threshold voltage +0.3 V. During this process, the switching transistors 111 and 117 will switch from ON to OFF without difficulty because the nodes 109 and 101 are connected to load resistors (not shown) and therefore have an average DC potential at approximately ground potential or 0 V. The first channel node of the switching transistor 111 and the second channel node of the switching transistor 117 will be at a DC bias voltage of approximately 0 V, and their respective gate nodes will be a voltage of −3 V. However, when the switching transistors 111 and 117 switch from ON to OFF, the nodes 103, 105 and 107 become resistively isolated, as defined hereinabove in paragraph 004. For this reason, charge injection through the gate-to-channel capacitances of the switching transistors 113 and 115 to the nodes 103, 105 and 107 will occur as the control signal C1 voltage moves from the threshold voltage of +0.3 to −3 V. The charge injection will tend to maintain the nodes 103, 105 and 107 at voltages that may be only slightly more positive than the control signal C1 voltage. This will prevent the channels of the transistors 103, 105 and 107 from achieving a highly depleted condition, which is required for proper operation of the SOI RF switch 100.

Figure 1B:
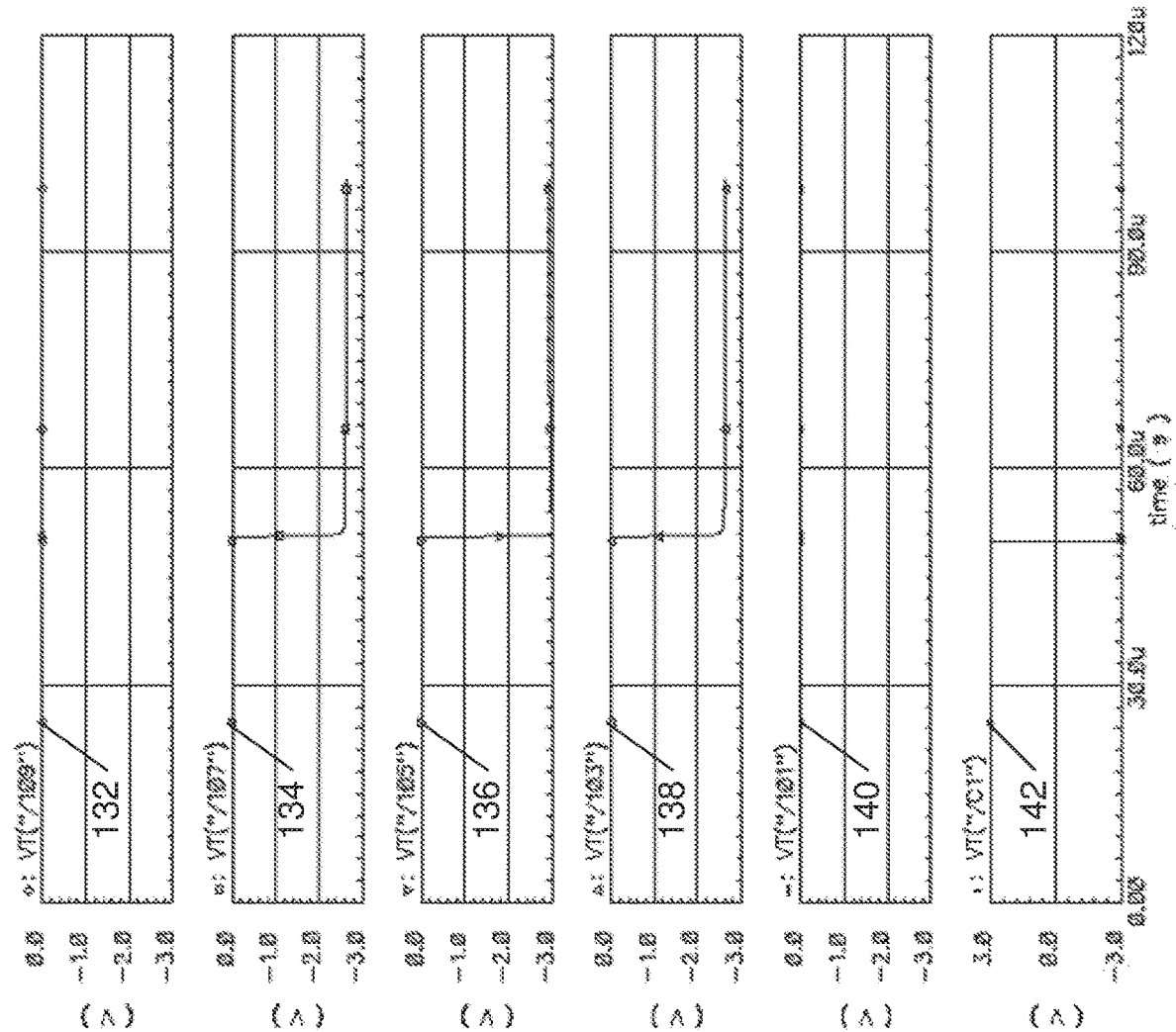
FIG. 1B illustrates the effects of charge injection in an SOI RF switch circuit using stacked switching transistors.

These effects are illustrated in FIG. 1B by simulated data for the SOI RF switch 100. When a control voltage 142 (C1) is switched from +3 V to −3 V, voltages 134, 136 and 138 on nodes 107, 105 and 103, respectively, follow the voltage 142 as described above. Voltages 132 and 140 on nodes 109 and 101, respectively, remain at 0 V because they are not resistively isolated.

Prior art teachings are not informed regarding the problem of charge injection as described above. The principal reason for this is that RF switches such as SOI RF switch 100 are typically used to switch RF signals of several volts AC amplitude. If some of the switching transistors are not in a strong OFF-state, the RF signals will cause breakdown effects in the switching transistors that are strongly turned OFF and therefore receive larger RF signal voltages. These breakdown effects remove the injected charge from the resistively-isolated nodes, thereby enabling the switches to operate after a time interval. However, the breakdown effects may have deleterious effects on the reliability of the switching transistors. Further, because the breakdown effects occur over a time interval, the performance of the RF switch is adversely affected during the time interval. In particular, during the time interval wherein the injected charge is not completely removed, the switch response becomes nonlinear, and undesirable RF harmonics may be generated by the SOI RF switch.

Figure 1C:
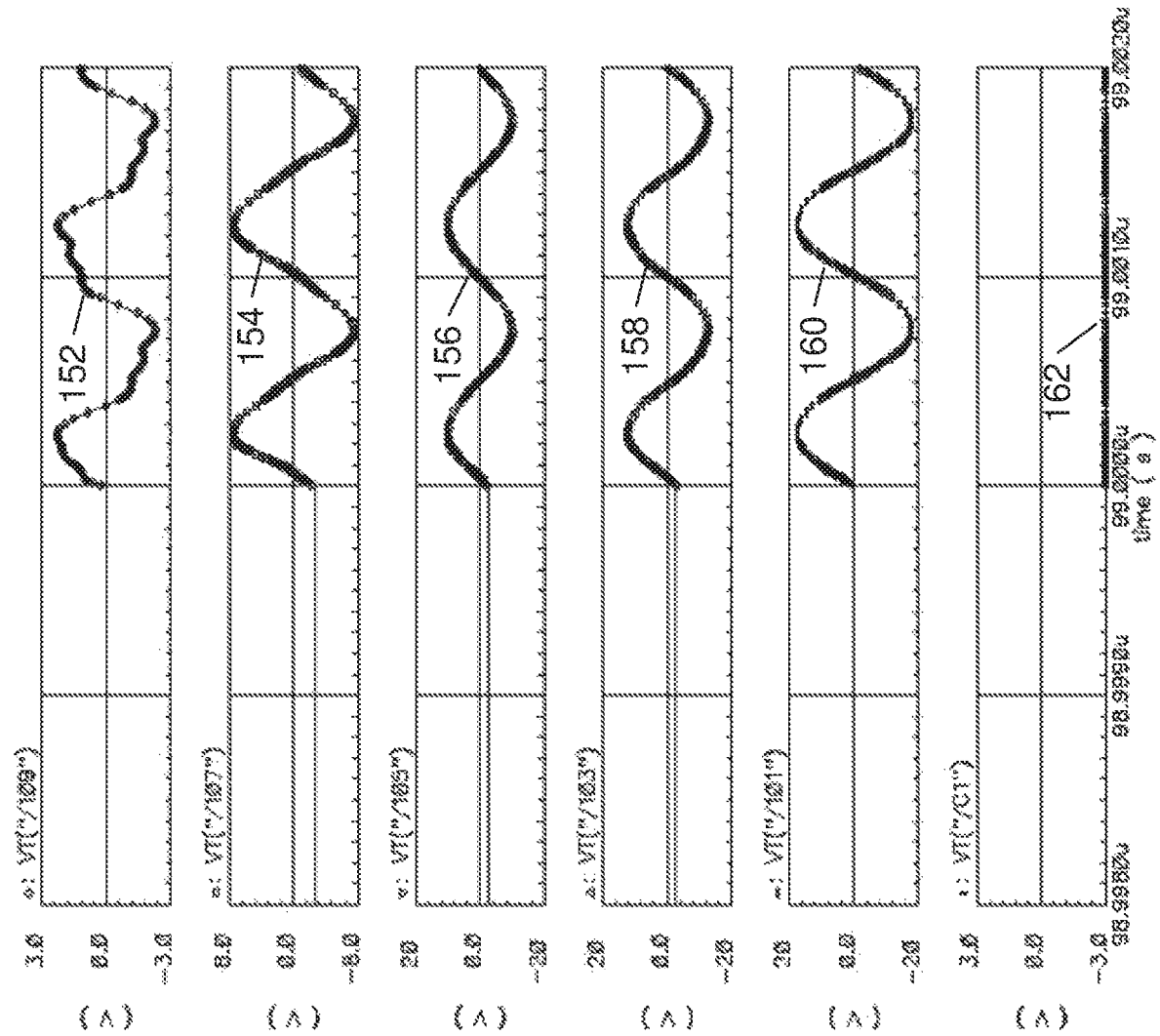
FIG. 1C illustrates simulated data for the RF switch of FIG. 1A wherein the RF switch has recently been switched from an ON-state to an OFF-state.

These deleterious effects are illustrated in FIG. 1C by simulated data for the SOI RF switch 100 that has been recently switched from the ON-state to the OFF-state. At a time 99.0000 microseconds, an RF signal 160 is applied at the node 101. RF signals 158, 156, 154 and 152 appear at nodes 103, 105, 107 and 109, respectively, due to parasitic coupling effects. Persons skilled in the electronic arts will recognize from the distorted waveforms seen in the RF signals 158, 156, 154 and 152 that significant nonlinear distortion is present during the time interval illustrated, which corresponds to a time when charge injection effects are present. These deleterious effects due to charge injection can be reduced or eliminated according to the teachings herein.

SOI RF Switch with a Charge Injection Control Circuit

Figure 2:
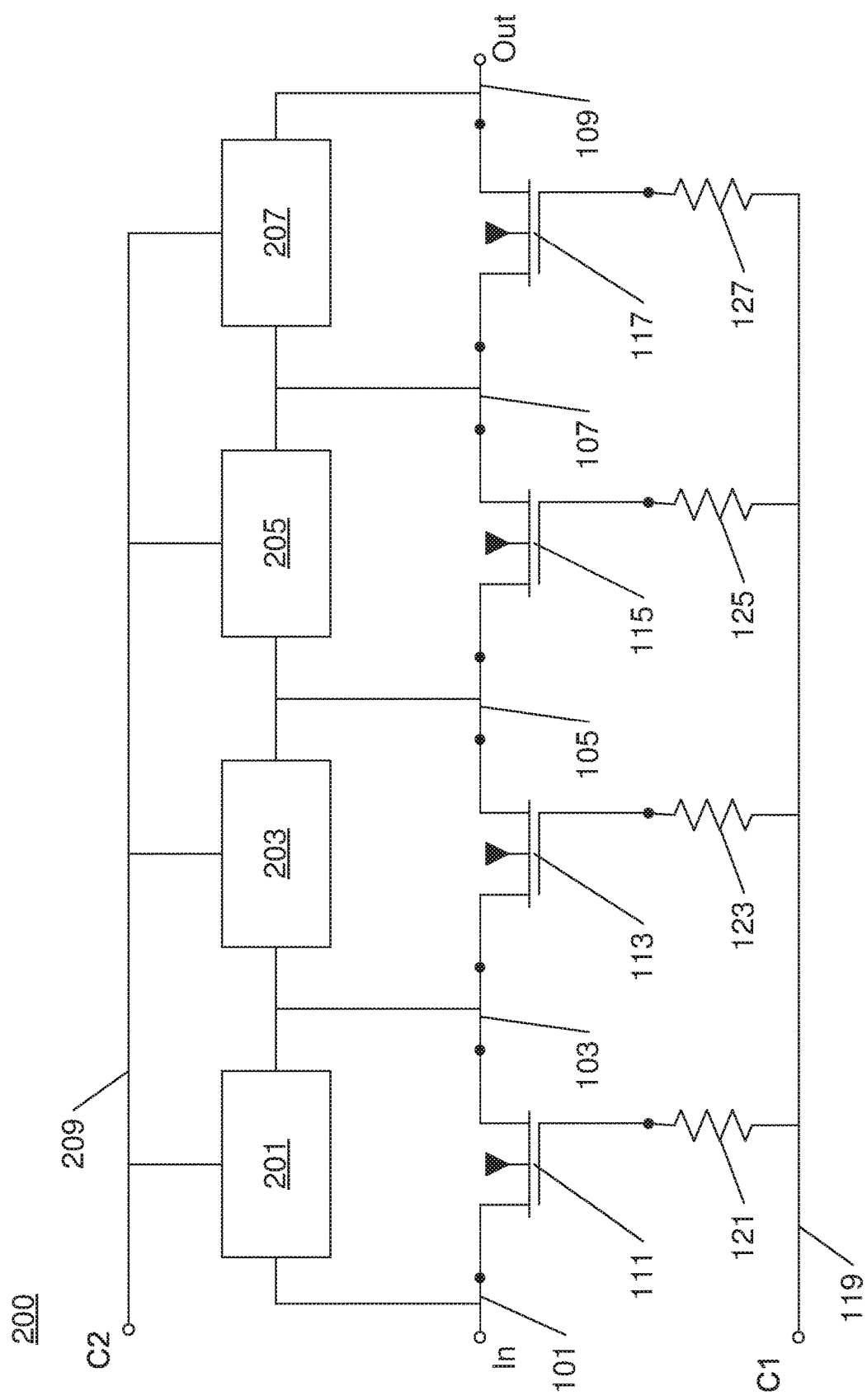
FIG. 2 schematically illustrates an embodiment according to the present disclosure, including a charge injection control circuit.

An embodiment of a charge injection control circuit to remove injected charge in an SOI RF switch is illustrated by FIG. 2.

In FIG. 2, an SOI RF switch 200 includes charge injection control elements 201, 203, 205 and 207 that comprise elements of a charge injection control circuit. A first and second channel node of the charge injection control element 201 are operatively connected to the nodes 101 and 103, respectively. A first and second channel node of the charge injection control element 203 are operatively connected to the nodes 103 and 105, respectively. A first and second channel node of the charge injection control element 205 are operatively connected to the nodes 105 and 107, respectively. A first and second channel node of the charge injection control element 207 are similarly operatively connected to the nodes 107 and 109, respectively. Optionally (e.g., as described below in reference to FIG. 4), the charge injection control elements 201, 203, 205 and 207 may be connected to a control line 209 to receive a control signal C2.

The charge injection control elements 201, 203, 205 and 207 receive injected charge from the nodes 103, 105 and 107, and selectively convey the injected charge to the nodes 101 and 109. For some embodiments, the control voltage C2 may be used to switch the charge injection control elements 201, 203, 205 and 207 between ON and OFF states (e.g., as described below in reference to FIG. 4).

For improved performance, the charge injection control elements 201, 203, 205 and 207 should be designed to have an impedance sufficiently high to prevent degradation of the RF isolation performance of the SOI RF switch 200. However, the charge injection control elements 201, 203, 205 and 207 should also have an impedance sufficiently low to effectively remove the injected charge and avoid degradation of the switching time for the SOI RF switch 200. Further, in some embodiments, the charge injection control elements 201, 203, 205 and 207 are designed so that they do not cause nonlinear behavior and RF harmonic generation. In addition, it is desirable that the charge injection control elements 201, 203, 205 and 207 do not degrade the switching time of the SOI RF switch 200. These design tradeoffs are described in more detail below in reference to FIGS. 3 and 4.

Many configurations of charge injection control elements can be used to remove injected charge from resistively-isolated nodes between switching transistors in SOI RF switches.

Figure 3:
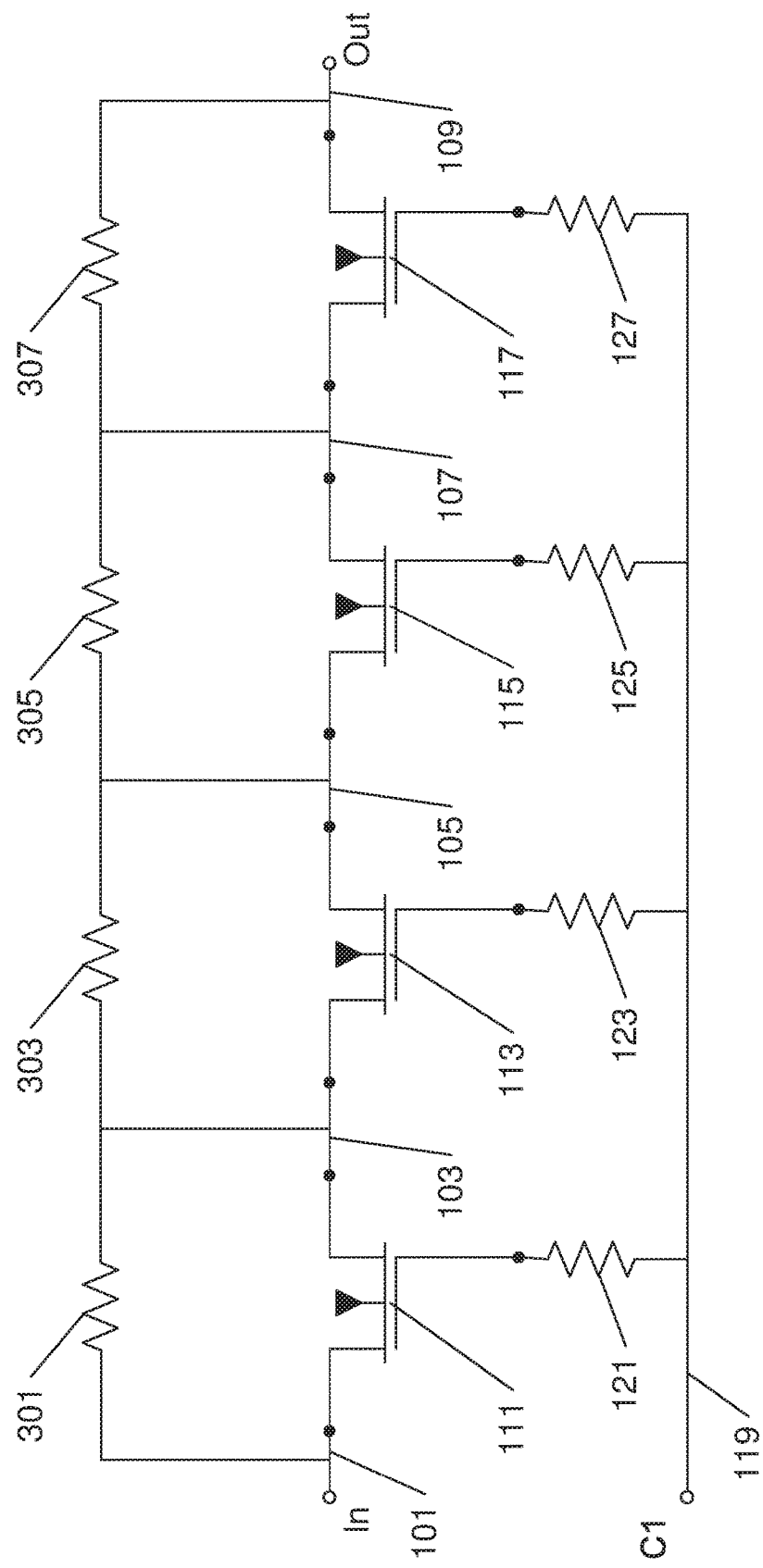
FIG. 3 shows a schematic illustration of an embodiment according to the present disclosure, using resistors in a charge injection control circuit.

SOI RF Switch Circuits with Charge Injection Control Circuits Using Resistors An embodiment of a charge injection control circuit using resistors to remove injected charge in an SOI RF switch is illustrated in FIG. 3. In FIG. 3, an SOI RF switch 300 includes charge injection control resistors 301, 303, 305 and 307 that comprise elements of a charge injection control circuit. A first node of the charge injection control resistor 301 is operatively connected to the node 101, and a second node of the charge injection control resistor 301 is operatively connected to the node 103. Similarly, a first node of the charge injection control resistor 303 is operatively connected to the node 103, and a second node of the charge injection control resistor 303 is operatively connected to the node 105. Similarly, a first node of the charge injection control resistor 305 is operatively connected to the node 105, and a second node of the charge injection control resistor 305 is operatively connected to the node 107. Similarly, a first node of the charge injection control resistor 307 is operatively connected to the node 107, and a second node of the charge injection control resistor 307 is operatively connected to the node 109. The charge injection control resistors 301, 303, 305 and 307 receive injected charge from the nodes 103, 105 and 107, and convey the injected charge to the nodes 101 and 109.

As noted above, for improved performance, the charge injection control resistors 301, 303, 305 and 307 are designed to have a sufficiently high resistance valve to prevent degradation of the RF isolation performance of the SOI RF switch 300. However, the charge injection control resistors 301, 303, 305 and 307 should also have a low enough resistance to effectively remove the injected charge. Using circuit simulation techniques, good performance has been determined for charge injection resistors selected according to the following equation:

$$Rc = Rg/N \quad \text{[EQUATION 1]}$$

In Equation 1, Rc is the resistance of each charge injection control resistor, Rg is the resistance of each gate resistor, and N is the number of RF switching transistors in the stack, also referred to as the "stack height". It has been determined that choosing the charge injection resistors according to EQUATION 1 provides minimal degradation to the isolation and switching time performance of the SOI RF switch. In one embodiment, SOI RF switch 300 may have gate resistors 121, 123, 125 and 127 that are each 100 K-ohm. In this embodiment, the charge injection control resistors 301, 303, 305 and 307 will each comprise 25 K-ohm resistors, because the stack height N=4 in this example. The present disclosure also encompasses use of charge injection control resistors having Rc values other than as indicated by EQUATION 1. For example, in some embodiments Rc may be selected in the range 10×Rg/N>Rc>Rg/10N.

U.S. application Ser. No. 11/484,370, filed Jul. 10, 2006, pending, incorporated by reference hereinabove, discloses using drain-to-source Rds resistors between the source and drain of a stacked SOI RF switch having an accumulated charge sink. Although the Rds resistors 802, 804, and 806 as shown in FIG. 8, of the U.S. application Ser. No. 11/484,370 have a configuration that is similar to the charge injection control resistors 301, 303, 305 and 307, their function and operation are distinct. In particular, the Rds resistors 802, 804, and 806 are included to allow removal of a DC current generated by using an accumulated charge sink, while the present disclosure provides a solution to the more general problem of charge injection in SOI RF switches that may or may not have an accumulated charge sink.

Charge Injection Control Circuit Using Transistors to Remove Injected Charge

Figure 4:
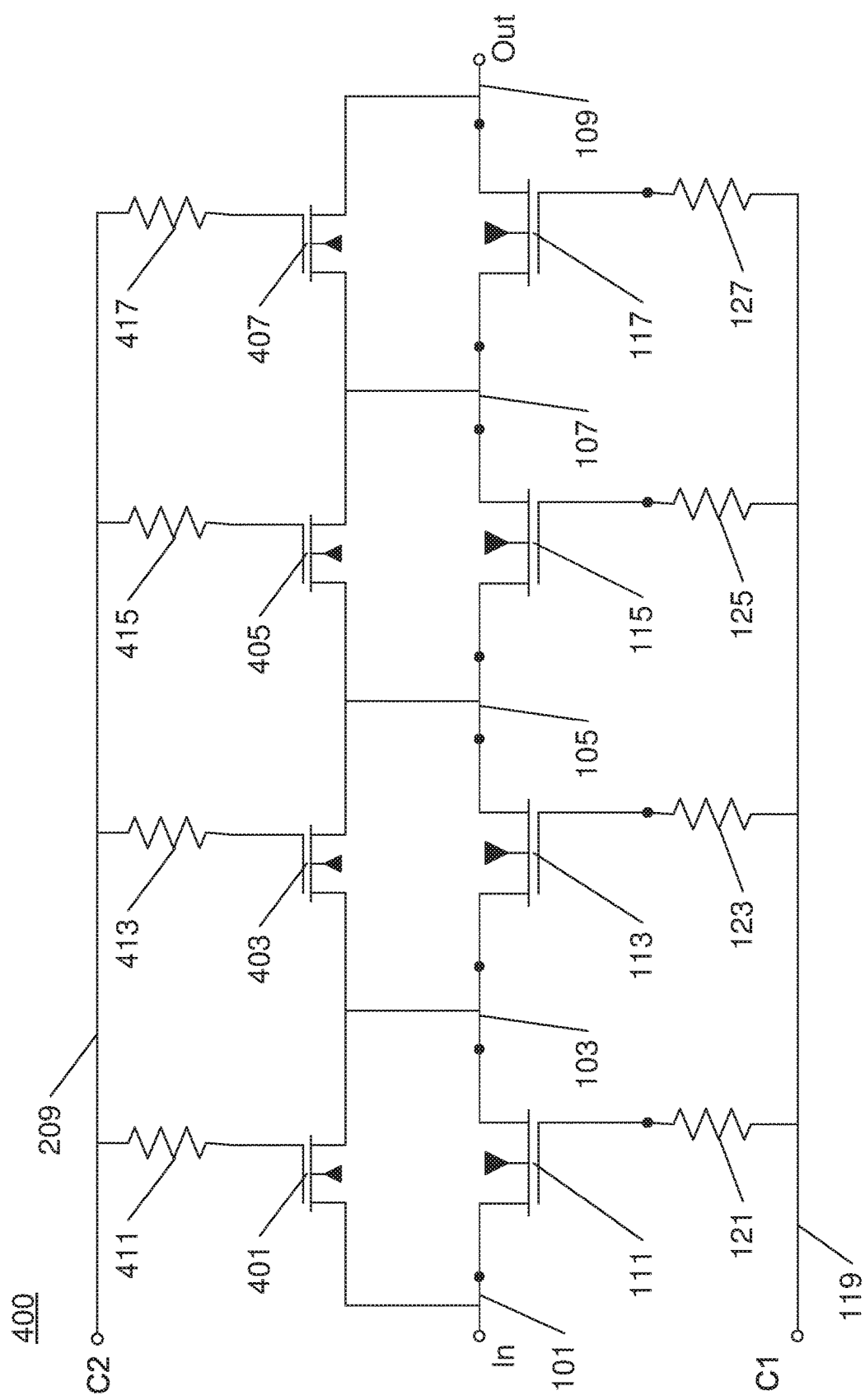
FIG. 4 shows a schematic illustration of an embodiment according to the present disclosure, using transistors in a charge injection control circuit.

An embodiment of a charge injection control circuit using transistors to remove injected charge in an SOI RF switch is illustrated by FIG. 4.

In FIG. 4 an SOI RF switch 400 includes charge injection control transistors 401, 403, 405 and 407 that comprise elements of a charge injection control circuit. A first and second channel node of the charge injection control transistor 401 are operatively connected to the nodes 101 and 103, respectively. Similarly, a first and second channel node of the charge injection control transistor 403 are operatively connected to the nodes 103 and 105, respectively. Similarly, a first and second channel node of the charge injection control transistor 405 are operatively connected to the nodes 105 and 107, respectively. Similarly, a first and second channel node of the charge injection control transistor 407 are operatively connected to the nodes 107 and 109, respectively.

The gates of the charge injection control transistors 401, 403, 405 and 407 are operatively connected to gate resistors 411, 413, 415 and 417, respectively. The gate resistors 411, 413, 415 and 417 are also connected to a control line 209 to receive a control signal C2 that is conveyed to the gates of the charge injection control transistors 401, 403, 405 and 407. The gate resistors 411, 413, 415 and 417 are included to enable voltage division of RF signals across the switching transistors, protect bias circuits, and prevent transmission of parasitic RF signals between the stacked switching transistors.

In one embodiment, in operation, the control signal C2 provides a voltage signal to maintain the charge injection control transistors 401, 403, 405 and 407 in an ON-state during time intervals in which the gate control signal C1 maintains the switching transistors 111, 113, 115 and 117 in an ON-state. For example, the transistors 401, 403, 405, 407, 111, 113, 115 and 117 may all be enhancement-mode n-channel MOSFETs with a threshold voltage of +0.1 V. The gate control signals C1 and C2 may be selected to vary between a voltage of +1.0 V to turn the transistors ON, and a voltage of −3.0 V to turn the transistors OFF.

When the gate control signal C1 transitions from +1 V to −3 V, the voltage passes through the switching transistor threshold voltage +0.1 V. If the gate control signal C2 is maintained at a voltage of +1 V for a time interval after the gate control signal C1 transitions from +1 V to −3 V, the nodes 103, 105 and 107 maintain low resistance connections to the nodes 101 and 109 via the ON-state charge injection control transistors 401, 403, 405 and 407. This low resistance connection conveys the injected charge from the nodes 103, 105 and 107 to the nodes 101 and 109, thereby controlling the charge injection process. After the switching transistors 111, 113, 115 and 117 are in the OFF-state, the charge injection control transistors 401, 403, 405 and 407 may be switched to the OFF-state by changing the gate control signal C2 from +1 V to −3 V.

In order to reduce charge injection via the charge injection control transistors 401, 403, 405 and 407 to the nodes 103, 105 and 107 that may occur when the charge injection control transistors 401, 403, 405 and 407 are switched OFF, the capacitances between the gate nodes and the channel nodes of the charge injection control transistors should be made smaller than the capacitances between the gate nodes and the channel nodes of the switching transistors. This may be accomplished by making the widths of the charge injection control transistors smaller than the widths of the switching transistors. For example, if the charge injection control transistors have a width Wc that is 0.1 times as large as a width Ws of the switching transistors, the charge injection magnitude will be smaller by a factor of approximately 0.1. At this level, the charge injection will be sufficiently small to not degrade performance for an SOI RF switch such the exemplary SOI RF switch 400.

Some advantages of using charge injection control transistors, rather than charge injection control resistors, are reduced switching time and improved switch isolation.

Charge Injection Control Method

Figure 5:
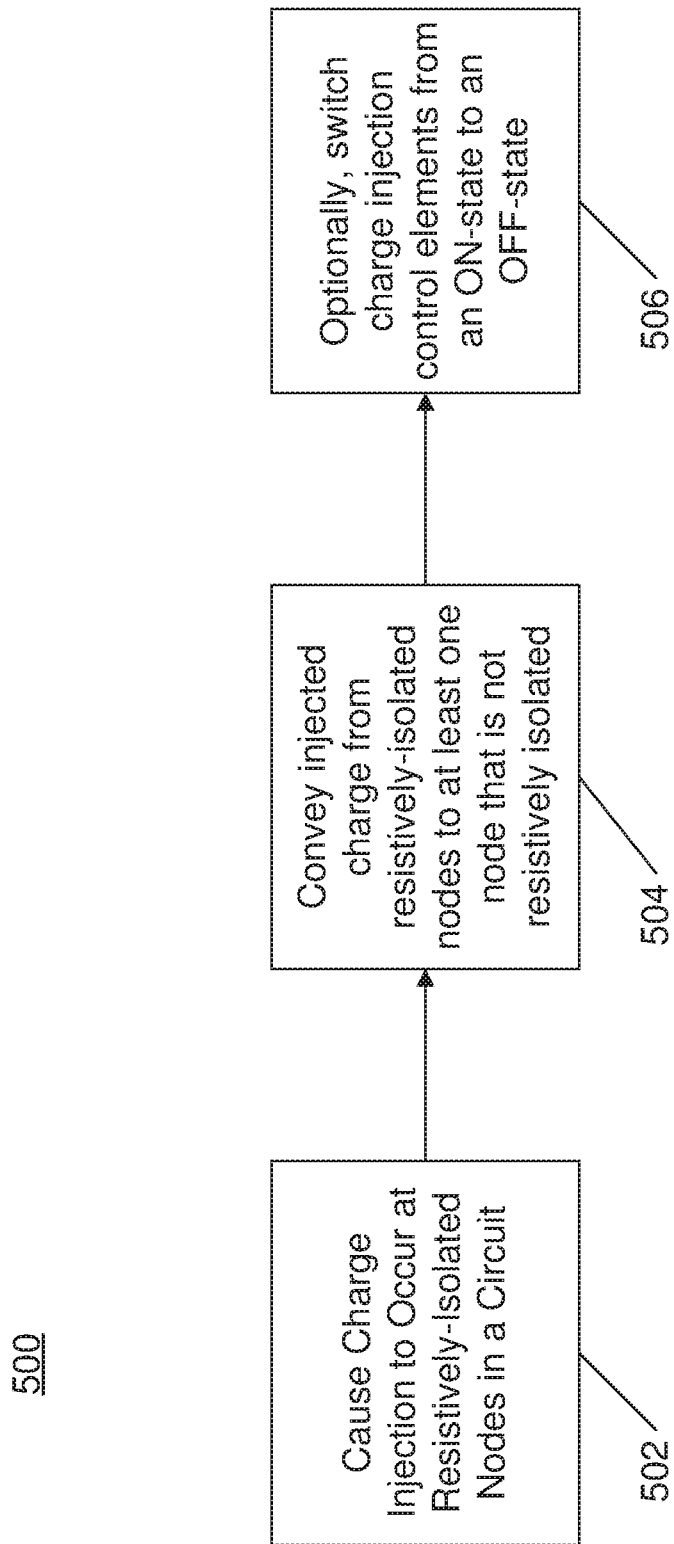
FIG. 5 is a flow chart diagram illustrating a charge injection control method.

In FIG. 5 a charge injection control method 500 is represented by a flow chart diagram. The method begins at a STEP 502, wherein charge injection is caused to occur at resistively isolated nodes of a circuit. In one embodiment, charge injection is generated in an SOI RF switch including stacked switching transistors when the RF switch is switched from an ON-state to an OFF-state. In this embodiment, the charge injection occurs at resistively-isolated nodes located between the switching transistors.

At a STEP 504, the injected charge is conveyed via charge injection control elements from the resistively-isolated nodes to at least one node that is not resistively-isolated. In one embodiment, the charge injection control elements may comprise charge injection control resistors. For this embodiment, the method stops at the STEP 504.

At an optional STEP 506, the charge injection control elements are switched from an ON-state to an OFF-state following a selected time delay interval after the switching transistors are switched from the ON-state to the OFF-state. For example, the STEP 506 is implemented in an embodiment wherein the charge injection control elements comprise charge injection control transistors.

Pulse Method for Controlling Accumulated Charge

As disclosed in U.S. application Ser. No. 11/484,370, filed Jul. 10, 2006, pending, and in U.S. application Ser. No. 11/520,912, filed Sep. 14, 2006, filed Sep. 15, 2005, both incorporated by reference hereinabove, accumulated charge can occur in MOSFET devices that are used in SOI RF switches. A MOSFET device is defined as operating within an "accumulated charge regime" when the MOSFET is biased to operate in an off-state, and when carriers having opposite polarity to the channel carriers are present in the channel region. Accumulated charge in the channel region can degrade the performance of MOSFETs used in SOI RF switches. In particular, the accumulated charge can cause harmonic generation in RF signals and degrade the gate oxide reliability of a MOSFET device.

Accumulated charge in an n-channel MOSFET results from a slow electron-hole pair generation process that occurs when a gate voltage Vg is negative with respect to a source bias voltage Vs and a drain bias voltage Vd. If a positive voltage pulse above a threshold voltage Vth is applied to the gate terminal of the MOSFET, a conducting channel comprising electrons is formed in the body of the MOSFET, and the accumulated charge is dissipated due to drift and recombination. When the gate voltage Vg returns to the negative bias level present prior to the application of the positive voltage pulse, the accumulated charge regenerates in a time period having a time scale that is typically in the millisecond range or longer. Consequently, the accumulated charge in the MOSFET may be controlled by applying a series of positive voltage pulses to the gate terminal. In one example, the pulse rate may be selected by observing harmonic generation in an applied RF signal, and selecting a pulse rate sufficiently high to prevent the harmonic generation from exceeding a desired level.

As a practical effect of applying the pulse method of controlling accumulated charge in an SOI RF switch, charge injection will occur each time the switching transistors are switched from an ON-state to an OFF-state. Consequently, the teachings of the present disclosure for controlling charge injection are also useful when used in conjunction with SOI RF switch systems employing the pulse method for controlling accumulated charge.

Embodiments Using Accumulated Charge Control (ACC) Switching Transistors

Embodiments according to the present teachings may, in some embodiments, use switching transistors (e.g., the switching transistors 111, 113, 115 and 117 of FIGS. 1A, 2, 3 and 4) having an accumulated charge sink (ACS) 610, as shown in FIGS. 6A-6D, and as described in greater detail in U.S. application Ser. No. 11/484,370, filed Jul. 10, 2006, pending, incorporated by reference hereinabove. For example, the switching transistors 111, 113, 115, and 117 (see FIGS. 3-4 and associated description above) may, in some embodiments, comprise accumulated charge control (ACC) transistors described in the above-incorporated application Ser. No. 11/484,370, filed Jul. 10, 2006, and shown in FIGS. 6A-6D. In another embodiment, the switching transistors 111, 113, 115, and 117 may comprise ACC transistors operated according to the pulse method for controlling accumulated charge, as described above and as described in greater detail in the above-incorporated application Ser. No. 11/520,912, filed Sep. 14, 2006.

As shown in FIGS. 6A-6D, in an improved ACC SOI NMOSFET 600, a gate terminal 602 is electrically coupled to a gate 601, a source terminal 604 is electrically coupled to a source 603, and a drain terminal 606 is electrically coupled to a drain 605. Finally, the ACC MOSFET 600 includes an ACS terminal 608 that is electrically coupled to the ACS 610.

Figure 6A:
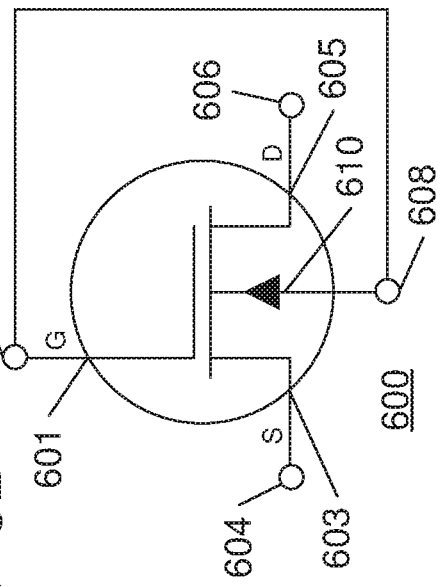
FIG. 6A is a simplified schematic of an improved SOI NMOSFET adapted to control accumulated charge embodied as a four terminal device.
Figure 6B:
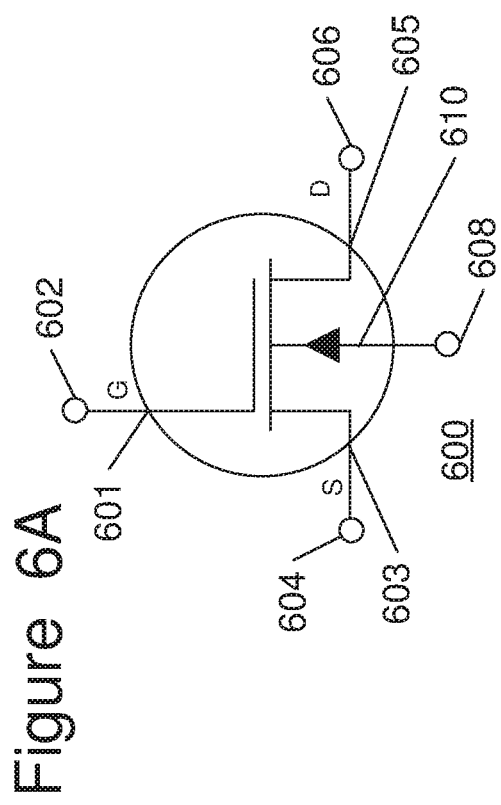
FIG. 6B is a simplified schematic of an improved SOI NMOSFET adapted to control accumulated charge, embodied as a four terminal device, wherein an accumulated charge sink (ACS) terminal is coupled to a gate terminal.

The ACC SOI NMOSFET 600 may be operated using various techniques and implemented in various circuits in order to control accumulated charge present in the FET when it is operating in an accumulated charge regime. For example, in one exemplary embodiment as shown in FIG. 6B, the gate and ACS terminals, 602 and 608, respectively, are electrically coupled together. In one embodiment of the simplified circuit shown in FIG. 6B, the source and drain bias voltages applied to the terminals 604 and 606, respectively, may be zero. If the gate bias voltage (Vg) applied to the gate terminal 602 is sufficiently negative with respect to the source and drain bias voltages (Vs and Vd, respectively) applied to the terminals 604 and 606, and with respect to the threshold voltage Vth, (for example, if Vth is approximately zero, and if Vg is more negative than approximately −1 V) the ACC NMOSFET 600 operates in the accumulated charge regime. When the MOSFET operates in this regime, accumulated charge (holes) may accumulate in the NMOSFET 600.

Advantageously, the accumulated charge can be removed via the ACS terminal 608 by connecting the ACS terminal 608 to the gate terminal 602 as shown in FIG. 6B. This configuration ensures that when the FET 600 is operated in the OFF-state, it is held in the correct bias region to effectively remove or otherwise control the accumulated charge. As shown in FIG. 6B, connecting the ACS terminal 608 to the gate ensures that the same bias voltages are applied to both the gate (Vg) and the ACS 610 ($V_{ACS}$). The accumulated charge is thereby removed from the SOI NMOSFET 600 via the ACS terminal 608.

In other exemplary embodiments, as described with reference to FIG. 6C, for example, Vs and Vd may comprise nonzero bias voltages. According to these examples, Vg must be sufficiently negative to both Vs and Vd in order for Vg to be sufficiently negative to $V_{th}$ to turn the NMOSFET 600 OFF (i.e., operate the NMOSFET 600 in the OFF-state). When so biased, as described above, the NMOSFET 600 may enter the accumulated charge regime. For this example, the voltage $V_{ACS}$ may also be selected to be equal to Vg by connecting the ACS terminal 608 to the gate terminal 602, thereby conveying the accumulated charge from the ACC NMOSFET, as described above.

Figure 6D:
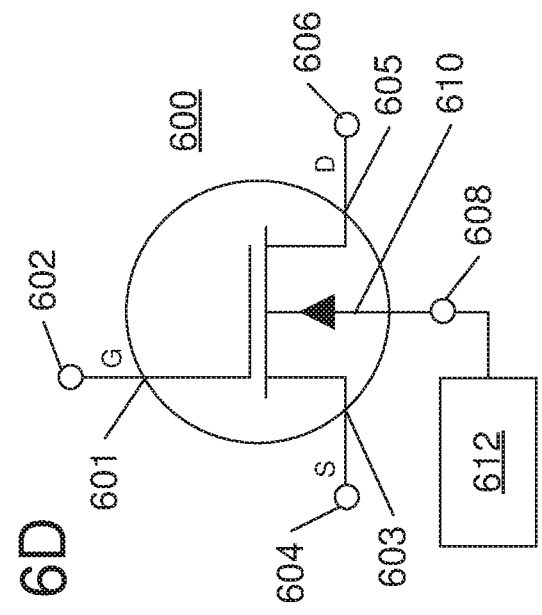
FIG. 6D is a simplified schematic of an improved SOI NMOSFET adapted to control accumulated charge, embodied as a four terminal device, wherein an accumulated charge sink (ACS) terminal is coupled to a control circuit.
Figure 6C:
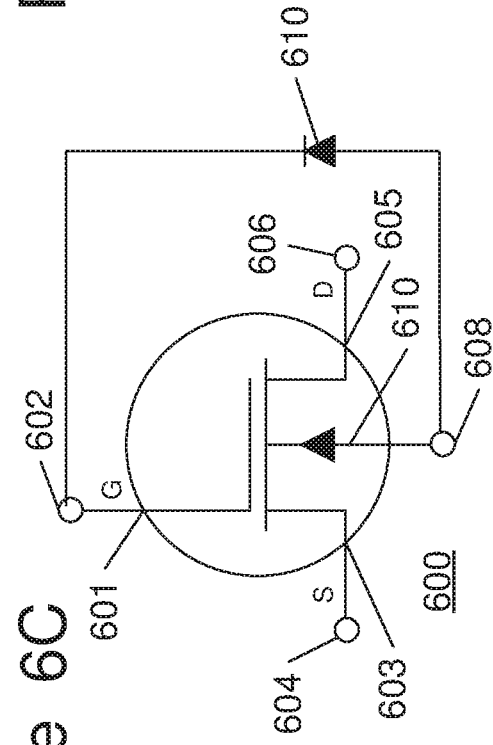
FIG. 6C is a simplified schematic of an improved SOI NMOSFET adapted to control accumulated charge, embodied as a four terminal device, wherein an accumulated charge sink (ACS) terminal is coupled to a gate terminal via a diode.

Another exemplary simplified circuit using the improved ACC SOI NMOSFET 600 is shown in FIG. 6C. As shown in FIG. 6C, in this embodiment, the ACS terminal 608 may be electrically coupled to a diode 610, and the diode 610 may, in turn, be coupled to the gate terminal 602. This embodiment may be used to prevent a positive current flow into the ACS 610 caused by a positive Vg-to-Vs (or, equivalently, Vgs, where Vgs=Vg−Vs) bias voltage, as may occur, for example, when the SOI NMOSFET 300 is biased into an ON-state condition.

As with the device shown in FIG. 6B, when biased OFF, the ACS terminal 608 voltage $V_{ACS}$ comprises the gate voltage plus a voltage drop across the diode 610. At very low ACS terminal 610 current levels, the voltage drop across the diode 610 typically also is very low (e.g., <<500 mV, for example, for a typical threshold diode).

When the SOI NMOSFET 600 is biased in an ON-state condition, the diode 610 is reverse-biased, thereby preventing the flow of positive current into the source and drain regions. The reverse-biased configuration reduces power consumption and improves linearity of the device. The circuit shown in FIG. 6C therefore works well to remove the accumulated charge when the FET is in the OFF-state and is operated in the accumulated charge regime. It also permits almost any positive voltage to be applied to the gate voltage Vg. This, in turn, allows the ACC MOSFET to effectively remove accumulated charge when the device operates in the OFF-state, yet assume the characteristics of a floating body device when the device operates in the ON-state.

With the exception of the diode 610 used to prevent the flow of positive current into the ACS terminal 608, exemplary operation of the simplified circuit shown in FIG. 6C is the same as the operation of the circuit described above with reference to FIG. 6B.

In yet another embodiment, the ACS terminal 608 may be coupled to a control circuit 612 as illustrated in the simplified circuit of FIG. 6D. The control circuit 612 may provide a selectable ACS bias voltage $V_{ACS}$ that selectively controls the accumulated charge.

Method of Fabrication

With varying performance results, RF switches have heretofore been implemented in different component technologies, including bulk complementary-metal-oxide-semiconductor (CMOS) and gallium-arsenide (GaAs) technologies. In fact, most high-performance high-frequency switches use GaAs technology.

Although GaAs RF switch implementations offer improved performance characteristics relative to bulk CMOS, the technology has several disadvantages. For example, GaAs technology exhibits relatively low yields of properly functioning integrated circuits. GaAs RF switches tend to be relatively expensive to design and manufacture. In addition, although GaAs switches exhibit improved insertion loss characteristics as described above, they may have low frequency limitations due to slow states present in the GaAs substrate. The technology also does not lend itself to high levels of integration, which requires that digital control circuitry associated with the RF switch be implemented "off chip" from the switch. The low power control circuitry associated with the switch has proven difficult to integrate. This is disadvantageous as it both increases the overall system cost or manufacture, size and complexity, as well as reducing system throughput speeds.

In one embodiment of the present disclosure, the exemplary circuits described hereinabove are implemented using a fully insulating substrate silicon-on-insulator (SOI) technology. More specifically, the MOSFET transistors of the present disclosure are implemented using "Ultra-Thin-Silicon (UTSi)" (also referred to herein as "ultrathin silicon-on-sapphire") technology. In accordance with UTSi manufacturing methods, the transistors used to implement the inventive RF switch are formed in an extremely thin layer of silicon in an insulating sapphire wafer. The fully insulating sapphire substrate enhances the performance characteristics of the inventive RF switch by reducing the deleterious substrate coupling effects associated with non-insulating and partially insulating substrates. For example, improvements in insertion loss are realized by lowering the transistor ON-state resistances and by reducing parasitic substrate conductances and capacitances. In addition, switch isolation is improved using the fully insulating substrates provided by UTSi technology. Owing to the fully insulating nature of silicon-on-sapphire technology, the parasitic capacitance between the nodes of the RF switches are greatly reduced as compared with bulk CMOS and other traditional integrated circuit manufacturing technologies.

Silicon on Insulator RF Integrated Circuits

As is well known, SOI has been used in the implementation of high performance microelectronic devices, primarily in applications requiring radiation hardness and high speed operation. SOI technologies include, for example, SIMOX, bonded wafers having a thin silicon layer bonded to an insulating layer, and silicon-on-sapphire. In order to achieve the desired RF switch performance characteristics described hereinabove, in one embodiment, the inventive RF switch is fabricated on a sapphire substrate.

Fabrication of devices on an insulating substrate requires that an effective method for forming silicon CMOS devices on the insulating substrate be used. The advantages of using a composite substrate comprising a monocrystalline semiconductor layer, such as silicon, epitaxially deposited on a supporting insulating substrate, such as sapphire, are well-recognized, and can be realized by employing as the substrate an insulating material, such as sapphire ($Al_2O_3$), spinel, or other known highly insulating materials, and providing that the conduction path of any inter-device leakage current must pass through the substrate.

An "ideal" SOI wafer can be defined to include a completely monocrystalline, defect-free silicon layer of sufficient thickness to accommodate the fabrication of active devices therein. The silicon layer would be adjacent to an insulating substrate and would have a minimum of crystal lattice discontinuities at the silicon-insulator interface. Early attempts to fabricate this "ideal" silicon-on-insulator wafer were frustrated by a number of significant problems, which can be summarized as (1) substantial incursion of contaminants into the epitaxially deposited silicon layer, especially the p-dopant aluminum, as a consequence of the high temperatures used in the initial epitaxial silicon deposition and the subsequent annealing of the silicon layer to reduce defects therein; and (2) poor crystalline quality of the epitaxial silicon layers when the problematic high temperatures were avoided or worked around through various implanting, annealing, and/or re-growth schemes.

It has been found that the high quality silicon films suitable for demanding device applications can be fabricated on sapphire substrates by a method that involves epitaxial deposition of a silicon layer on a sapphire substrate, low temperature ion implant to form a buried amorphous region in the silicon layer, and annealing the composite at temperatures below about 950 degrees C.

Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultra-thin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Using the methods described in the patents referenced above, electronic devices can be formed in an extremely thin layer of silicon on an insulating synthetic sapphire wafer. The thickness of the silicon layer is typically less than 150 nm. Such an "ultrathin" silicon layer maximizes the advantages of the insulating sapphire substrate and allows the integration of multiple functions on a single integrated circuit. Traditional transistor isolation wells required for thick silicon are unnecessary, simplifying transistor processing and increasing circuit density. To distinguish these above-referenced methods and devices from earlier thick-silicon embodiments, they are herein referred to collectively as "ultrathin silicon-on-sapphire."

In some embodiments of the present disclosure, the MOS transistors may be formed in ultrathin silicon-on-sapphire wafers by the methods disclosed in U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555. However, other known methods of fabricating silicon-on-sapphire integrated circuits can be used without departing from the spirit or scope of the present teachings.

A number of embodiments of the present inventive concept have been described. Nevertheless, it will be understood that various modifications may be made without departing from the scope of the inventive teachings. For example, it should be understood that many types of switch circuits (e.g., single-pole single-throw, single-pole double-throw, double-throw-pole double-throw, etc.) may be used according to the present teachings. In another example, it should be noted that although embodiments having SOI RF switches have been used herein for exemplary purposes, persons skilled in the electronic arts will understand that the present teachings may be applied to many other types of switching circuits having isolated nodes wherein charge injection may occur.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A switch circuit comprising:
 a plurality of series-coupled transistors configured to selectively couple a signal from an input of the plurality of series-coupled transistors to an output of the plurality of series-coupled transistors based on a switch control signal applied to each transistor of the plurality of series-coupled transistors, wherein each transistor of the plurality of series-coupled transistors comprises a gate and an accumulated charge sink (ACS), and wherein the ACS is configured to control accumulated charge in the transistor; and
 a plurality of charge injection control elements, wherein each of the plurality of charge injection control elements has at least one end coupled to a node between two transistors of the plurality of series-coupled transistors to control injected charge at the node.

2. The switch circuit of claim 1, wherein, for each of the plurality of charge injection control elements, the at least one end is coupled to the node to control the injected charge at the node by receiving the injected charge from the node and conveying the injected charge to the input and/or the output of the plurality of series-coupled transistors.

3. The switch circuit of claim 1, wherein each of the plurality of charge injection control elements is connected between a source node and a drain node of a respective one of the plurality of series-coupled transistors.

4. The switch circuit of claim 1, further comprising a plurality of resistors, wherein each of the plurality of resistors is coupled to a respective one of the plurality of series-coupled transistors and has a resistance Rg at least ten times larger than an impedance of a gate-to-drain capacitance associated with the respective one of the plurality of series-coupled transistors.

5. The switch circuit of claim 1, further comprising a plurality of diodes, wherein each diode of the plurality of diodes is configured to selectively convey accumulated charge from the ACS of a respective one of the plurality of series-coupled transistors to the gate of the respective one of the plurality of series-coupled transistors.

6. The switch circuit of claim 1, wherein at least one of the plurality of charge injection control elements comprises a charge injection control resistor.

7. The switch circuit of claim 6, further comprising a resistor having a resistance Rg and coupled to one of the plurality of series-coupled transistors, and wherein the charge injection control resistor has a resistance Rc smaller than the resistance Rg.

8. The switch circuit of claim 6, further comprising a plurality of resistors, wherein each of the plurality of resistors has a resistance Rg and is coupled to a respective one of the plurality of series-coupled transistors, wherein the plurality of transistors comprises a plurality of N transistors, and wherein the charge injection control resistor has a resistance Rc in the range between 10Rg/N and Rg/10N.

9. A switch circuit comprising:
a plurality of series-coupled transistors configured to selectively couple a signal from an input of the plurality of series-coupled transistors to an output of the plurality of series-coupled transistors based on a switch control signal applied to each transistor of the plurality of series-coupled transistors; and
a plurality of charge injection control elements, wherein each of the plurality of charge injection control elements has at least one end coupled to a node between two transistors of the plurality of series-coupled transistors to control injected charge at the node, wherein at least one of the plurality of charge injection control elements comprises a charge injection control transistor.

10. The switch circuit of claim 9, wherein the charge injection control transistor is connected to a first node of a respective one of the plurality of series-coupled transistors and a second node of the respective one of the plurality of series-coupled transistors, and wherein the charge injection control transistor is configured to switch from an ON state to an OFF state after switching of the respective one of the plurality of series-coupled transistors from the ON state to the OFF state.

11. The switch circuit of claim 9, wherein the charge injection control transistor is connected to a first node of a respective one of the plurality of series-coupled transistors and a second node of the respective one of the plurality of series-coupled transistors, and wherein the charge injection control transistor has a width smaller than a width of the respective one of the plurality of series-coupled transistors.

12. The switch circuit of claim 9, further comprising a plurality of resistors, wherein each of the plurality of resistors is coupled to a respective one of the plurality of series-coupled transistors and has a resistance Rg at least ten times larger than an impedance of a gate-to-drain capacitance associated with the respective one of the plurality of series-coupled transistors.

13. A method comprising:
selectively coupling a signal from an input of a plurality of series-coupled transistors to an output of the plurality of series-coupled transistors based on a switch control signal applied to each transistor of the plurality of series-coupled transistors, wherein at least one transistor of the plurality of series-coupled transistors comprises a gate and an accumulated charge sink (ACS);
controlling, by a plurality of charge injection control elements, injected charge at nodes of the plurality of series-coupled transistors, wherein each of the nodes is between two transistors of the plurality of series-coupled transistors; and
controlling, by the ACS, accumulated charge in the at least one transistor.

14. The method of claim 13, wherein the controlling comprises receiving, by the plurality of charge injection control elements, the injected charge from the nodes and conveying the injected charge to the input and/or the output of the plurality of series-coupled transistors.

15. The method of claim 13, wherein each of the plurality of charge injection control elements is connected between two nodes of a respective one of the plurality of series-coupled transistors.

16. The method of claim 13, wherein each of a plurality of resistors is coupled to a respective one of the plurality of series-coupled transistors and has a resistance Rg at least ten times larger than an impedance of a gate-to-drain capacitance associated with the respective one of the plurality of series-coupled transistors.

17. The method of claim 13, wherein at least one of the plurality of charge injection control elements comprises a charge injection control resistor.

18. The method of claim 13, wherein at least one of the plurality of charge injection control elements comprises a charge injection control transistor.

19. The method of claim 18, wherein the charge injection control transistor is connected to a first node of a respective one of the plurality of series-coupled transistors and a second node of the respective one of the plurality of series-coupled transistors, and wherein the controlling the injected charge comprises switching the charge injection control transistor from an ON state to an OFF state after switching the respective one of the plurality of series-coupled transistors from the ON state to the OFF state.

20. The method of claim 13, wherein the controlling the accumulated charge comprises conveying the accumulated charge from the ACS of the at least one transistor to a gate of the at least one transistor.

* * * * *

UNITED STATES PATENT AND TRADEMARK OFFICE
CERTIFICATE OF CORRECTION

PATENT NO. : 11,695,407 B2
APPLICATION NO. : 17/543720
DATED : July 4, 2023
INVENTOR(S) : Alexander Dribinsky et al.

It is certified that error appears in the above-identified patent and that said Letters Patent is hereby corrected as shown below:

In the Specification

Column 1, Lines 10-11, change "application Ser. No. 14/987,360," to --application No. 14/987,360,--.

Column 1, Line 14, change "application Ser. No. 14/257,808," to --application No. 14/257,808,--.

Column 1, Lines 17-18, change "application Ser. No. 14/257,808" to --application No. 14/257,808--.

Column 1, Line 19, change "application Ser. No. 11/881,816," to --application No. 11/881,816,--.

Column 1, Line 23, change "application Ser. No. 11/520,912," to --application No. 11/520,912,--.

Column 1, Lines 29-30, change "application Ser. No. 11/520,912," to --application No. 11/520,912,--.

Column 1, Line 31, change "application Ser. No. 11/484,370," to --application No. 11/484,370,--.

Column 1, Lines 37-38, change "application Ser. No. 11/881,816 is" to --application No. 11/881,816 is--.

Column 1, Lines 38-39, change "application Ser. No. 11/484,370," to --application No. 11/484,370,--.

Column 1, Lines 40-41, change "CIP application Ser. No. 11/881,816" to --CIP application No. 11/881,816--.

In the DETAILED DESCRIPTION:

Column 4, Line 16, change "application Ser. Nos. 10/922,135 and 10/267,531." to --application Nos. 10/922,135 and 10/267,531,--.

Column 4, Lines 22-23, change "application Ser. No. 10/922,135," to --application No. 10/922,135,--.

Signed and Sealed this
Eighth Day of August, 2023

Katherine Kelly Vidal
*Director of the United States Patent and Trademark Office*

Column 4, Line 25, change "application of application Ser. No. 10/267,531," to --application of application No. 10/267,531,--.

Column 4, Lines 28-29, change "application Ser. No. 10/267,531" to --application No. 10/267,531--.

Column 5, Line 1, change "application Ser. Nos. 10/922,135 and" to --application Nos. 10/322,135 and--.

Column 7, Line 53, change "application Ser. No. 11/484,370," to --application No. 11/484,370,--.

Column 7, Line 58, change "application Ser. No. 11/484,370" to --application No. 11/484,370--.

Column 9, Line 39, change "application Ser. No. 11/484,370," to --application No. 11/484,370,--.

Column 9, Line 40-41, change "application Ser. No. 11/520,912," to --application No. 11/520,912,--.

Column 10, Line 22, change "application Ser. No. 11/484,370," to --application No. 11/484,370,--.

Column 10, Lines 27-28, change "application Ser. No. 11/484,370," to --application No. 11/484,370,--.

Column 10, Lines 33-34, change "application Ser. No. 11/520,912," to --application No. 11/520,912,--.